United States Patent [19]
Itoi

[11] Patent Number: 6,098,193
[45] Date of Patent: Aug. 1, 2000

[54] DATA-REPRODUCING DEVICE THAT DETECTS EQUALIZATION IN THE PRESENCE OF PRE-EQUALIZATION DATA VARIATION

[75] Inventor: Satoshi Itoi, Tokyo, Japan

[73] Assignee: NEC Corporoation, Tokyo, Japan

[21] Appl. No.: 09/035,361

[22] Filed: Mar. 5, 1998

[30] Foreign Application Priority Data

Mar. 5, 1997 [JP] Japan ................................... 9-067316

[51] Int. Cl.[7] ....................................................... G11B 7/00
[52] U.S. Cl. ........................ 714/795; 714/792; 714/794; 714/796
[58] Field of Search ................................. 714/795, 792, 714/796, 794

[56] References Cited

U.S. PATENT DOCUMENTS

| | | | |
|---|---|---|---|
| 5,508,993 | 4/1996 | Hayashi et al. | 369/124 |
| 5,809,079 | 9/1998 | Hayashi | 375/262 |
| 5,958,002 | 9/1999 | Zhou et al. | 708/801 |

FOREIGN PATENT DOCUMENTS

| | | |
|---|---|---|
| 1-295533 | 11/1989 | Japan . |
| 4-57521 | 2/1992 | Japan . |
| 4-298865 | 10/1992 | Japan . |
| 4-373313 | 12/1992 | Japan . |
| 5-136700 | 6/1993 | Japan . |
| 6-20208 | 1/1994 | Japan . |
| 6-282945 | 10/1994 | Japan . |
| 7-37340 | 2/1995 | Japan . |
| 7-147546 | 6/1995 | Japan . |
| 8-8763 | 1/1996 | Japan . |

*Primary Examiner*—Albert De Cady
*Assistant Examiner*—Esaw Abraham
*Attorney, Agent, or Firm*—Whitham, Curtis & Whitham

[57] ABSTRACT

A data-reproducing device is provided that, even when pre-equalization characteristics are varied, conducts an equalization detection operation. The device comprises a subtraction absolute value circuit for calculating a subtraction absolute value, a comparison and selection circuit that outputs a selection signal to show which path is selected, a circuit that stores an estimate of the pre-equalized data, an address generating circuit that provides estimate data needed by the subtraction absolute value circuit as determined by the selection signal, a path memory circuit for storing the selection signal output and outputting the most probable data, and a correction control circuit for renewing the estimate data of the estimate data storing circuit.

52 Claims, 34 Drawing Sheets

*:CALCULATION OF SUBSTRACTION
ABSOLUTE VALUE (DET=DETECTION)

(DET=DETECTION)

DATA-REPRODUCING DEVICE THAT DETECTS EQUALIZATION IN THE PRESENCE OF PRE-EQUALIZATION DATA VARIATION

FIELD OF THE INVENTION

This invention relates to a data-reproducing device, and more particularly to, a data-reproducing device used in a digital recording device where digital data such as a text, an image and voice are recorded in a recording medium, such as an opto-magnetic disk, phase-variable disk and magnetic disk or a magnetic tape medium.

BACKGROUND OF THE INVENTION

Conventionally, in a digital recording disk device, digital recording VTR etc., data are recorded after converting into a recording code, without recording the data as they are. Therein, 1,7 code and 2,7 code are typical recording codes.

In 1,7 code, after a 2-bit data bit is converted into a 3-bit channel bit or after a 4-bit data bit is converted into a 6-bit channel bit, it is recorded by using NRZI rule. The NRZI rule is a recording rule that inversion is conducted by "1" and non-inversion is conducted by "0". A big characteristic of 1,7 code is that there exists 1 or more and 7 or less of "0" between "1" and "1" after converting, i.e., the minimum inversion interval is 2.

In 2,7 code, after a 2-bit data bit is converted into a 4-bit channel bit or after a 3-bit data bit is converted into a 6-bit channel bit, it is recorded by using the NRZI rule. A big characteristic of 2,7 code is that there exists 2 or more and 7 or less of "0" between "1" and "1" after converting, i.e., the minimum inversion interval is 3.

A method has been suggested where, to record and reproduce signals, the data detection is conducted by combining partial response equalization and Viterbi decoding. For example, this method is disclosed in Japanese patent application laid-open No.4-298865(1992) (application No.3-64201(1991)) titled "Method of Detecting Reproduce Data".

In the reproduce data detection method described in No.4-298865, a code with a minimum inversion interval of 2, such as 1,7 code is recorded. In reproducing, a bit error correction process is conducted by converting a reproduce signal into a ternary data by PR(1,1) equalization and then decoding it by four-state Viterbi decoding to reduce an error rate.

However, in the conventional reproduce data detection method that uses the combination of a partial response equalization system and Viterbi decoding, there is a problem that it cannot conduct a reproduction-adaptive operation, whereas it can perform a bit error correction to reduce the error rate. Namely, PR(1,1) equalization always conducts fixed equalization even when a change in reproduce signal due to a variation in record current when recording, a variation in medium characteristics caused by a record position, a variation in record and reproduce characteristics caused by temperature or the like occurs. Therefore, the equalization characteristic cannot follow the change in reproduce signal.

On the other hand, Japanese patent application laid-open No.6-20208(1994) discloses a non-linear distortion equalization adaptive equalizer where an inter-symbol interference distortion and a non-linear distortion included in read-out output from a high-density magnetic recording device for digital signal can be removed by the smaller amount of operation. The equalizer comprises: an estimate value signal memory to store several estimate signals read out from the combination of equalization address signal and Viterbi transition symbol system signal; a Viterbi decoder which conducts the equalization according to Viterbi algorithm while using, as branchmetric, several error signals to show errors between several estimate signals output from the estimate value signal memory and input data symbols, and outputs a estimate symbol to input data symbol, equalization address signal and correction address signal; and a corrector to renew the estimate value signal to be shown with the correction address signal by the input data symbol.

This non-linear distortion equalization adaptive equalizer can remove an inter-symbol interference distortion and a non-linear distortion included in read-out output from a high-density magnetic recording device for digital signal by the smaller amount of operation, as compared with the conventional Viterbi decoding, and can follow a time-dependent change in non-linear distortion.

However, Japanese patent application laid-open No. 6-20208 does not suggest any application of the non-linear distortion equalization adaptive equalizer to the partial response equalization system.

Further, in the method and equalizer disclosed in Japanese patent application laid-open Nos.4-298865 and 6-20208, input data are serially processed every one clock. Especially, when image signals are recorded, the clock frequency may be more than 100 MHz. Thus, the operation must be very difficult to such a frequency even when the circuit is a LSI.

SUMMARY OF THE INVENTION

Accordingly, it is an object of the invention to provide a data-reproducing device that, even when the pre-equalization characteristics is varied, can conduct the equalization detection operation while following the variation, as well as reducing further the error rate by conducting bit error correction.

It is a further object of the invention to provide a data-reproducing device where even input data with a very high clock frequency can be reproduced at a low operation speed.

According to the invention, a data-reproducing device, comprises:

a subtraction absolute value circuit for calculating a subtraction absolute value from a pre-equalized reproduce data and an estimate data as a branchmetric, in the lump, to the continuous K clocks of the reproduce data;

a comparison and selection circuit for calculating a new pathmetric from a previously calculated pathmetric of K clocks before and K clocks of the branchmetric calculated by the subtraction absolute value circuit, to each of states, and outputting a selection signal to show which of paths is selected;

an estimate data storing circuit for storing an estimate data of pre-equalized reproduce data;

an address generating circuit for reading out in the lump estimate data needed for the calculation at the subtraction absolute value circuit from the estimate data storing circuit according to the selection signal output from the comparison and selection circuit;

a path memory circuit for storing the selection signal output from the comparison and selection circuit over several stages to tens of stages, obtaining the most probable path by unifying paths, then outputting the most probable data; and a correction control circuit for renewing the estimate data of the estimate data storing circuit, based on reproduce data concerned and estimate data of the estimate data storing circuit obtained by using continuous output data of the path memory circuit as addresses, in the lump, to K clocks of reproduce data obtained by delaying the pre-equalized reproduce data by a predetermined value.

As the initial value of estimate data to be stored in the estimate data storing circuit, for example, a value calculated from impulse response, a value obtained when recording and reproducing in ideal state etc. are used. Also, in general, the estimate value of a 1-clock data is determined by the data itself and the effect of adjacent some clocks. Therefore, even when 1-clock data itself are common, the estimate data are different when the adjacent clocks have different data. For example, the estimate data of "0" in the middle of continuous data "1110111" is different from the estimate data of "0" in the middle of continuous data "1010001". Thus, estimate data are provided for the respective patterns of continuous data, and are stored using the continuous data as addresses in the estimate data storing circuit. Meanwhile, in preferred embodiments to be described later, estimate data based on 7-clock continuous data composed of front 3 clocks and back 3 clocks are used. However, in the invention, estimate data based on continuous data other than the 7-clock continuous data can also be used.

In the data-reproducing device composed as defined above, the subtraction absolute values of pre-equalized reproduce data and estimate data thereof are used as branchmetrics, and estimate data are properly renewed according to the change of reproduce data. Therefore, even when reproduce data are changed due to some factors such as a variation in record current when recording, it can perform the data reproduction while following the change.

The renewing of estimate data is conducted by, for example, accumulating the subtraction values between pre-equalized reproduce data and estimate data, increasing the estimate data by a predetermined value (SD) when the accumulation value of the subtraction values exceeds a predetermined positive threshold (TH), and decreasing the estimate data by the predetermined value (SD) when the accumulation value of the subtraction values is less than a predetermined negative threshold (−TH).

In the subtraction absolute value circuit, a branchmetric is calculated, in the lump, to the continuous K clocks of reproduce data, and thereafter the comparison and selection circuit, path memory circuit and correction control circuit process in parallel the K clock data. Thereby, only the serial-to-parallel circuit in the subtraction absolute value circuit, which develops input data into K layers, is operated with input data clock and the other circuit can be operated with a clock 1/K of the input data clock. Therefore, even input data with a very high clock frequency can be reproduced at a low operation speed.

Also, to output the most probable data of pre-equalized reproduce data can be performed by that, to all states,, as to all paths of 2 to the Kth power linking from K clocks before, new temporary pathmetrics are calculated by adding a branchmetric during K clocks from to a pathmetric at K clocks before, and one of the temporary pathmetrics having the smallest value is selected as a new pathmetric, a survival state at K clocks before is judged from survival path information including data as to what number of the paths of 2 to the Kth power is selected, a L-bit previous clock data, where L≧0 is satisfied, and path unification are judged by tracking the survival state by twice of K clocks in the past, a binary final output is given corresponding to the survival state when path unification is achieved, and a binary final output is given by deciding a majority between the number of surviving states to a binary final output of "0" and the number of surviving states to a binary final output of "1", when path unification is not achieved. However, depending on the form of recording code or the clock number of branchmetric, there may exist an impossible pattern to all states. In view of this, the output data can be effectively obtained by removing some paths from the calculation.

For example, a recording code with a minimum inversion interval of 2 is used, the reproduce data is pre-equalized into ternary value(0, 1, 2) by PR(1,1) pre-equalization, and to all states, paths except impossible patterns, sequence of "1", "02" and "20", are calculated. Also, a recording code with a minimum inversion interval of 3 is used, the reproduce data is pre-equalized into ternary value(0, 1, 2) by PR(1,1) pre-equalization, and to all states, paths except impossible patterns, sequence of "1", "02", "20", "101" and "121", are calculated.

The combination of pre-equalization form, recording code form and clock number of branchmetric can be varied.

BRIEF DESCRIPTION OF THE DRAWINGS

The invention will be explained in more detail in conjunction with the appended drawings, wherein.

DESCRIPTION OF THE PREFERRED EMBODIMENTS

A data-reproducing device in the first preferred embodiment will be explained below.

Figure 6:
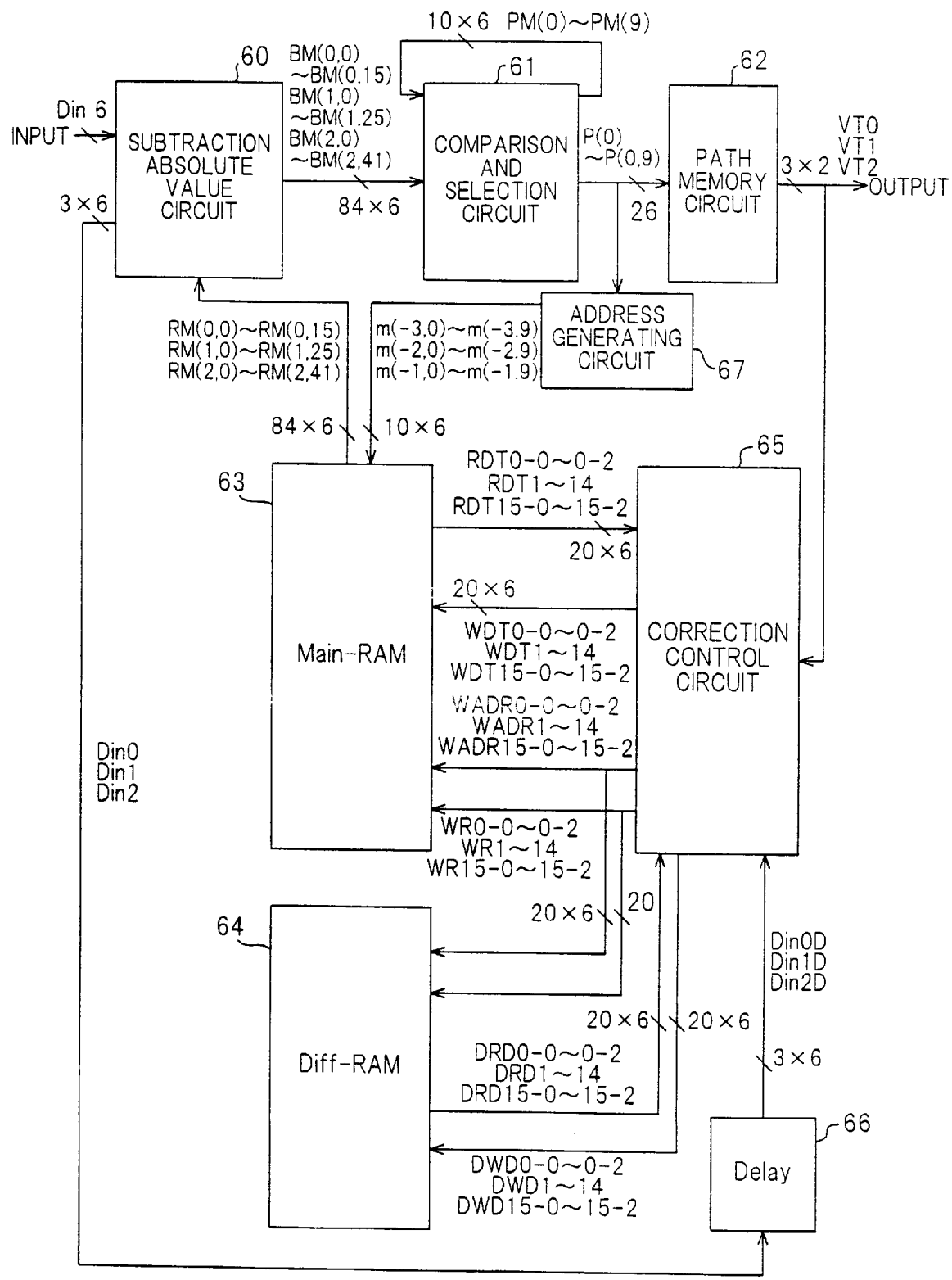
FIG. 6 is a block diagram showing a whole composition of a data-reproducing device in a first preferred embodiment according to the invention.

In the first embodiment, as shown in FIG. 6, the data-reproducing device comprises:

a subtraction absolute value circuit 60 for calculating a subtraction absolute value from a pre-equalized reproduce data and an estimate data as a branchmetric, in the lump, to the continuous K clocks of the reproduce data;

a comparison and selection circuit 61 for calculating a new pathmetric from a previously calculated pathmetric of K clocks before and K clocks of the branchmetric calculated by the subtraction absolute value circuit 60, to each of states, and outputting a selection signal to show which of paths is selected;

an estimate data storing circuit 63 for storing an estimate data of pre-equalized reproduce date;

an address generating circuit 67 for reading out in the lump estimate data needed for the calculation at the subtraction absolute value circuit 60 from the estimate data storing circuit 63 according to the selection signal output from the comparison and selection circuit 61;

a path memory circuit 62 for storing the selection signal output from the comparison and selection circuit 61 over several stages to tens of stages, obtaining the most probable path by unifying paths, then outputting the most probable data; and a correction control circuit 65 for renewing the estimate data of the estimate data storing circuit 63, based on reproduce data concerned and estimate data of the estimate data storing circuit 63 obtained by using continuous output data of the path memory circuit 62 as addresses, in the lump, to K clocks of reproduce data obtained by delaying the pre-equalized reproduce data by a predetermined value.

In operation, the subtraction absolute value circuit 60 calculates a subtraction absolute value from a pre-equalized reproduce data and an estimate data as a branchmetric, in the lump, to the continuous K clocks of the reproduce data, the comparison and selection circuit 61 calculates a new pathmetric from a previously calculated pathmetric of K clocks before and K clocks of the branchmetric calculated by the subtraction absolute value circuit 60, to each of states, and outputs a selection signal to show which of paths is selected, the estimate data storing circuit 63 stores an estimate data of pre-equalized reproduce data, the address generating circuit 67 reads out in the lump estimate data needed for the calculation at the subtraction absolute value circuit 60 from the estimate data storing circuit 63 according to the selection signal output from the comparison and selection circuit 61, the path memory circuit 62 stores the selection signal output from the comparison and selection circuit 61 over several stages to tens of stages, obtaining the most probable path by unifying paths, then outputting the most probable data, and the correction control circuit 65 renews the estimate data of the estimate data storing circuit 63, based on reproduce data concerned and estimate data of the estimate data storing circuit 63 obtained by using continuous output data of the path memory circuit 62 as addresses, in the lump, to K clocks of reproduce data obtained by delaying the pre-equalized reproduce data by a predetermined value.

Next, the data-reproducing device in the first embodiment will be explained in FIGS. 1 to 34. In the first embodiment, the recording code is provided with a minimum inversion interval of 2, reproduce data are pre-equalized into ternary data(0,1,2) by PR(1,1) equalization, and branchmetric is of 4-clock.

The explanation of the embodiment will be conducted in the order of (1) the principle of the embodiment, (2) the schematic composition of the data-reproducing device and (3) the details of the device.

(1) The Principle of the Embodiment

In the coding with a minimum inversion interval of 2, there are characteristics that 2 or more bits of "1" do not continue, "01" is always followed by "2", "21" is always followed by "0", and "1" always exists between "0" and "2" or between "2" and "0".

Therefore, 4-clock continuous data, which are paths reaching time n, consist of sixteen patterns of:

0000, 0001, 0012, 0121

0122, 1000, 1001, 1012, 1210, 1221, 1222, 2100, 2101, 2210, 2221, 2222, which are called 'Viterbi data'. Namely, in the first embodiment, the Viterbi data is of 4-clock and 1 clock is of 2 bit.

Herein, negative logarithms of probabilities that inputs correspond to the above respective continuous data are called 'branchmetric', and are represented by BM(0) to BM(15) in that order.

Also, 4-clock Viterbi data, which are paths reaching time n+1, consist of sixteen patterns of:

0000, 0001, 0012, 0121

0122, 1000, 1001, 1012, 1210, 1221, 1222, 2100, 2101, 2210, 2221, 2222,

Here, between the 4-clock Viterbi data to reach time n and the 4-clock Viterbi data to reach time n+1, 3-clock parts are common and are of ten patterns of:

000, 001, 012, 100, 101, 121, 122, 210, 221, 222.

Negative logarithms of probabilities to reach these ten states are called 'pathmetric' and are represented by PM(0) to PM(9) in that order. Also, '000' state is called state 0, '001" state is called state 1, and, in like manner, called states 2 to 9 in the order.

Figure 1:
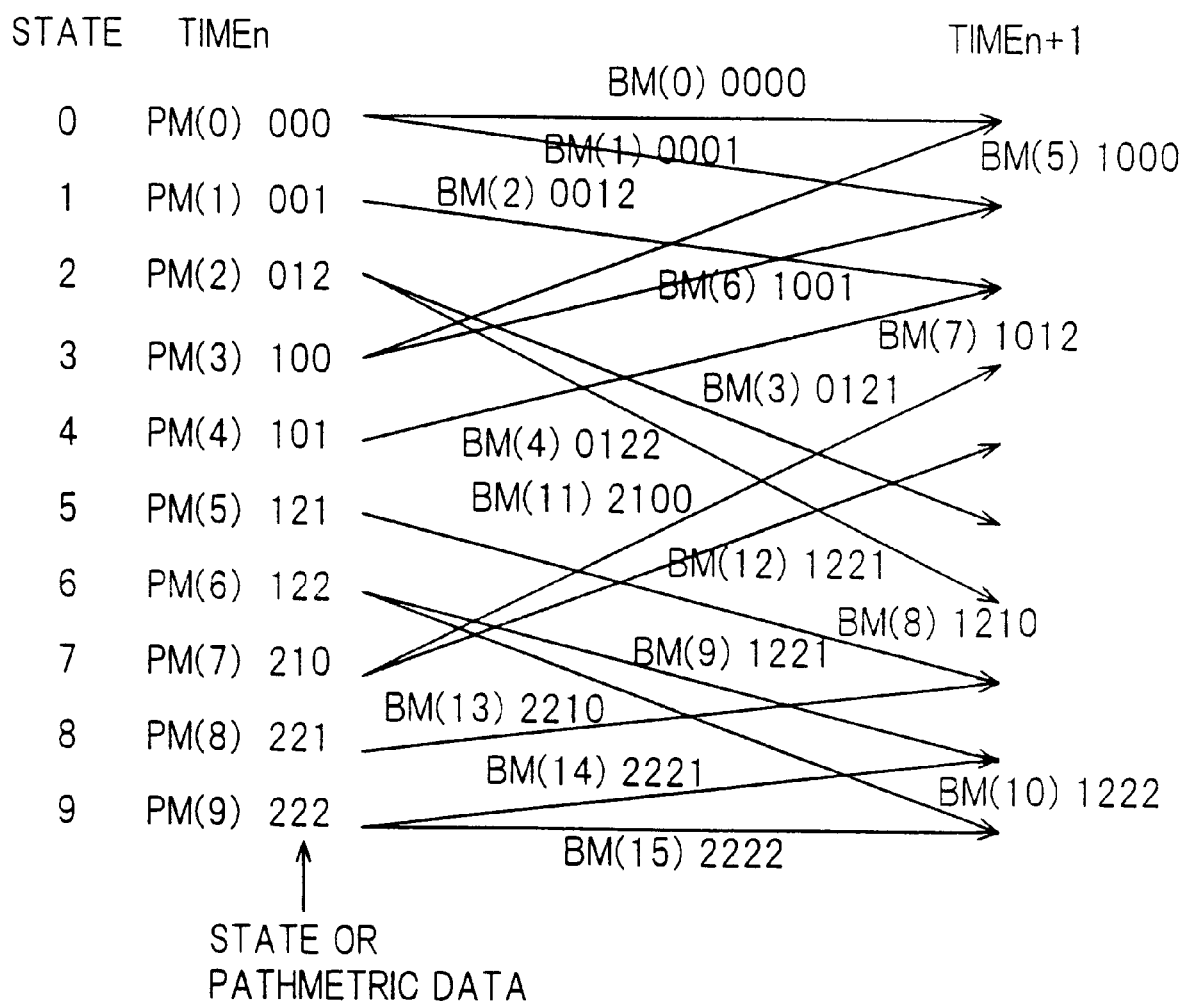
FIG. 1 is a diagram showing a state change as to states 0 to 9 where the recording code is provided with a minimum inversion interval of 2, reproduce data are pre-equalized into ternary data(0,1,2) by PR(1,1) equalization, and branchmetric is of 4-clock.

FIG. 1 shows state changes as to states 0 to 9 where reproduce data when recorded by a code with a minimum inversion interval of 2 are pre-equalized into a ternary data(0,1,2) by PR(1,1) equalization and 4-clock data is considered. Meanwhile, in FIG. 1, an arrow is called 'path' and a position targeted by an arrow is called 'state'.

As understood in FIG. 1, during one clock from time n to time n+1, the respective states are changed as follows:

State 0 is changed into state 0 or state 1,

State 1 is changed into state 2,

State 2 is changed into state 5 or state 6,

State 3 is changed into state 0 or state 1,

State 4 is changed into state 2,

State 5 is changed into state 7,

State 6 is changed into state 8 or state 9,

State 7 is changed into state 3 or state 4,

State 8 is changed into state 8 or state 9,

Also, FIG. 1 shows that the relations between branchmetrics BM(0) to BM(15) and pathmetrics PM(0) to (9) are formed as shown in Table 1.

TABLE 1

| |
|---|
| 0000 BM(0) →000 PM(0)→0000 BM(0), or 0001 BM(1) |
| 0001 BM(1) →001 PM(1)→0012 BM(2) |
| 0012 BM(2) →012 PM(2)→0121 BM(3), or 0122 BM(4) |
| 0121 BM(3) →121 PM(5)→1210 BM(8) |
| 0122 BM(4) →122 PM(6)→1221 BM(9), or 1222 BM(10) |
| 1000 BM(5) →000 PM(0)→0000 BM(0), or 0001 BM(1) |
| 1001 BM(6) →001 PM(1)→0012 BM(2) |
| 1012 BM(7) →012 PM(2)→0121 BM(3), or 0122 BM(4) |
| 1210 BM(8) →210 PM(7)→2100 BM(11), or 2101 BM(12) |
| 1221 BM(9) →221 PM(8)→2210 BM(13) |
| 1222 BM(10)→222 PM(9)→2221 BM(14), or 2222 BM(15) |
| 2100 BM(11)→100 PM(3)→1000 BM(5), or 1001 BM(6) |
| 2101 BM(12)→101 PM(4)→1012 BM(7) |
| 2210 BM(13)→210 PM(7)→2100 BM(11), or 2101 BM(12) |
| 2221 BM(14)→221 PM(8)→2210 BM(13) |
| 2222 BM(15)→222 PM(9)→2221 BM(14), or 2222 BM(15) |

In Table 1, the first row shows that branchmetric BM(0) is a metric of "0000", pathmetric PM(0) at time n is a metric of "000" that "0" at the left end corresponding to the oldest past of BM(0) is deleted, thereafter, at time n+1, it changes into "0000" for BM(0) or "0001" for BM(1) by adding "0" or "1" at the right end since "0" or "1" follows "000".

Also, the second row shows that branchmetric BM(1) is a metric of "0001", pathmetric PM(1) at time n is a metric of "0001" that "0" at the left end corresponding to the oldest past of BM(1) is deleted, thereafter, at time n+1, it changes into "0012" for BM(2) by adding "2" at the right end since only "2" follows "001".

Like meanings are also provided in the third to sixteenth rows.

As seen from the paths to reach states 0 to 9 at time n+1 in FIG. 1, states 0, 1, 2, 7, 8 and 9 are reached from two states. Namely, state 0 is reached from state 0 or 3, state 1 from state 0 to 3, state 2 from state 1 or 4, state 7 from state 5 or 8, state 8 from state 6 or 9, and state 9 from state 6 or 9, Thus, to conduct the unification of path, it needs to select either of two paths.

When the selection of path at each clock, i.e., the selection of pathmetric at each of states 0 to 9 is conducted, it is conducted by selecting smaller one of the addition values of pathmetric at one clock before and branchmetric(s) from this pathmetric at one clock before to the pathmetric concerned. Namely, it is conducted according to equation (1):

$$PM(0) = \min[PM(0) + BM(0), PM(3) + BM(5)] \quad (1)$$
$$PM(1) = \min[PM(0) + BM(1), PM(3) + BM(6)]$$
$$PM(2) = \min[PM(1) + BM(2), PM(4) + BM(7)]$$
$$PM(3) = PM(7) + BM(11)$$
$$PM(4) = PM(7) + BM(12)$$
$$PM(5) = PM(2) + BM(3)$$
$$PM(6) = PM(2) + BM(4)$$
$$PM(7) = \min[PM(5) + BM(8), PM(8) + PM(13)]$$
$$PM(8) = \min[PM(6) + BM(9), PM(9) + BM(14)]$$
$$PM(9) = \min[PM(6) + BM(10), PM(9) + BM(15)]$$

where a right-hand pathmetric has a value one clock older than a left-hand pathmetric and pathmetrics to states 3 to 6 are also included.

Figure 4:
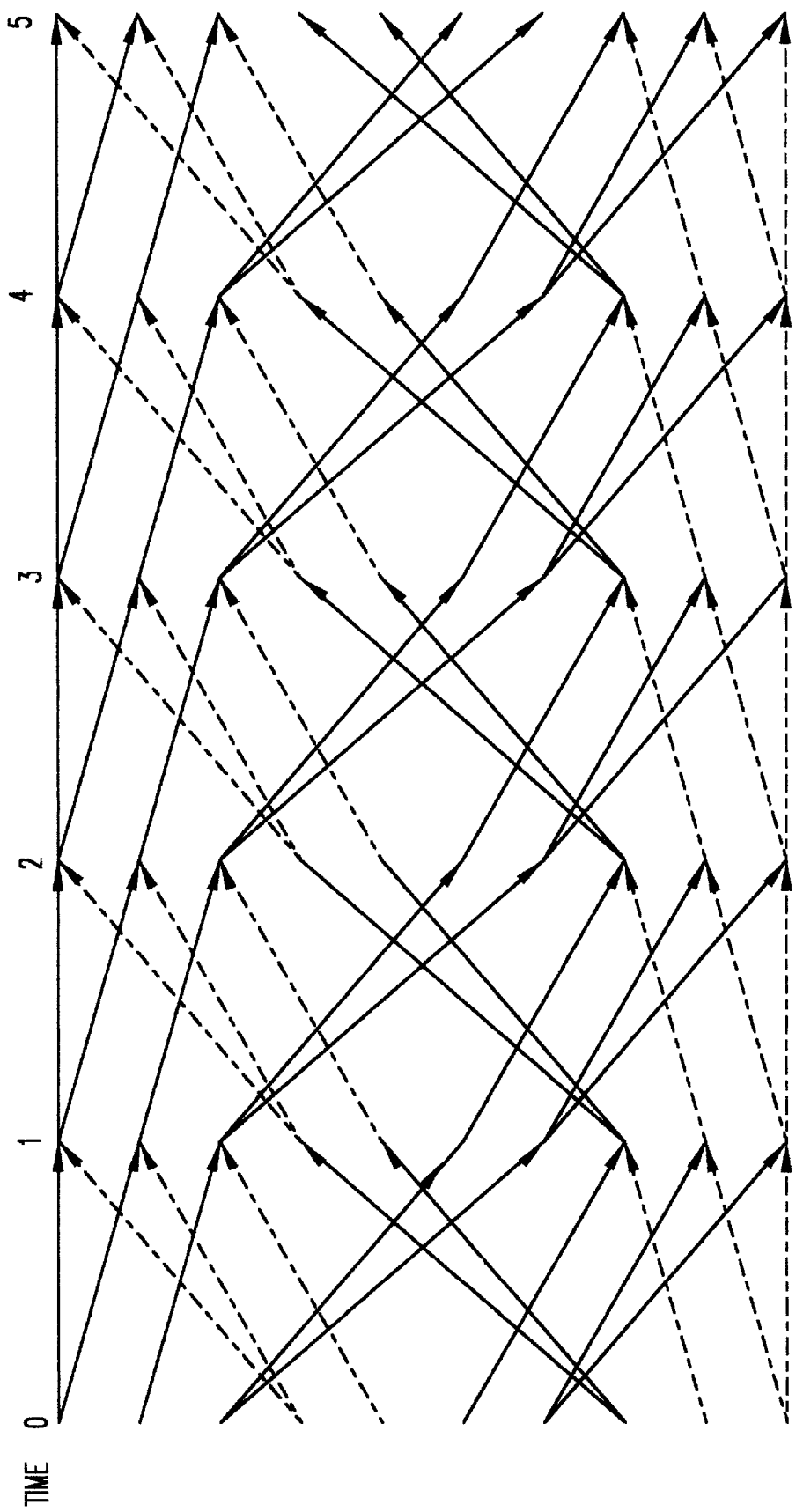
FIG. 4 is a diagram showing a state change where paths are selected extending by further several clocks from those in FIG. 2.

When the selection of path is thus conducted and the survival path is continued in the form of an arrow, for example, as shown by a state change in FIG. 4, paths can be unified to the past state. Namely, In FIG. 4, for all states at time 5, paths are reached from (state 0) at time 0.

In general, when paths are unified to any one of the past states 0, 1 and 2 at time n, it is judged that a ternary level at time n is "0". When paths are unified to any one of the past states 3, 4, 5 and 6 at time n, it is judged that a ternary level at time n is "1". When paths are unified to any one of the past states 7, 8 and 9 at time n, it is judged that a ternary level at that time is "2".

Further, a binary output, e.g., "0010010100001000101 . . .", obtained by assigning a binary output "0" to ternary levels of "0", "2", and a binary output "1" to a ternary level of "1" shows NRZ data before decoding a recording code.

In order to conduct thus the selection of path at each one clock, all the circuits of the data-reproducing device need to be operated at the frequency of input data clock. However, when image signals are recorded, the clock frequency may be more than 100 MHz. Thus, the operation must be very difficult to such a frequency even when the circuit is LSI.

Because of this, in this embodiment, input data are serial-to-parallel converted by the 3 clocks (three-layer developed), and the operation of path selection etc. thereafter is conducted in the lump by the 3 clocks. Therefore, data can be reproduced at a low operation speed.

Figure 2:
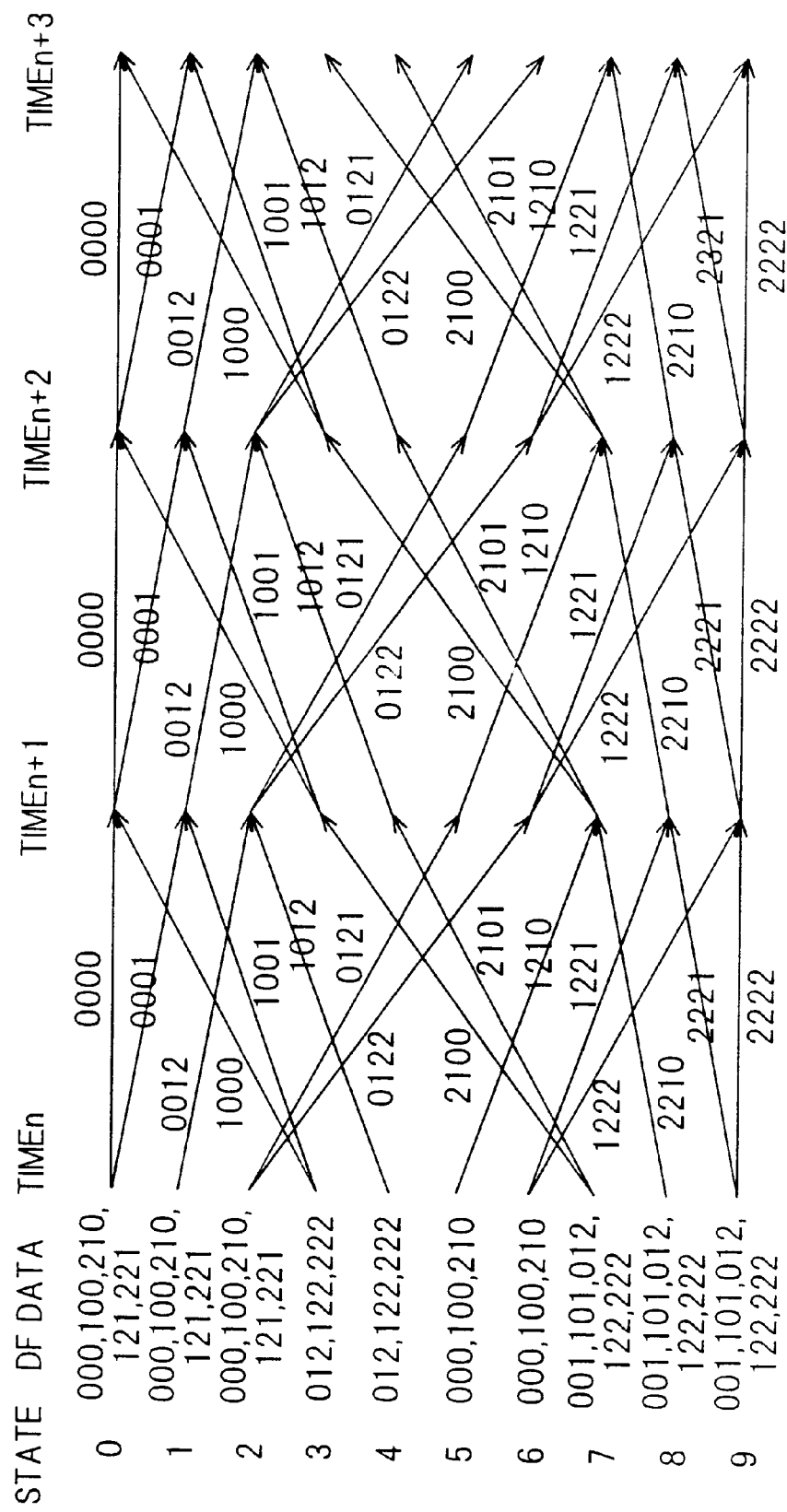
FIG. 2 is a diagram showing a state change where paths are extended by two clocks from those in FIG. 1.

As the operation of path selection etc. is conducted in the lump by the 3 clocks, the chart of state change is correctly shown by FIG. 2 where the state change in FIG. 1 is shown continuing by 3 clocks. From the state change in FIG. 2, it is known that states 0 to 9 at time n+3 can be reached from the following states at time n 3 clocks before:

State 0 can be reached from state 0, 3, 5, 7 or 8,
State 1 can be reached from state 0, 3, 5, 7 or 8,
State 2 can be reached from state 0, 3, 5, 7 or 8,
State 3 can be reached from state 2, 6, or 9,
State 4 can be reached from state 2, 6, or 9,
State 5 can be reached from state 0, 3, or 7,
State 6 can be reached from state 0, 3, or 7,
State 7 can be reached from state 1, 2, 4, 6, or 9,
State 8 can be reached from state 1, 2, 4, 6, or 9, and
State 9 can be reached from state 1, 2, 4, 6, or 9.

Therefore, when the path selection is in the lump conducted by the 3 clocks, for state 0, it needs to select any one of the 5 paths reaching from states 0, 3, 5, 7 and 8, for state 1, any one of the 5 paths reaching from states 0, 3, 5, 7 and 8, for state 2, any one of the 5 paths reaching from states 0, 3, 5, 7 and 8, for state 3, any one of the 3 paths reaching from states 2, 6, and 9, for state 4, any one of the 3 paths reaching from states 2, 6 and 9, for state 5, any one of the 3 paths reaching from states 0, 3 and 7, for state 6, any one of the 3 paths reaching from states 0, 3 and 7, for state 7, it needs to select any one of the 5 paths reaching from states 1, 2, 4, 6 and 9, and, for state 8, any one of the 5 paths reaching from states 1, 2, 4, 6 and 9, and, for state 9, any one of the 5 paths reaching from states 1, 2, 4, 6 and 9.

Figure 5:
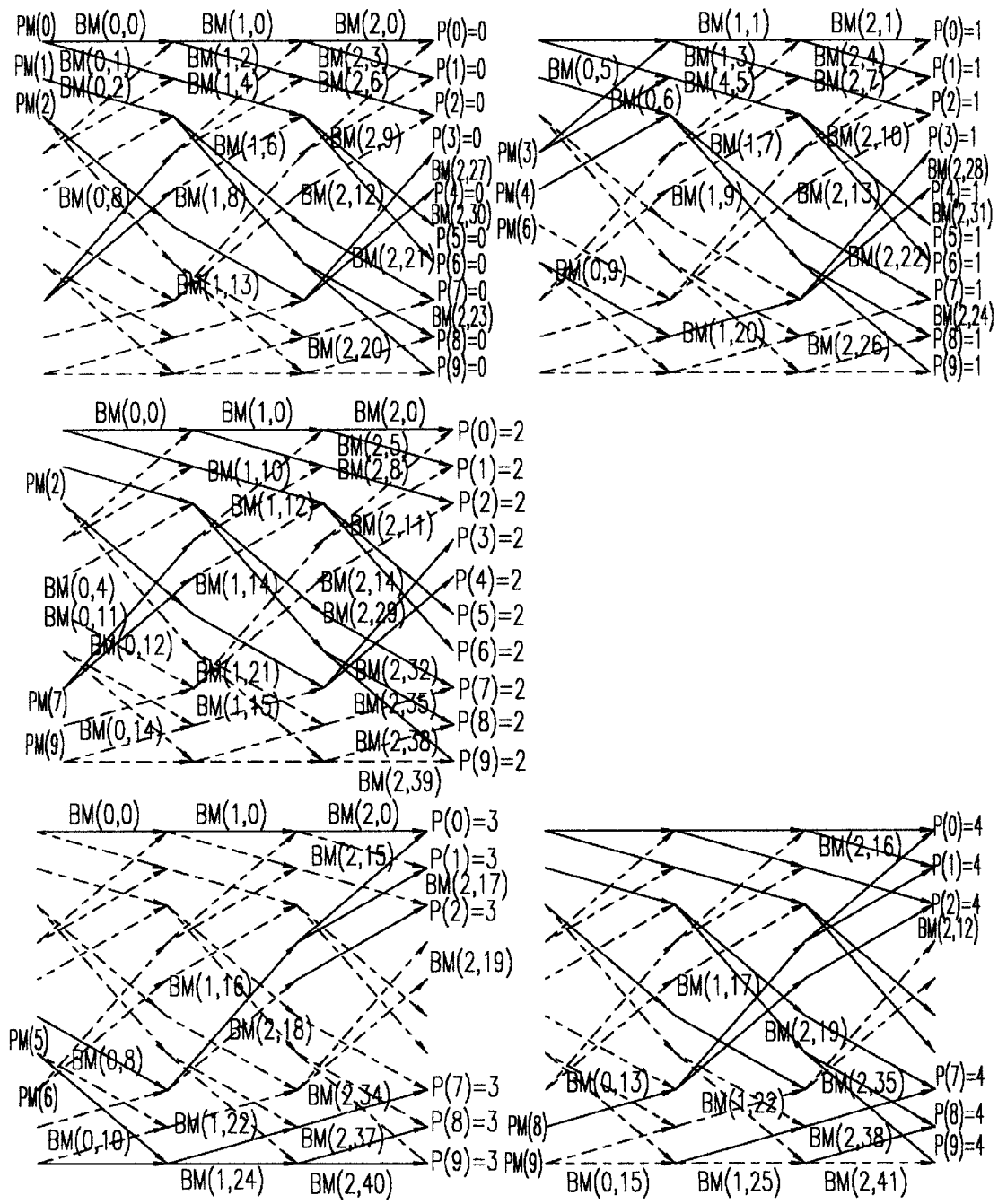
FIG. 5 is a diagram showing state changes that path groups in FIG. 2 are illustrated dividing into 5 figures and pathmetrics and branchmetrics reaching the respective states by the 3 clocks are illustrated.

FIG. 5 shows pathmetrics and branchmetrics to reach the respective states by the 3 clocks. Meanwhile, FIG. 5 shows 5 parts into which the path groups in the state change chart of FIG. 2 are divided, where 3 arrows continuing in the lateral axis direction correspond to one clock (CK), respectively and to totally 3 clocks.

When the selection of path by the 3 clocks, i.e., the selection of pathmetric at each of states 0 to 9 is conducted, as shown in FIG. 5, it is conducted by selecting smaller one of the addition values of pathmetric at 3 clocks before and 3 branchmetrics from this pathmetric at 3 clocks before to the pathmetric concerned. Namely, it is conducted according to equation (2):

$$PM(0) = \min[PM(0) + BM(0,0) + BM(1,0) + BM(2,0), \quad (2)$$
$$PM(3) + BM(0,5) + BM(1,1) + BM(2,1),$$
$$PM(7) + BM(0,11) + BM(1,10) + BM(2,2),$$
$$PM(5) + BM(0,8) + BM(1,16) + BM(2,15),$$
$$PM(8) + BM(0,13) + BM(1,17) + BM(2,16)]$$

$$PM(1) = \min[PM(0) + BM(0,0) + BM(1,0) + BM(2,3),$$
$$PM(3) + BM(0,5) + BM(1,1) + BM(2,4),$$
$$PM(7) + BM(0,11) + BM(1,10) + BM(2,5),$$
$$PM(5) + BM(0,8) + BM(1,16) + BM(2,17),$$
$$PM(8) + BM(0,13) + BM(1,17) + BM(2,18)]$$

$$PM(2) = \min[PM(0) + BM(0,0) + BM(1,2) + BM(2,6),$$
$$PM(3) + BM(0,5) + BM(1,3) + BM(2,7),$$
$$PM(7) + BM(0,11) + BM(1,11) + BM(2,8),$$
$$PM(5) + BM(0,8) + BM(1,18) + BM(2,19),$$
$$PM(8) + BM(0,13) + BM(1,19) + BM(2,20)]$$

$$PM(3) = \min[PM(2) + BM(0,3) + BM(1,13) + BM(2,27),$$
$$PM(6) + BM(0,9) + BM(1,20) + BM(2,28),$$
$$PM(9) + BM(0,14) + BM(1,21) + BM(2,29)]$$

$$PM(4) = \min[PM(2) + BM(0,3) + BM(1,13) + BM(2,30),$$
$$PM(6) + BM(0,9) + BM(1,20) + BM(2,31),$$
$$PM(9) + BM(0,14) + BM(1,21) + BM(2,32)]$$

$$PM(5) = \min[PM(0) + BM(0,1) + BM(1,4) + BM(2,9),$$
$$PM(3) + BM(0,6) + BM(1,5) + BM(2,10),$$
$$PM(7) + BM(0,12) + BM(1,12) + BM(2,11)]$$

$$PM(6) = \min[PM(0) + BM(0,1) + BM(1,4) + BM(2,12),$$
$$PM(3) + BM(0,6) + BM(1,5) + BM(2,13),$$
$$PM(7) + BM(0,12) + BM(1,12) + BM(2,14)]$$

$$PM(7) = \min[PM(1) + BM(0,2) + BM(1,6) + BM(2,21),$$
$$PM(4) + BM(0,7) + BM(1,7) + BM(2,22),$$
$$PM(2) + BM(0,4) + BM(1,14) + BM(2,33),$$
$$PM(6) + BM(0,10) + BM(1,22) + BM(2,34),$$
$$PM(9) + BM(0,15) + BM(1,23) + BM(2,35)]$$

$$PM(8) = \min[PM(1) + BM(0,2) + BM(1,8) + BM(2,23),$$
$$PM(4) + BM(0,7) + BM(1,9) + BM(2,24),$$
$$PM(2) + BM(0,4) + BM(1,15) + BM(2,36),$$
$$PM(6) + BM(0,10) + BM(1,24) + BM(2,37),$$
$$PM(9) + BM(0,15) + BM(1,25) + BM(2,38)]$$

$$PM(9) = \min[PM(1) + BM(0,2) + BM(1,8) + BM(2,25),$$
$$PM(4) + BM(0,7) + BM(1,9) + BM(2,26),$$
$$PM(2) + BM(0,4) + BM(1,15) + BM(2,39),$$
$$PM(6) + BM(0,10) + BM(1,24) + BM(2,40),$$
$$PM(9) + BM(0,15) + BM(1,25) + BM(2,41)]$$

where a right-hand pathmetric has a value one clock older than a left-hand pathmetric.

Thus, the selection of path is conducted by calculating by the 3 clocks and the survival path is continued in the form of an arrow as shown in FIG. 4. Thereby, paths can be unified to the past state.

The above is the principle of enabling the reproduction at a low operation speed.

Next, the principle of reproduction-adaptive process will be explained.

In general, a distortion occurring in the level of input ternary data(0,1,2) is constant in an ideal state. However, due to a variation in record current when recording, a variation in medium characteristics caused by a record position, a variation in record and reproduce characteristics caused by temperature or the like, the distortion is changed.

Because of this, in this embodiment, branchmetric is given as the absolute value of a difference between real input data pre-equalized and its estimate data and the estimate data are renewed properly according to a change in input data. Thereby, even when the distortion of input data is changed due to the various factors, such as a variation in record current when recording, the data reproduction can be conducted to follow that.

The initial value of the estimate data may be a value calculated from an impulse response or a value when recording and reproducing in an ideal state. For example, a method of calculating the initial value from an impulse response will be explained below.

Typically, the effect of reproduce data to adjacent signal can be represented by normal distribution, $$exp(-t^2/2\tau^2)$$

where t is time and $\tau^2$ is a dispersion whose approximate value is obtained by the recording in a real device. In accurate normal distribution, the above expression is divided by $(2\pi\tau^2)^{1/2}$. However, the expression is used as it is as a relative value has only to be known herein.

When the range of adjacent data to effect the respective ternary data is limited to data within 3 clocks before and after, the effects of 7-clock continuous data from 1st clock and 7th clock to the ternary data of the center(4th clock) are as follows:

the effect of $1^{st}$, $7^{th}$ clock to $4^{th}$ clock
   for data "2", $2*exp\,(-(3T_n)^2/2\tau^2)$
   for data "1", $exp\,(-(3T_e)^2/2\tau^2)$
   for data "0", 0
the effect of 2nd, $6^{th}$ clock to $4^{th}$ clock
   for data "2", $2*exp\,(-(2T_g)^2/2\tau^2)$
   for data "1", $exp\,(-(2T_H)^2/2\tau^2)$
   for data "0", 0
the effect of 3rd, $5^{th}$ clock to $4^{th}$ clock
   for "2", $2*exp\,(-(T_a)^2/2\tau^2)$
   for "1", $exp\,(-(T_a)^2/2\tau^2)$
   for data "0", 0
the effect of $4^{th}$ clock to $4^{th}$ clock
   for data "2", 2
   for data "1", 1
   for data "0", 0

The value is normalized within the range of −1 to +1 by using a level corresponding to the maximum value "2222222".

When the data are represented by "A1 A2 A3 A4 A5 A6 A7", the final level data are given by:

$$2 \times \frac{\begin{array}{l}[A1 \cdot \exp(-(3T_s)^2/2\tau^2) + A2 \cdot \exp(-(2T_s)^2/2\tau^2) + \\ A3 \cdot \exp(-T_s^2/2\tau^3) + A4 + A5 \cdot \exp(-T_s^2/2\tau^2) + \\ A6 \cdot \exp(-(2T_s)^2/2\tau^3) + A7 \cdot \exp(-(3T_s)^2/2\tau^2)]\end{array}}{\begin{array}{l}[4 \cdot \exp(-(3T_s)^2/2\tau^3) + 4 \cdot \exp(-(2T_s)^2/2\tau^2) + \\ 4 \cdot \exp(-T_s^2/2\tau^2) + 2]\end{array}} - 1 \quad (3)$$

For example, when $\tau/T_s = 0.6$ and 7-clock data of "2100122" are given, the $4^{th}$ clock level is given by:

$$\begin{aligned}&[2 \cdot \exp(-(8T_s)^2/2\tau^2) + \exp(-(2T_s)^2/2\tau^2) + \exp(-T_s^1/2\tau^2) + \\&\quad 2 \cdot \exp(-(8T_s)^1/2\tau^2)] / [4 \cdot \exp(-(3T_s)^2/2\tau^2) + \\&\quad 4 \cdot \exp(-(2T_s)^2/8\tau^2) + 4 \cdot \exp(-T_s^2/2\tau^2) + \\&\quad 2] = [4 \cdot (-12.5) + 8 \cdot \exp(-5.56) + \exp(-1.89)] / [4 \cdot \exp(-12.5) + \\&\quad 4 \cdot \exp(-5.56) + 4 \cdot \exp(-1.89) + 2] = \\&\quad 2 \times (0.26/3.02) - 1 = -0.88\end{aligned} \quad (4)$$

As the initial value of estimate data, a value calculated as the above and then rounded into about 6 bits is used.

Next, explained will be that estimate values for the center($4^{th}$ clock) data should be prepared to which ternary 7-clock data. Meanwhile, ternary 7-clock data from which the estimate values for $4^{th}$ clock data are originated are called '7-clock estimate data'.

Again, referring to FIGS. 2 and 5, there are in total 5 paths reaching from a state at time n 3 clocks before to state 9 at time n+3. The states of the 5 paths at times n, n+1 and n+2 are as follows:

state 0→state 0→state 0
state 3→state 0→state 0
state 7→state 3→state 0
state 5→state 7→state 3
state 8→state 7→state 3

When the path unification is conducted as described earlier, the ternary data when unified to states 0 to 2 is '0', the ternary data when unified to states 3 to 6 is '1', and the ternary data when unified to states 7 to 9 is '2'. Accordingly, the 3-clock continuous data are 5 patterns of:

000, 100, 210, 121, 221

In like manner, the 3-clock continuous data to reach states 1 to 9 are obtained as follows:

| | |
|---|---|
| state 1 | 000, 100, 210, 121, 221 |
| state 2 | 000, 100, 210, 121, 221 |
| state 3 | 012, 122, 222 |
| state 4 | 012, 122, 222 |
| state 5 | 000, 100, 210 |
| state 6 | 000, 100, 210 |
| state 7 | 001, 101, 012, 122, 222 |
| state 8 | 001, 101, 012, 122, 222 |
| state 9 | 001, 101, 012, 122, 222 | the above is also applicable to the other time than time n+3. In fact, 3-figure values listed to the left side in FIG. 2 show the 3-clock continuous data to reach states 0 to 9 at time n. The 3-clock continuous data to thus reach states 0 to 9 are called 'DF data'.

Now, referring to FIG. 2, state 0 can be followed by two kinds of Viterbi data "0000", "0001", state 1 can be followed by 1 kind of Viterbi data "0012", in like manner, state 2 by 2 kinds of Viterbi data, state 3 by 2 kinds of Viterbi data, state 4 by 1 kind of Viterbi data, state 5 by 1 kind of Viterbi data, state 6 by 2 kinds of Viterbi data, state 7 by 2 kinds of Viterbi data, state 8 by 1 kind of Viterbi data, and state 9 by 2 kinds of Viterbi data.

Accordingly, the sum of values obtained by multiplying the number of DF data to reach each of states 0 to 9 by the number of Viterbi data to follow that state is equal to the sum of estimate data (7-clock estimate data) needed. Namely, the former sum is obtained by:

$$5 \times 2 + 5 \times 1 + 5 \times 2 + 3 \times 2 + 3 \times 1 + 3 \times 1 + 3 \times 2 + 5 \times 2 + 5 \times 1 + 5 \times 2 = 68$$

In calculating branchmetrics BM(0,0) to BM(0,15) on the right side of equation (2), each one estimate data to be selected from the above 68 kinds of estimate data is used. Also, in calculating branchmetrics BM(1,0) to BM(1,25) and BM(2,0) to BM(2,41) on the right side of equation (2), each one estimate data to be selected from the above 68 kinds of estimate data is used.

In selection, estimate data are read out from a storage circuit for storing the 68 kinds of estimate data by using 7-clock estimate data to estimate data as addresses. Namely, the estimate data are stored with the 7-clock estimate data as addresses in the storage circuit.

Hereinafter, estimate data to be used in the calculating of branchmetrics BM(0,0) to BM(0,15), BM(1,0) to BM(1,25) and BM(2,0) to BM(2,41) are defined as RM(0,0) to RM(0, 15), RM(1,0) to RM(1,25) and RM(2,0) to RM(2,41).

Next, explained will be that estimate data based on which 7-clock estimate data are assigned to RM(0,0) to RM(0,15), RM(1,0) to RM(1,25) and RM(2,0) to RM(2,41).

In case of RM((0,0) to RM(0,15):

Now, DF data of 3-clock continuous data to reach states 0 to 9 at time n are defined as m(−3,0), m(−2,0), m(−1,0), . . . , m(−3,9), (−2,9) and (−1,9). The first item in parenthesis represents time and the second item represents state number.

When new 3-clock continuous data over times n, n+1 and n+2 are in the lump calculated by expression (2), DF data to reach states 0 to 9 at time n are already obtained by the previous calculation in expression (2). Also, as shown in FIG. 2, Viterbi data of 4-clock continuous data continuing from the point of time n are determined to each of RM(0,0) to RM(0,15). Accordingly, 7-clock estimate data assigned to RM(0,0) to RM(0,15) are obtained by the addition of DF data to reach states 0 to 9 at time n and Viterbi data.

Thus, for example, to RM(0,0), '0000000' is assigned when DF data at time n/state 0 is '000', '1000000' when '100', '2100000' when '210', '1210000' when '121', and '2210000' when '221'. Also, for example, to RM(0,7), '0121012' is assigned when DF data at time n/state 4 is '012', '1221012' when '122', and '2221012' when '222'.

In case of RM(1,0) to RM(1,25):

The top 2 clocks of DF data at time n+1 correspond to the last 2 clocks of DF data at time n. Also, from the state changes in FIGS. 2 and 5, the last one clock of DF data at time n+1 is determined. Namely, for example, for RM(1,0) used in the calculation of BM(1,0) in FIG. 5, the last one clock of DF data is "0" as BM(1,0) reaches time n+1/state 0 through time n/state 0 and state 0 has "0". Also, for RM(1,16) used in the calculation of BM(1,16), the last one clock of DF data is "1" as BM(1,16) reaches time n+1/state 7 through time n/state 5 and state 5 has "0". Further, for RM(1,23) used in the calculation of BM(1,23), the last one clock of DF data is "2" as BM(1,23) reaches time n+1/state 9 through time n/state 9 and state 9 has "2". In like manner, for the other RM, the last one clock can be determined. Also, as shown in FIG. 2, Viterbi data of 4-clock continuous data continuing from the point of time n+1 are determined for each of RM(1,0) to RM(1,25). Accordingly, ternary 7-clock estimate data assigned to RM(1,0) to RM(1,25) are obtained by the addition of the last 2 clocks of DF data to reach states 0 to 9 at time n, one clock obtained from the stage change in FIG. 2 and Viterbi data.

Thus, for example, to RM(1,0) used in the calculation of BM(1,0), '0000000' is assigned when DF data at time n/state 0 is '000' or '100', '1000000' when '210', and '2100000' when '121' or '221'. Also, for example, to RM(1,1) used in the calculation of BM(1,1), '1210000', which is obtained by the addition of the last 2 clocks '12', estimate bit '1' and Viterbi data '0000', is assigned when DF data at time n/state 3 is '012', and '2210000' when '122' or '222'.

In case of RM(2,0) to RM(2,41):

The top one clock of DF data at time n+2 corresponds to the last one clock of DF data at time n. Also, from the state changes in FIGS. 2 and 5, the last 2 clocks of DF data at time n+2 is determined. Namely, for example, for RM(2,1) used in the calculation of BM(2,1), the last 2 clocks of DF data are "0", "1" as BM(2,1) reaches time n+2/state 0 through time n/state 3 and time n+1/state 0, and state 0 has "0" and state 3 has "1". Also, for RM(2,37) used in the calculation of BM(2,37), the last 2 clocks of DF data are "1", "2" as BM(2,37) reaches times n+2/state 9 through time n/state 6 and time n+1/state 9, and state 6 has "1" and state 9 has "2". In like manner, for the other RM, the last 2 clocks can be determined. Also, as shown in FIG. 2, Viterbi data of 4-clock continuous data continuing from the point of time n+2 are determined for each of RM(2,0) to RM(2,41). Accordingly, ternary 7-clock estimate data assigned to RM(2,0) to RM(2, 41) are obtained by the addition of the last one clock of DF data to reach states 0 to 9 at time n, 2 clocks obtained from the stage change in FIG. 2 and Viterbi data.

Thus, for example, to RM(2,1) used in the calculation of BM(2,1), '2100000', which is obtained by the addition of the last one clock '2', estimate bits '10' and Viterbi data '0000', is assigned when DF data at time n/state 3 is '012', '122' or '222'. Also, for example, to RM(2,37) used in the calculation of BM(2,37), '0122221', which is obtained by the addition of the last one clock '0', estimate bits '12' and Viterbi data '2221', is assigned when DF data at time n/state 6 is '000', '100' or '210'.

Figure 3:
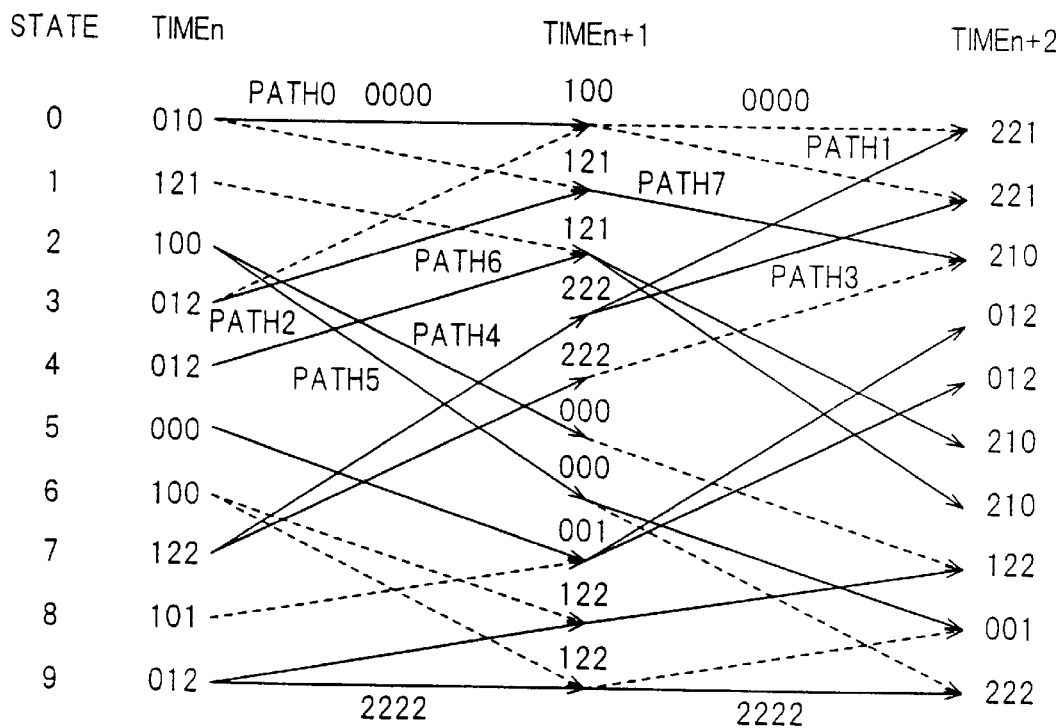
FIG. 3 is a diagram showing a state change where paths by two clocks in FIG. 1 are selected.

Now, referring to FIG. 3, the meaning of 7-clock estimate data will be explained again. Meanwhile, FIG. 3 shown states that 2-clock paths are selected, where full lines indicate selected and survived paths and dotted lines indicates unselected paths. Also, in FIG. 3, all 3-clock data other than 4-clock Viterbi data "0000", "2222" are DF data.

In state 0, time n is reached from ternary DF data "010", thereafter followed by "0000", therefore summing into "0100000", which is 7-clock estimate data corresponding to survival path 0. Time n+1 is reached from $1^{st}$ clock to $3^{rd}$ clock "100" of "100000" shifted by one clock to the left of "0100000", but not continuing anywhere thereafter. Time n+2 is reached from $1^{st}$ clock to $3^{rd}$ clock "222" of "222100" shifted by one clock to the left of "1222100" that is summed from "122" at time n/state 7 and "2100" reaching time n+1/state 3 from there, thereafter followed by "1000", therefore summing into "2221000", which is 7-clock estimate data corresponding to survival path 1.

In state 1, time n is reached from ternary DF data "121", but not continuing anywhere thereafter. Time n+1 is reached from "012" at time n/state 3, thereafter followed by "1001", therefore summing into "0121001", which is 7-clock estimate data corresponding to survival path 2. Time n+2 is reached from $1^{st}$ clock to $3^{rd}$ clock "222" of "222100" shifted by one clock to the left of "122100" that is summed from "122" at time n/state 7 and "2100" reaching time n+1/state 3 from there, thereafter followed by "1001", therefore summing into "2221001", which is 7-clock estimate data corresponding to survival path 3.

In state 2, time n is reached from ternary DF data "100", thereafter followed by "0121", "0122", therefore summing into "1000121", "1000122", which are 7-clock estimate data corresponding to survival paths 4, 5. Time n+1 is reached from "012" at time n/state 4, thereafter followed by "1012", therefore summing into "121012", which is 7-clock estimate data corresponding to survival path 6. Time n+2 is reached from $1^{st}$ clock to $3^{rd}$ clock "121" of "121001" shifted by one clock to the left of "0121001" that is summed from "012" at time n/state 3 and "1001 "reaching time n+1/state 2 from there, thereafter followed by "0012", therefore summing into "1210012", which is 7-clock estimate data corresponding to survival path 7.

Next, a method of renewing estimate data will be explained.

As the input data characteristic changes every second, estimate data prepared to input data also have to be changed according to this. However, if these are excessively accorded with input data, the estimate data may be also broken when a burst error occurs.

Because of this, in this embodiment, the estimate data are renewed by increasing by one step (SD) the estimate data when the accumulation value of the difference values obtained by subtracting the estimate data from the input data exceeds a predetermined positive (+) threshold value (TH), and by decreasing by one step (SD) the estimate data when it becomes less than a predetermined negative (−) threshold value (−TH) so as to minimize the difference between the input data and estimate data. The threshold values TH, −TH may be arbitrary real numbers. Also, one step (SD) may be a digital level of "1" an arbitrary real number.

Of course, the other renewing methods, e.g., a method of renewing estimate data by adding input data to current estimate data while weighting each of them can be also used.

Meanwhile, as the addresses of estimate data to be rewritten in the storage circuit are, as described later, obtained from continuous output data of the path memory circuit, there exist tens of stages of delays. Therefore, the input data have to be delayed by a delay to synchronize with that.

(2) The Schematic Composition of The Data-Reproducing Device

FIG. 6 is a block diagram showing the whole composition of the data-reproducing device in the first embodiment. As shown, the data-reproducing device in the first embodiment comprises a subtraction absolute value circuit 60, a comparison and selection circuit 61, a path memory circuit 62, Main-RAM 63, Diff-RAM 64, a correction control circuit 65, a delay 66 and a Main-RAM address generating circuit 67.

Input data 'Din' to the device is A/D converted of ternary data by PR(1,1) pre-equalization before inputting to G/A and have a quantization bit number of 6.

The subtraction absolute value circuit 60 outputs the absolute values of errors, i.e., subtraction values, between 3-clock input data Din and estimate values to input data for 84 sample to be transferred from Main-RAM 63, RM(0,0) to RM(0,15), RM(1,0) to RM(1,25) and RM(2,0) to RM (2,41) as branchmetrics BM(0,0) to BM(0,15), BM(1,0) to BM(1, 25) and BM(2,0) to BM(2,41). Namely, the subtraction absolute value circuit 60 calculates branchmetrics BM(0,0) to BM(0,15), BM(1,0) to BM(1,25) and BM(2,0) to BM(2, 41) on the right side of equation (2). Also, the subtraction absolute value circuit 60 outputs 3-clock input data, Din0, Din1 and Din2 through the delay 66 to the correction control circuit 65.

The comparison and selection circuit 61 calculates the respective components on the right side of equation (2) by using branchmetrics BM(0,0) to BM(0,15), BM(1,0) to BM(1,25) and BM(2,0) to BM(2,41) calculated by the subtraction absolute value circuit 60 and pathmetrics PM(0) to PM(9) previously calculated by itself, then selects the minimums as new pathmetrics PM(0) to PM(9), and outputs, as survival path informations P(0,0) to P(0,9), comparison and selection signals to represent which paths are selected.

The Main-RAM address generating circuit 67 generates the addresses for reading out in the lump the estimate values needed for the above-mentioned calculation of the subtraction absolute value circuit 60, RM(0,0) to RM(0,15), RM(1, 0) to RM(1,25) and RM(2,0) to RM(2,41) from the Main-RAM circuit 63. The Main-RAM address generating circuit 67 generates the addresses of the Main-RAM circuit 63 according to survival path informations P(0,0) to P(0,9) output from the comparison and selection circuit 61.

The path memory circuit 62 stores survival path informations over tens of stages to be output from the comparison and selection circuit 61, then inspecting the path unification based on these data, outputting the most probable output data. VT0, VT1 and VT2 to each of the 3-clock input data Din. Outputs VT0 to VT2 are of ternary output (0,1,2) and, at a post-stage (not shown), a binary final output of "1" is given to the ternary output "0" or "2" and a binary final output of "1" is given to the ternary output "1". Also, outputs VT0 to VT2 are also supplied to the correction control circuit 65.

The correction control circuit 65 serves to renew the estimate data stored in the Main-RAM 63 into more probable values. In the first embodiment, the correction control circuit 65 accumulates the difference values obtained by subtracting the estimate data from the input data, increasing by one step the estimate data when the accumulated value exceeds a predetermined positive(+) threshold value and decreasing by one step the estimate data when the accumulated value becomes less than a predetermined negative(31 ) threshold value.

The accumulation result of the difference values are stored in the Diff-RAM 64.

Therefore, the Main-RAM 63 and Diff-RAM 64 are readable and writable for the correction control circuit 65. In FIG. 6, WADR0-0 to 0-2, WADR1 to 14 and WADR15-0 to 15-2 are addresses to be output when the correction control circuit 65 accesses the Main-RAM 63 and Diff-RAM 64, and WR0-0 to 0-2, WR1 to 14 and WR15-0 to 15-2 represent to be write-enable. Also, RDT0-0 to 0-2, RDT1 to 14 and RDT15-0 to 15-2 are data (estimate data before renewing) to be read out from the Main-RAM 63, and WDT0-0 to 0-2, WDT1 to 14 and WDT15-0 to 15-2 are data (estimate data after renewing) to be written into the Main-RAM 63. Further, DRD0-0 to 0-2, DRD1 to 14 and DRD15-0 to 15-2 are data (accumulation value before renewing) to be read out from the Diff-RAM 64, and DWD0-0 to 0-2, DWD1 to 14 and DWD15-0 to 15-2 are data (accumulation value after renewing) to be written into the Diff-RAM 64.

Meanwhile, the correction control circuit 65 gets the addresses of estimate data to be renewed in the Main-RAM 63 based on outputs VT0 to VT2 output from the path memory circuit 62. Therefore, between the input data Din0 to Din2 from the subtraction absolute value circuit 60 and the estimate data determined based on outputs VT0 to VT2, there are tens of stages of delays in timing. The delay 66 serves to control the delay amount of input data, and Din0D, Din1D and Din2D in FIG. 6 represent the input data Din0 to Din2 whose delay amounts are controlled.

(3) The Details of the Device

Specific examples of the respective circuits will be explained below.

(3-1) Subtraction Absolute Value Circuit 60

Figure 7:
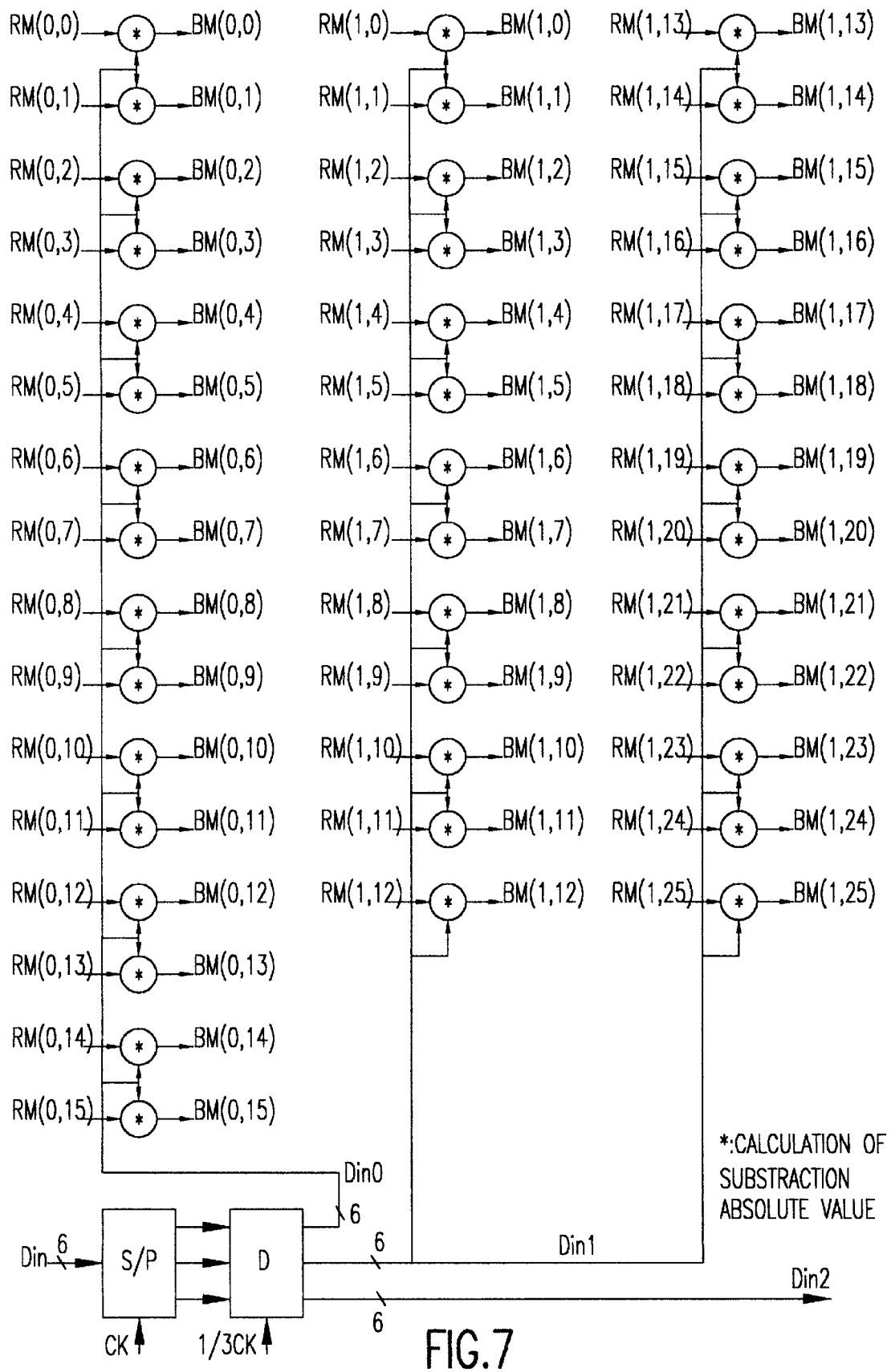
FIGS. 7 and 8 are block diagrams showing an example of composition of a subtraction absolute value circuit.
Figure 8:
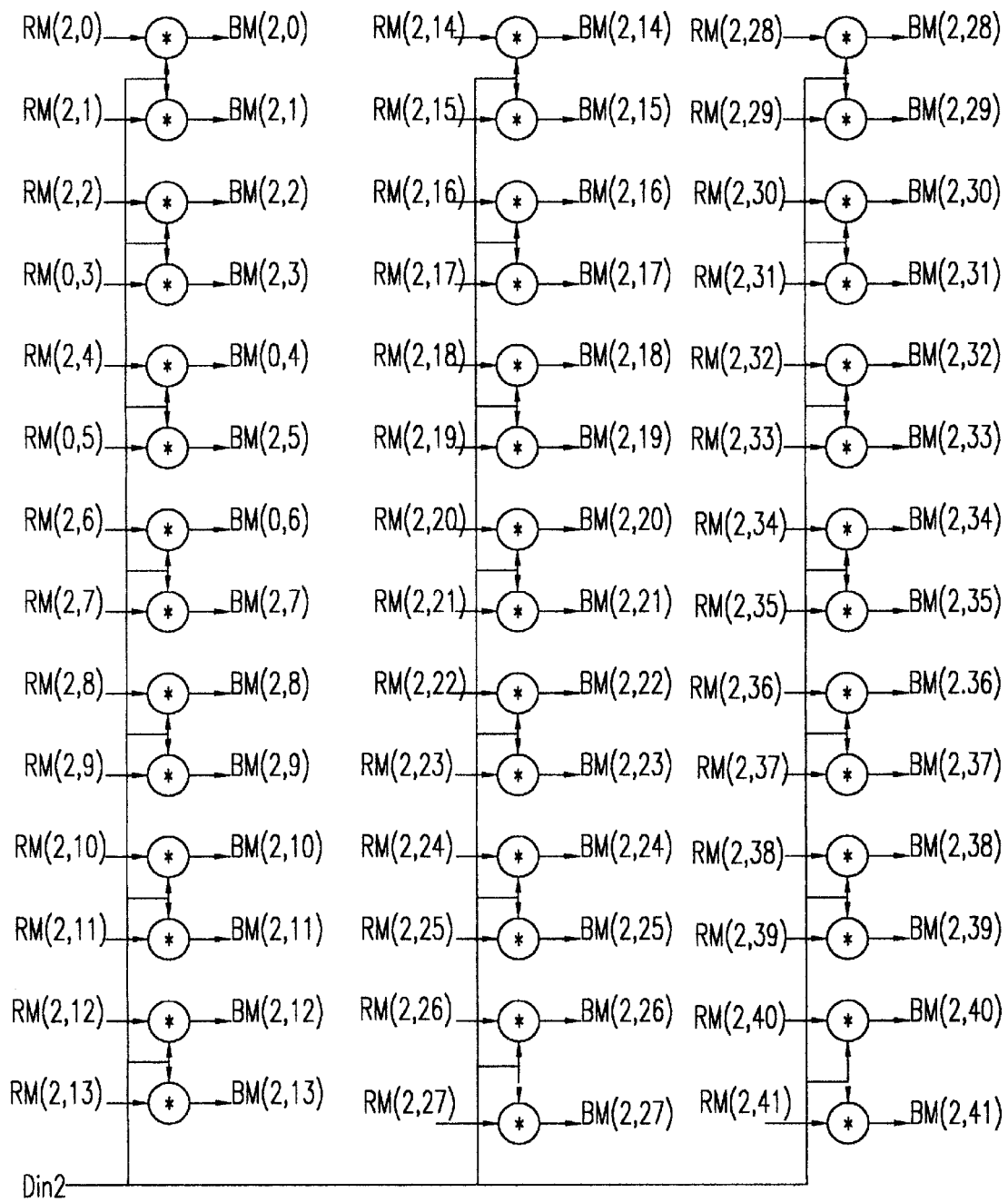

FIGS. 7 and 8 show an example of composition of the subtraction absolute value circuit 60. Meanwhile, for the convenience of drawing the figures, the composition of the subtraction absolute value circuit 60 is divided into FIGS. 7 and 8. As shown, the subtraction absolute value circuit 60 comprises a serial-to-parallel converter S/P operated by one clock (CK), a data latch D operated by ⅓ clock, and 84 subtraction absolute value circuits each of which is indicated by (*).

To the subtraction absolute value circuit 60, input data Din that ternary data PR(1,1) pre-equalized (not shown) are A/D converted are input. The input data Din are developed into 3-clock data Din0, Din1 and Din2 by the serial-to-parallel converter S/P and the latch D to latch the parallel output of the serial-to-parallel converter S/P, then distributed into the 84 subtraction absolute value circuits (*).

Also, input to the respective subtraction absolute value circuits (*) are the 84 of the estimate values, RM(0,0) to RM(0,15), RM(1,0) to RM(1,25) and RM(2,0) to RM(2,41) to be read out form the Main-RAM circuit 63 by the addresses generated by the Main-RAM address generating circuit 67.

In the respective subtraction absolute value circuits (*), RM(0,0) to RM(0,15) are subtracted from Din0, RM(1,0) to RM(1,25) are subtracted from Din1, and RM(2,0) to RM(2, 41) are subtracted from Din2. Then, by calculating the absolute values, branchmetrics BM(0,0) to BM(0,15), BM(1,0) to BM(1,25) and BM(2,0) to BM(2,41) are obtained.

Meanwhile, although not show in FIGS. 7 and 8, Din0 to Din2 are also output to the delay 66 as shown in FIG. 6.

(3-2) Comparison and Selection Circuit 61

Figure 9:
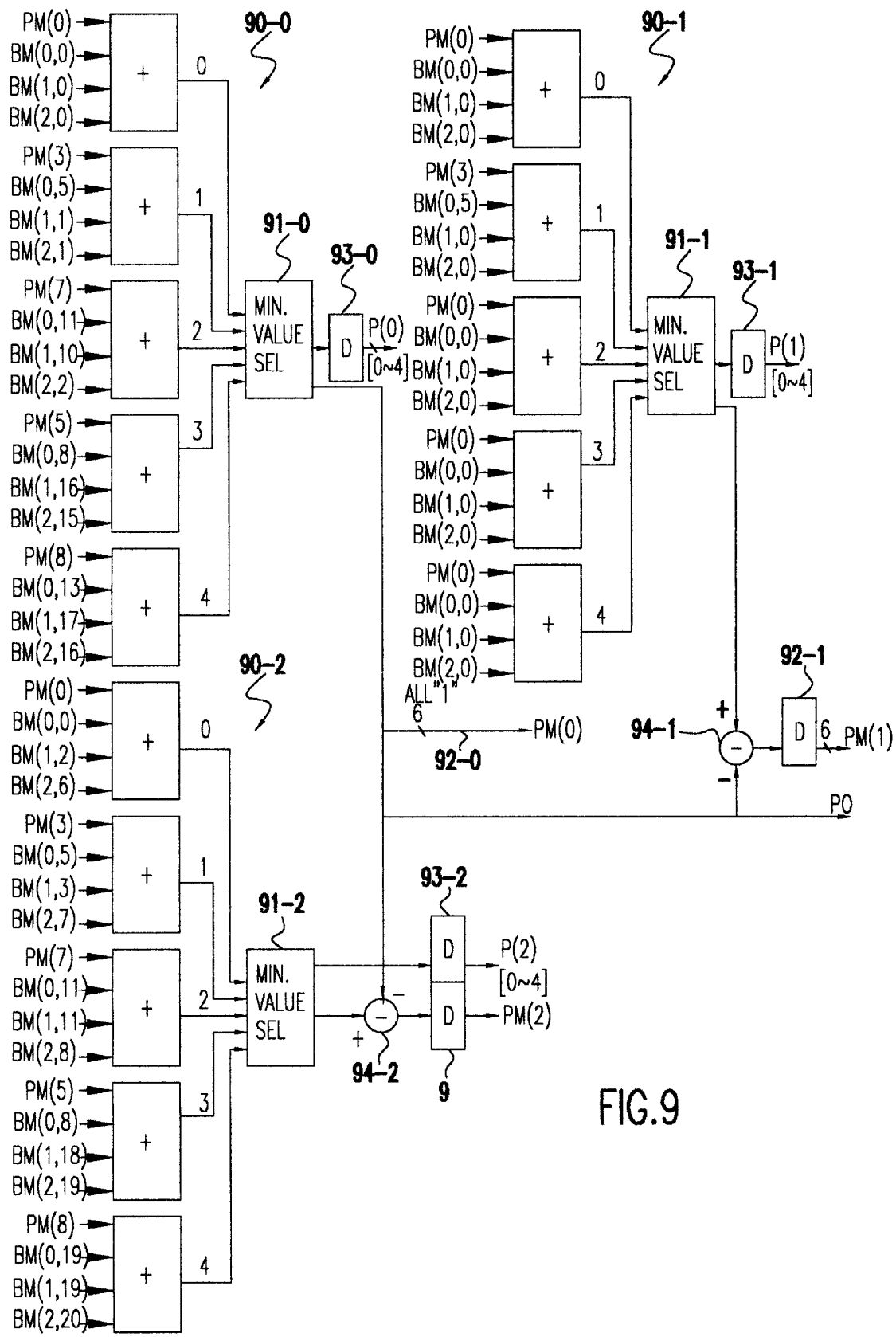
FIGS. 9 to 11 are block diagrams showing an example of composition of a comparison and selection circuit.
Figure 10:
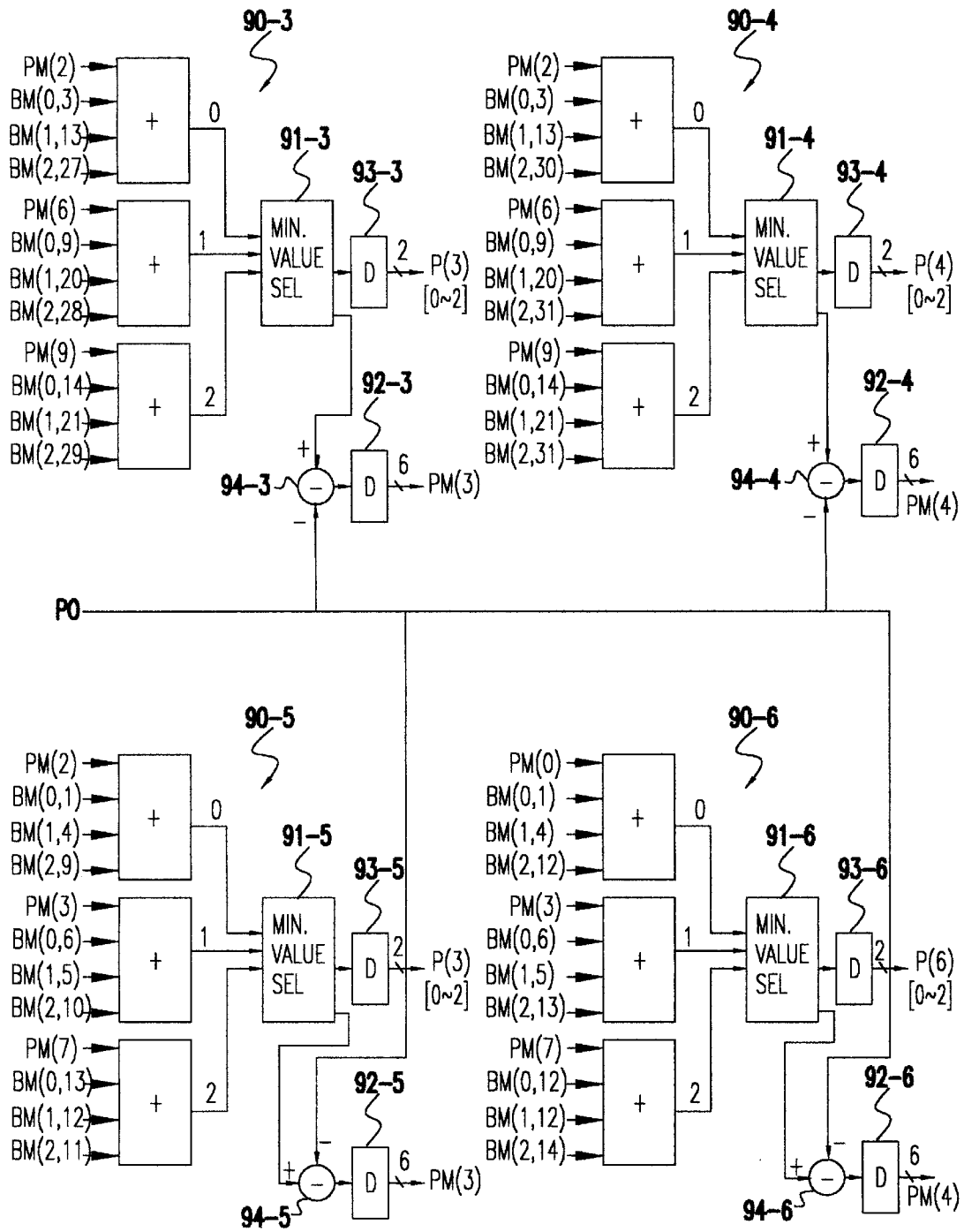
Figure 11:
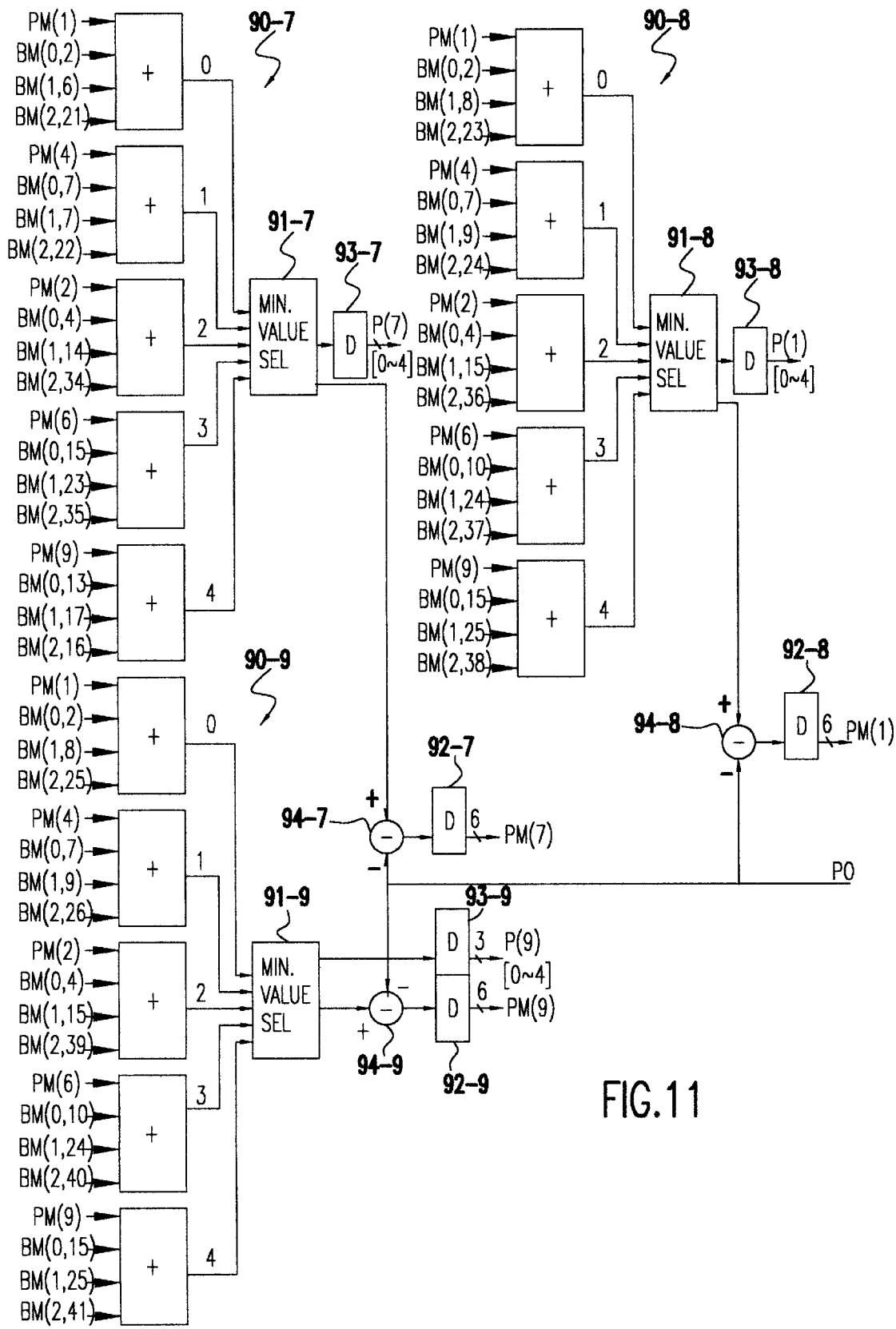

FIGS. 9 to 11 show an example of composition of the comparison and selection circuit 61. Meanwhile, for the convenience of drawing the figures, the composition of the comparison and selection circuit 61 is divided into FIGS. 9 to 11. As shown, the comparison and selection circuit 61 comprises 9 groups of adders 90-0 to 90-9, minimum value selection circuits 91-0 to 91-9 in each group, data latches 92-0 to 92-9 and 93-0 to 93-9, and subtraction circuits 94-1 to 94-9.

To the 9 groups of adders 90-0 to 90-9 of the comparison and selection circuit 61, branchmetrics BM(0,0) to BM(0, 15), RM(1,0) to BM(1,25) and BM(2,0) to BM(2,41) output from the subtraction absolute value circuit 60, and previously obtained pathmetrics PM(0) to PM(9) to be stored in the data latches 92-0 to 92-9 are input. According to these inputs, the 9 groups of adders 90-0 to 90-9 calculate the components on the right side of expression (2). Namely, they are as shown by the following expression (5):

$$
\begin{aligned}
&PM(0) + BM(0,0) + BM(1,0) + BM(2,0),\\
&PM(3) + BM(0,5) + BM(1,1) + BM(2,1),\\
&PM(7) + BM(0,11) + BM(1,10) + BM(2,2),\\
&PM(5) + BM(0,8) + BM(1,16) + BM(2,15),\\
&PM(8) + BM(0,13) + BM(1,17) + BM(2,16)
\end{aligned} \quad (5\text{-}0)
$$

$$
\begin{aligned}
&PM(0) + BM(0,0) + BM(1,0) + BM(2,3),\\
&PM(3) + BM(0,5) + BM(1,1) + BM(2,4),\\
&PM(7) + BM(0,11) + BM(1,10) + BM(2,5),\\
&PM(5) + BM(0,8) + BM(1,16) + BM(2,17),\\
&PM(8) + BM(0,13) + BM(1,17) + BM(2,18)
\end{aligned} \quad (5\text{-}1)
$$

$$
\begin{aligned}
&PM(0) + BM(0,0) + BM(1,2) + BM(2,6),\\
&PM(3) + BM(0,5) + BM(1,3) + BM(2,7),\\
&PM(7) + BM(0,11) + BM(1,11) + BM(2,8),\\
&PM(5) + BM(0,8) + BM(1,18) + BM(2,19),\\
&PM(8) + BM(0,13) + BM(1,19) + BM(2,20)
\end{aligned} \quad (5\text{-}2)
$$

$$
\begin{aligned}
&PM(2) + BM(0,3) + BM(1,13) + BM(2,27),\\
&PM(6) + BM(0,9) + BM(1,20) + BM(2,28),\\
&PM(9) + BM(0,14) + BM(1,21) + BM(2,29)
\end{aligned} \quad (5\text{-}3)
$$

$$
\begin{aligned}
&PM(2) + BM(0,3) + BM(1,13) + BM(2,30),\\
&PM(6) + BM(0,9) + BM(1,20) + BM(2,31),\\
&PM(9) + BM(0,14) + BM(1,21) + BM(2,32)
\end{aligned} \quad (5\text{-}4)
$$

$$
\begin{aligned}
&PM(0) + BM(0,1) + BM(1,4) + BM(2,9),\\
&PM(3) + BM(0,6) + BM(1,5) + BM(2,10),\\
&PM(7) + BM(0,12) + BM(1,12) + BM(2,11)
\end{aligned} \quad (5\text{-}5)
$$

$$
\begin{aligned}
&PM(0) + BM(0,1) + BM(1,4) + BM(2,12),\\
&PM(3) + BM(0,6) + BM(1,5) + BM(2,13),\\
&PM(7) + BM(0,12) + BM(1,12) + BM(2,14)
\end{aligned} \quad (5\text{-}6)
$$

$$
\begin{aligned}
&PM(1) + BM(0,2) + BM(1,6) + BM(2,21),\\
&PM(4) + BM(0,7) + BM(1,7) + BM(2,22),\\
&PM(2) + BM(0,4) + BM(1,14) + BM(2,33),\\
&PM(6) + BM(0,10) + BM(1,22) + BM(2,34),\\
&PM(9) + BM(0,15) + BM(1,23) + BM(2,35)
\end{aligned} \quad (5\text{-}7)
$$

$$
\begin{aligned}
&PM(1) + BM(0,2) + BM(1,8) + BM(2,23),\\
&PM(4) + BM(0,7) + BM(1,9) + BM(2,24),\\
&PM(2) + BM(0,4) + BM(1,15) + BM(2,36),\\
&PM(6) + BM(0,10) + BM(1,24) + BM(2,37),\\
&PM(9) + BM(0,15) + BM(1,25) + BM(2,38)
\end{aligned} \quad (5\text{-}8)
$$

$$
\begin{aligned}
&PM(1) + BM(0,2) + BM(1,8) + BM(2,25),\\
&PM(4) + BM(0,7) + BM(1,9) + BM(2,26),\\
&PM(2) + BM(0,4) + BM(1,15) + BM(2,39),\\
&PM(6) + BM(0,10) + BM(1,24) + BM(2,40),\\
&PM(9) + BM(0,15) + BM(1,25) + BM(2,41)]
\end{aligned} \quad (5\text{-}9)
$$

(5)

Then, the minimum value selection circuits 91-0 to 91-9 judge the minimum values according to expression (2). Namely, they select the minimum value of components obtained by the corresponding groups of adders 90-0 to 90-9, outputting it as new pathmetrics PM(0) to PM(9) to the data latches 92-0 to 92-9. Here, as the relative values of PM(0) to PM(9) are important, the subtraction circuits 94-1 to 94-9 subtract pathmetric PM(0) output from the minimum value selection circuit 91-0 from pathmetrics PM(1) to PM(9) output from the minimum value selection circuits 91-1 to 91-9 so as to prevent the overflowing.

Simultaneously, the minimum value selection circuits 91-0 to 91-9 output survival path informations P(0,0) to P(0,9), that indicate which component, i.e., which path is selected, to the data latches 93-0 to 93-9. The first item in parenthesis represents time and the second item represents state number. Meanwhile, item of time is not shown in FIGS. 9 to 11. The value of survival path informations P(0) to P(9) is given as follows: As described on the output side of each adder in the groups of adders 90-0 to 90-9 in FIGS. 9 to 11, the survival path information is '0' when the highest path is selected, i.e., when the first item in the minimum value selection of expression (2) is selected; and, in like manner, the survival path information is 1, 2, 3; and the survival path information is 4 when the lowest path is selected, i.e., when the fifth item in the minimum value selection of expression (2) is selected. Meanwhile, as to P(3) to P(6), as the fourth and fifth items are not included, the value is selected from 0, 1 and 2.

The values of P(0) to P(9) corresponding to the full lines in FIG. 5 represent the value of survival path information when the path is selected.

The survival path informations P(0) to P(9) stored in the data latches 93-0 to 93-9 are in total of 10 symbol and 26 bits, which are output to the path memory circuit 62 and Main-RAM address generating circuit 67.

(3-3) Main-RAM Address Generating Circuit 67

Figure 12:
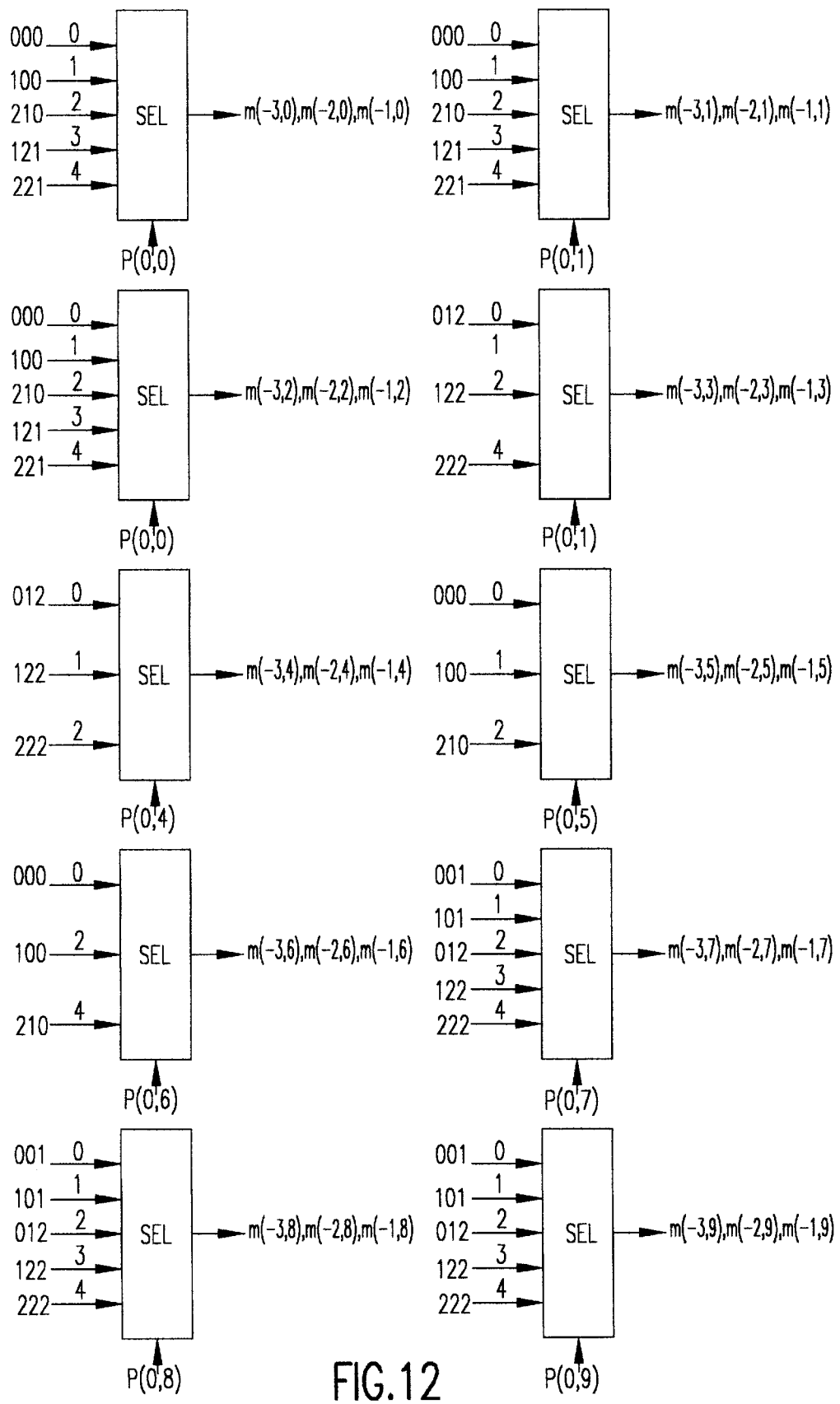
FIG. 12 is a block diagram showing an example of composition of Main-RAM address generating circuit.

FIG. 12 shows an example of composition of the Main-RAM address generating circuit 67. The Main-RAM address generating circuit 67 comprises selectors SEL corresponding one to one to states 0 to 9. Data to be selected by the selections are 3-clock DF data to reach the respective states. The selectors select any one of them according to the survival path informations P(0) to P(9) output from the comparison and selection circuit 61, then outputting m(−3, 0), m(−2,0), m(−1,0), ..., m(−3,9), m(−2,9), m(−1,9). From FIG. 5, the following algorithm is given.

In state 0, when $P(0, 0) = 0, m(-3, 0) = 0, m(-2, 0) = 0, m(-1, 0) = 0$ when $P(0, 0) = 1, m(-3, 0) = 1, m(-2, 0) = 0, m(-1, 0) = 0$ when $P(0, 0) = 2, m(-3, 0) = 2, m(-2, 0) = 1, m(-1, 0) = 0$ when $P(0, 0) = 3, m(-3, 0) = 1, m(-2, 0) = 2, m(-1, 0) = 1$ when $P(0, 0) = 4, m(-3, 0) = 2, m(-2, 0) = 2, m(-1, 0) = 1$ In state 1, when $P(0, 1) = 0, m(-3, 1) = 0, m(-2, 1) = 0, m(-1, 1) = 0$ when $P(0, 1) = 1, m(-3, 1) = 1, m(-2, 1) = 0, m(-1, 1) = 0$ when $P(0, 1) = 2, m(-3, 1) = 2, m(-2, 1) = 1, m(-1, 1) = 0$ when $P(0, 1) = 3, m(-3, 1) = 1, m(-2, 1) = 2, m(-1, 1) = 1$ when $P(0, 1) = 4, m(-3, 1) = 2, m(-2, 1) = 2, m(-1, 1) = 1$ In state 2, when $P(0, 2) = 0, m(-3, 2) = 0, m(-2, 2) = 0, m(-1, 2) = 0$ when $P(0, 2) = 1, m(-3, 2) = 1, m(-2, 2) = 0, m(-1, 2) = 0$ when $P(0, 2) = 2, m(-3, 2) = 2, m(-2, 2) = 1, m(-1, 2) = 0$ when $P(0, 2) = 3, m(-3, 2) = 1, m(-2, 2) = 2, m(-1, 2) = 1$ when $P(0, 2) = 4, m(-3, 2) = 2, m(-2, 2) = 2, m(-1, 2) = 1$ In state 3, when $P(0, 3) = 0, m(-3, 3) = 0, m(-2, 3) = 1, m(-1, 3) = 2$ when $P(0, 3) = 1, m(-3, 3) = 1, m(-2, 3) = 2, m(-1, 3) = 2$ -continued when $P(0, 3) = 2, m(-3, 3) = 2, m(-2, 3) = 2, m(-1, 3) = 2$ In state 4, when $P(0, 4) = 0, m(-3, 4) = 0, m(-2, 4) = 1, m(-1, 4) = 2$ when $P(0, 4) = 1, m(-3, 4) = 1, m(-2, 4) = 2, m(-1, 4) = 2$ when $P(0, 4) = 2, m(-3, 4) = 2, m(-2, 4) = 2, m(-1, 4) = 2$ In state 5, when $P(0, 5) = 0, m(-3, 5) = 0, m(-2, 5) = 0, m(-1, 5) = 0$ when $P(0, 5) = 1, m(-3, 5) = 1, m(-2, 5) = 0, m(-1, 5) = 0$ when $P(0, 5) = 2, m(-3, 5) = 2, m(-2, 5) = 1, m(-1, 5) = 0$ In state 6, when $P(0, 6) = 0, m(-3, 6) = 0, m(-2, 6) = 0, m(-1, 6) = 0$ when $P(0, 6) = 1, m(-3, 6) = 1, m(-2, 6) = 0, m(-1, 6) = 0$ when $P(0, 6) = 2, m(-3, 6) = 2, m(-2, 6) = 1, m(-1, 6) = 0$ In state 7, when $P(0, 7) = 0, m(-3, 7) = 0, m(-2, 7) = 0, m(-1, 7) = 1$ when $P(0, 7) = 1, m(-3, 7) = 1, m(-2, 7) = 0, m(-1, 7) = 1$ when $P(0, 7) = 2, m(-3, 7) = 0, m(-2, 7) = 1, m(-1, 7) = 2$ when $P(0, 7) = 3, m(-3, 7) = 1, m(-2, 7) = 2, m(-1, 7) = 2$ when $P(0, 7) = 4, m(-3, 7) = 2, m(-2, 7) = 2, m(-1, 7) = 2$ In state 8, when $P(0, 8) = 0, m(-3, 8) = 0, m(-2, 8) = 0, m(-1, 8) = 1$ when $P(0, 8) = 1, m(-3, 8) = 1, m(-2, 8) = 0, m(-1, 8) = 1$ when $P(0, 8) = 2, m(-3, 8) = 0, m(-2, 8) = 1, m(-1, 8) = 2$ when $P(0, 8) = 3, m(-3, 8) = 1, m(-2, 8) = 2, m(-1, 8) = 2$ when $P(0, 8) = 4, m(-3, 8) = 2, m(-2, 8) = 2, m(-1, 8) = 2$ In state 9, when $P(0, 9) = 0, m(-3, 9) = 0, m(-2, 9) = 0, m(-1, 9) = 1$ when $P(0, 9) = 1, m(-3, 9) = 1, m(-2, 9) = 0, m(-1, 9) = 1$ when $P(0, 9) = 2, m(-3, 9) = 0, m(-2, 9) = 1, m(-1, 9) = 2$ when $P(0, 9) = 3, m(-3, 9) = 1, m(-2, 9) = 2, m(-1, 9) = 2$ when $P(0, 9) = 4, m(-3, 9) = 2, m(-2, 9) = 2, m(-1, 9) = 2$ (3-4) Path Memory Circuit 62

Figure 13:
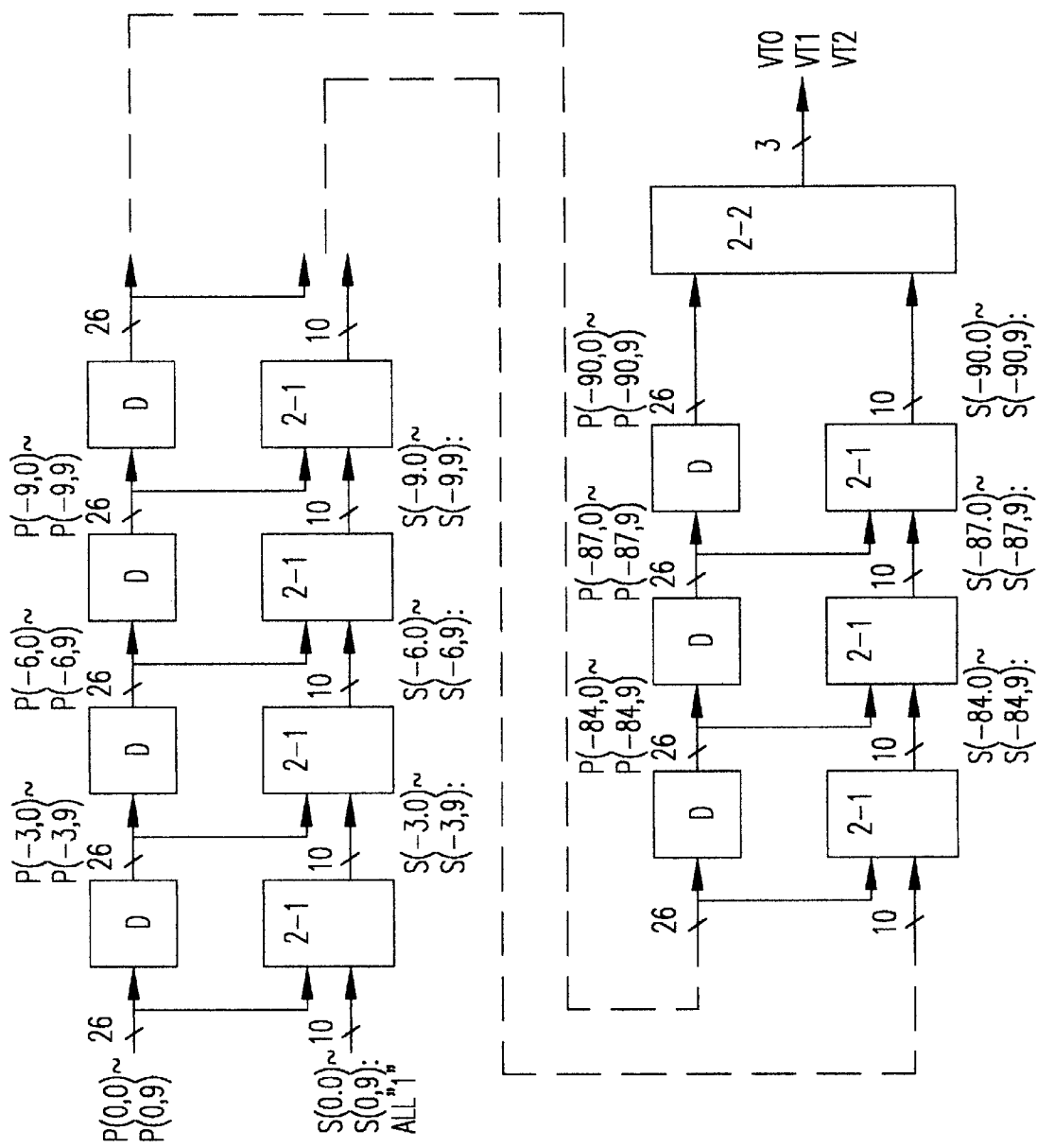
FIG. 13 is a block diagram showing an example of composition of a path memory circuit.

FIG. 13 shows an example of composition of the path memory circuit 62. The path memory circuit 62 includes data latches for storing over tens of stages the survival path informations P(0,0) to P(0,9) output from the comparison and selection circuit 61. The current data are input to the left, and, the further to the right they exist, the older data they are. In this embodiment, as it operates by the 3 clocks, survival path information output from the first data latch D, P(−3,0) to P(−3,9), is 3 clocks older than survival path informations P(0,0) to P(0,9) output from the comparison and selection circuit 61. In like manner, survival path information output from the second or higher-stage data latch D is 3 clocks older than survival path information output from a data latch just before the stage. In the example of FIG. 13, it stores until 90 clocks before survival path informations P(−90,0) to P(−90, 9).

State calculation blocks 2-1 provided for each stage calculate whether there is a probability of reaching the state at respective times as to states 0 to 9 or not. The calculation results are transmitted as 10-bit survival state information S to show the probability of whether to reach the state as to each of states 0 to 9. Each bit corresponding to each of states 0 to 9 in survival state information S is "1" when there is a probability of reaching the state, and is "0" there is no probability of reaching the state. Also, the 10-bit survival state informations at time n are represented by S(n,0) to S(n,9). To the first state calculation block 2-1, survival state informations S(0,0) to S(0,9) with the initial values of all "1" are given. The first state calculation block 2-1 calculates survival state informations S(−3,0) to S(−3,9) from the initial survival state informations S(0,0) to S(0,9) and the survival path informations P(0,0) to P(0,9) output from the comparison and selection circuit 61, then outputting them to the second state calculation block 2-1. Then, the second state calculation block 2-1 calculates new survival state informations S(−6,0) to S(−6,9) from the survival state informations S(−3,0) to S(−3,9) output from the first state calculation block 2-1 and the survival path informations P(−3,0) to P(−3,9) output from the first data latch D, then outputting them to the post-stage state calculation block 2-1. In like manner, the third or higher-stage state calculation blocks 2-1 are operated.

The outputs from the last data latch D and state calculation clock 2-1, i.e., survival path informations P(−90,0) to P(−90,9) and survival state informations S(−90,0) to S(−90, 9), are supplied to an output calculation block 2-2. The output calculation block 2-2 determines outputs VT0 to VT2 based on these informations.

The state calculation block 2-1 and output calculation block 2-2 will be detailed below.

[state calculation block 2-1]

First, the reaction between survival state information and survival path information at each one clock will be explained referring to FIG. 3. At time n+2, there are probabilities to reach all states 0 to 9. Thus, the survival state informations S(n+2,0) to S(n+2,9) are all "1". Then, as paths to reach the states, i.e., arrows, are selected 'down', 'down', 'up' for states 0 to 2 in the order and are selected 'down', 'up', 'down' for states 7 to 9 in the order, the survival path informations P(n+2,0) to P(n+2,2) and P(n+2,7) to P(n+2,9) are shown "110101" in the order.

At time n+1, looking from time n+2, there are probabilities to reach states 1, 2, 3, 6, 7, 8 and 9 and there is no probability to reach states 0, 4 and 5. Thus, the survival state informations S(n+1,0) to S(n+1,9) are "0111001111" in the order. Then, as paths to reach the states, i.e., arrows, are selected 'up', 'down', 'down' for states 0 to 2 in the order and are selected 'up', 'down', 'down' for states 7 to 9 in the order, the survival path information P(n+1,0) to P(n+1,2) and P(n+1,7) to P(n+1,9) are shown "011011" in the order.

At time n, looking from time n+1, there are probabilities to reach states 0, 2, 3, 4, 5, 7 and 9 and there is no probability to reach states 1, 6 and 8, but, looking from time n+2, there are probabilities to reach states 2, 3, 4, 5, 7 and 9 and there is no probability to reach states 0, 1, 6 and 8. Thus, the survival state informations S(n+1,0) to S(n+1,9) are "0011110101" in the order.

These relations are represented by the expression (6):

$$S(n, 0) = [S(n + 1, 0) \&\& \overline{P(n + 1, 0)}] || [S(n + 1, 1) \&\& \overline{P(n + 1, 1)}] \quad (6)$$

$$S(n, 1) = S(n + 1, 2) \&\& \overline{P(n + 1, 2)}$$

$$S(n, 2) = S(n + 1, 5) || S(n + 1, 6)$$

-continued $S(n, 3) = [S(n + 1, 0) \&\& P(n + 1, 0)] || [S(n + 1, 1) \&\& P(n + 1, 1)]$ $S(n, 4) = S(n + 1, 2) \&\& P(n + 1, 2)$ $S(n, 5) = S(n + 1, 7) \&\& \overline{P(n + 1, 7)}$ $S(n, 6) = [S(n + 1, 0) \&\& \overline{P(n + 1, 0)}] || [S(n + 1, 9) \&\& \overline{P(n + 1, 9)}]$ $S(n, 7) = S(n + 1, 3) || S(n + 1, 4)$ $S(n, 8) = S(n + 1, 7) \&\& P(n + 1, 7)$ $S(n, 9) = [S(n + 1, 8) \&\& P(n + 1, 8)] || [S(n + 1, 9) \&\& P(n + 1, 9)]$ In this embodiment, as one operation is conducted by the 3 clocks, the actual state calculation block 2-1 calculates like the following expression (7):

When $P(n, 0) = 0$ and $S(n, 0) = 1$, or (7-1)
When $P(n, 1) = 0$ and $S(n, 1) = 1$, or
When $P(n, 2) = 0$ and $S(n, 2) = 1$, or
When $P(n, 5) = 0$ and $S(n, 5) = 1$, or
When $P(n, 6) = 0$ and $S(n, 6) = 1$,
$S(n - 3, 0) = 1$
In the other case, $S(n - 3, 0) = 0$ When $P(n, 7) = 0$ and $S(n, 7) = 1$, or (7-2)
When $P(n, 8) = 0$ and $S(n, 8) = 1$, or
When $P(n, 9) = 0$ and $S(n, 9) = 1$,
$S(n - 3, 1) = 1$
In the other case, $S(n - 3, 1) = 0$ When $P(n, 3) = 0$ and $S(n, 3) = 1$, or (7-3)
When $P(n, 4) = 0$ and $S(n, 4) = 1$, or
When $P(n, 7) = 2$ and $S(n, 7) = 1$, or
When $P(n, 8) = 2$ and $S(n, 8) = 1$, or
When $P(n, 9) = 2$ and $S(n, 9) = 1$,
$S(n - 3, 2) = 1$
In the other case, $S(n - 3, 2) = 0$ When $P(n, 0) = 1$ and $S(n, 0) = 1$, or (7-4)
When $P(n, 1) = 1$ and $S(n, 1) = 1$, or
When $P(n, 2) = 1$ and $S(n, 2) = 1$, or
When $P(n, 5) = 1$ and $S(n, 5) = 1$, or
When $P(n, 6) = 1$ and $S(n, 6) = 1$,
$S(n - 3, 3) = 1$
In the other case, $S(n - 3, 3) = 0$ When $P(n, 7) = 1$ and $S(n, 7) = 1$, or (7-5)
When $P(n, 8) = 1$ and $S(n, 8) = 1$, or
When $P(n, 9) = 1$ and $S(n, 9) = 1$,
$S(n - 3, 4) = 1$
In the other case, $S(n - 3, 4) = 0$ When $P(n, 0) = 3$ and $S(n, 0) = 1$, or (7-6)
When $P(n, 1) = 3$ and $S(n, 1) = 1$, or
When $P(n, 2) = 3$ and $S(n, 2) = 1$,
$S(n - 3, 5) = 1$
In the other case, $S(n - 3, 5) = 0$ When $P(n, 3) = 1$ and $S(n, 3) = 1$, or (7-7)
When $P(n, 4) = 1$ and $S(n, 4) = 1$, or
When $P(n, 7) = 3$ and $S(n, 7) = 1$, or
When $P(n, 8) = 3$ and $S(n, 8) = 1$, or
When $P(n, 9) = 3$ and $S(n, 9) = 1$,
$S(n - 3, 6) = 1$
In the other case, $S(n - 3, 6) = 0$ When $P(n, 0) = 2$ and $S(n, 0) = 1$, or (7-8)
When $P(n, 1) = 2$ and $S(n, 1) = 1$, or
When $P(n, 2) = 2$ and $S(n, 2) = 1$, or
When $P(n, 5) = 2$ and $S(n, 5) = 1$, or
When $P(n, 6) = 2$ and $S(n, 6) = 1$,
$S(n - 3, 7) = 1$
In the other case, $S(n - 3, 7) = 0$ When $P(n, 0) = 4$ and $S(n, 0) = 1$, or (7-9)
When $P(n, 1) = 4$ and $S(n, 1) = 1$, or
When $P(n, 2) = 4$ and $S(n, 2) = 1$,
$S(n - 3, 8) = 1$
In the other case, $S(n - 3, 8) = 0$ When $P(n, 3) = 2$ and $S(n, 3) = 1$, or (7-10)
When $P(n, 4) = 2$ and $S(n, 4) = 1$, or
When $P(n, 7) = 4$ and $S(n, 7) = 1$, or
When $P(n, 8) = 4$ and $S(n, 8) = 1$, or
When $P(n, 9) = 4$ and $S(n, 9) = 1$,
$S(n - 3, 9) = 1$ In the other case, $S(n - 3, 9) = 0$ (7)

Figure 14:
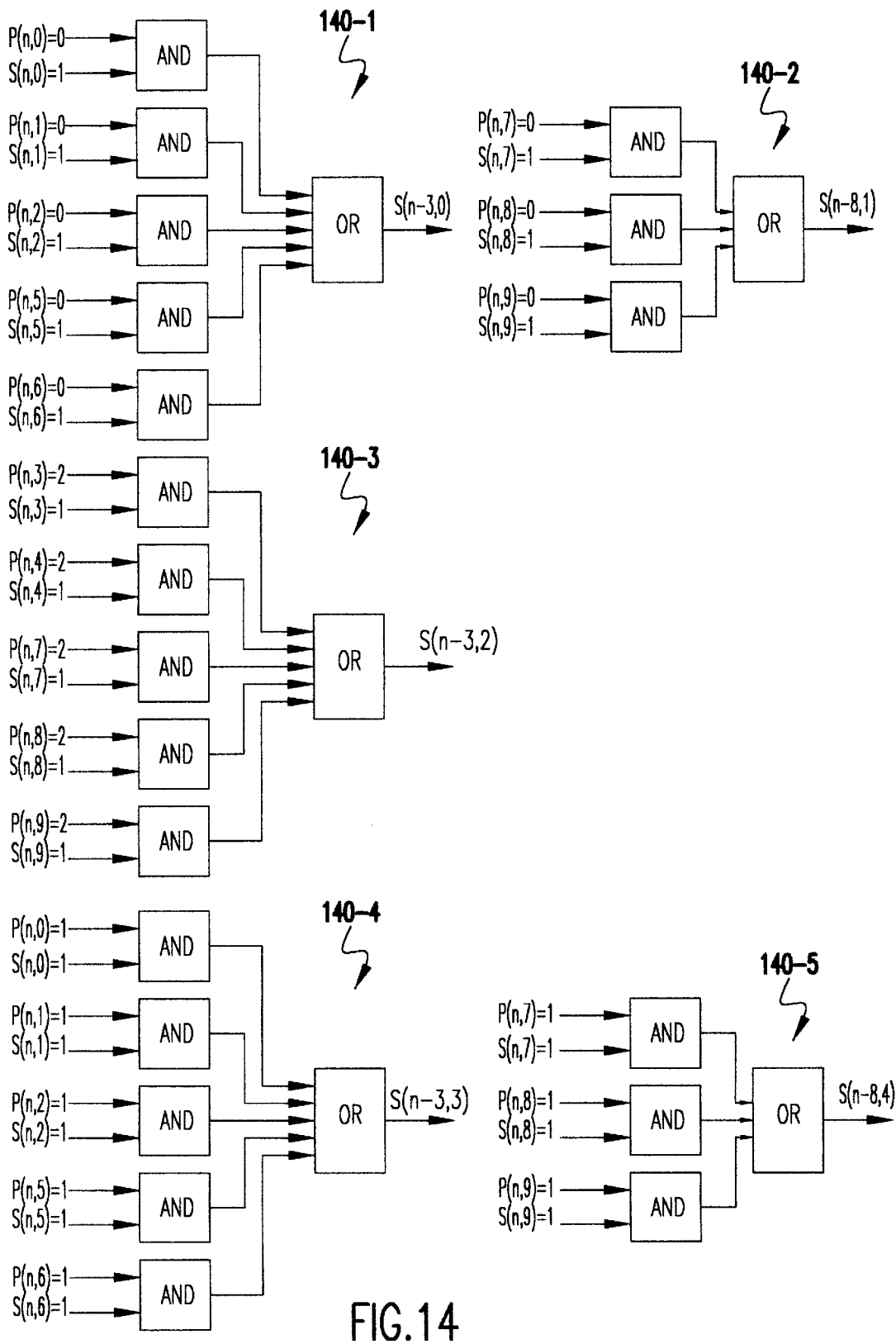
FIGS. 14 and 15 are block diagrams showing an example of composition of a state calculation block in the path memory circuit.
Figure 15:
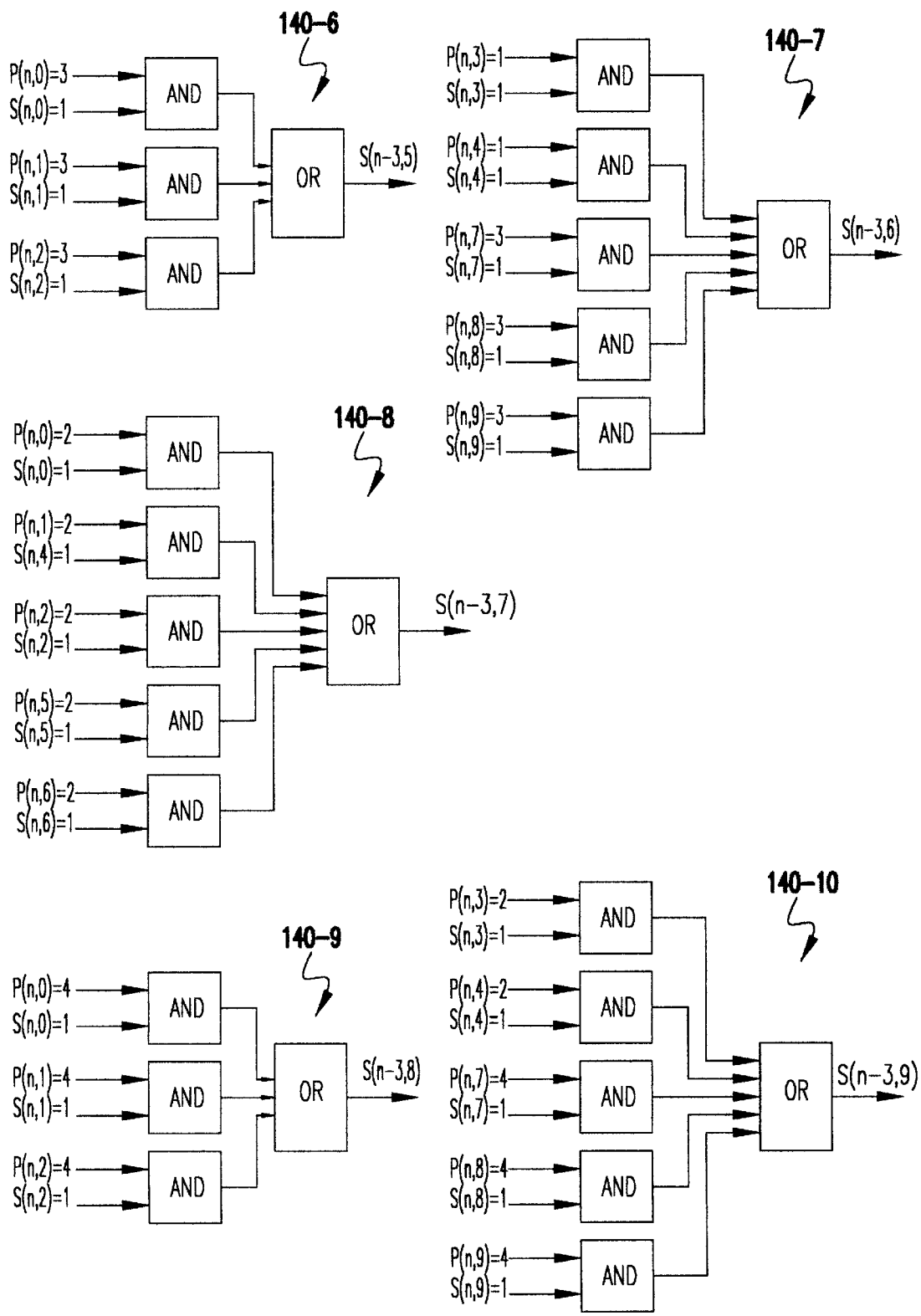

FIGS. 14 and 15 show an example of composition of the state calculation block 2-1. Meanwhile, for the convenience of drawing the figures, the composition of the state calculation block 2-1 is divided into FIGS. 14 and 15. All the state calculation blocks 2-1 have the same composition, which includes ten calculators 140-1 to 140-10. Each calculator comprises several AND circuits and one OR circuit. The calculator 140-i (i=1 to 10) calculates expression ((7-i) included in the above expression (7).

[output calculation block 2-2]

Figure 16:
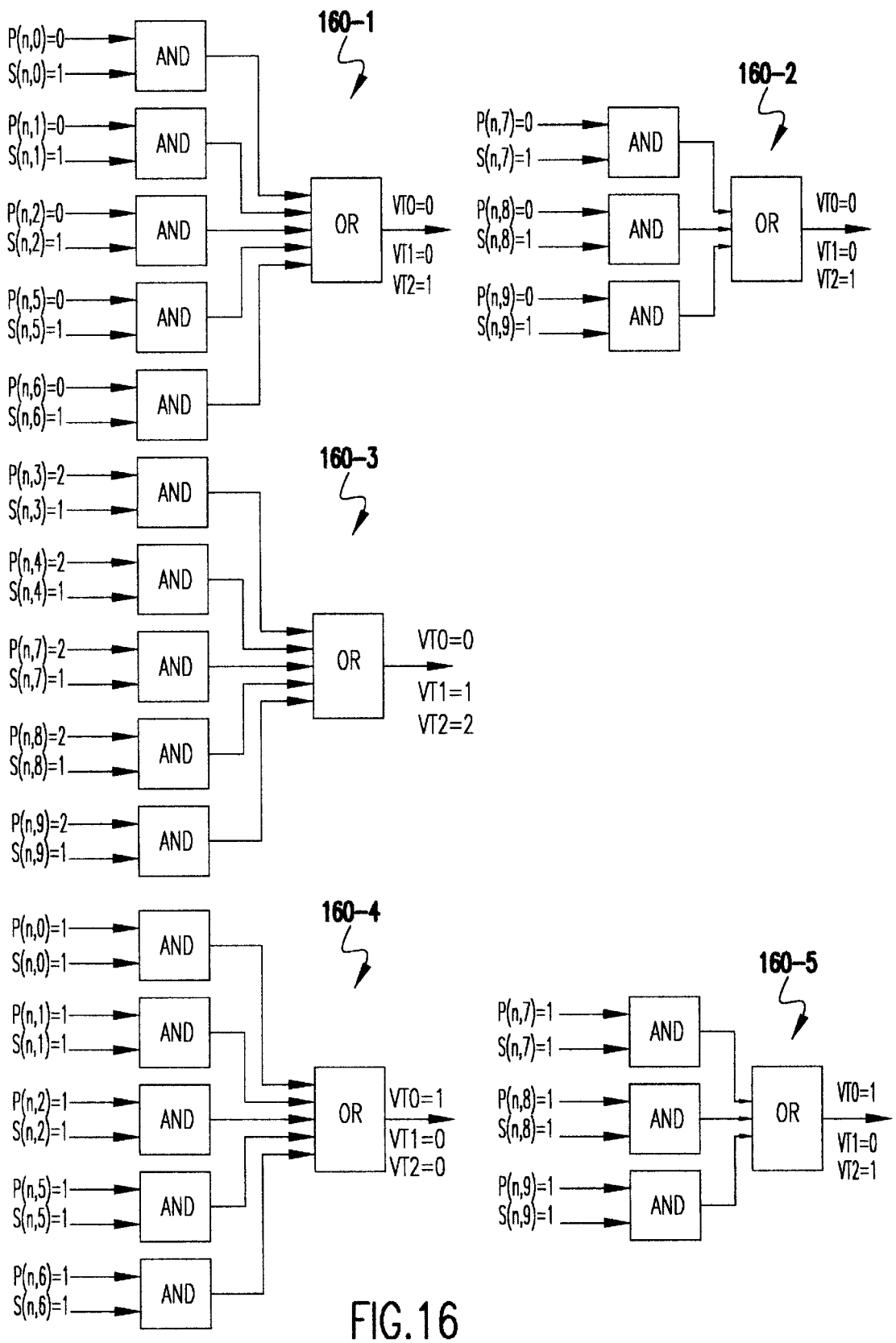
FIGS. 16 and 17 are block diagrams showing an example of composition of an output calculation block in the path memory circuit.
Figure 17:
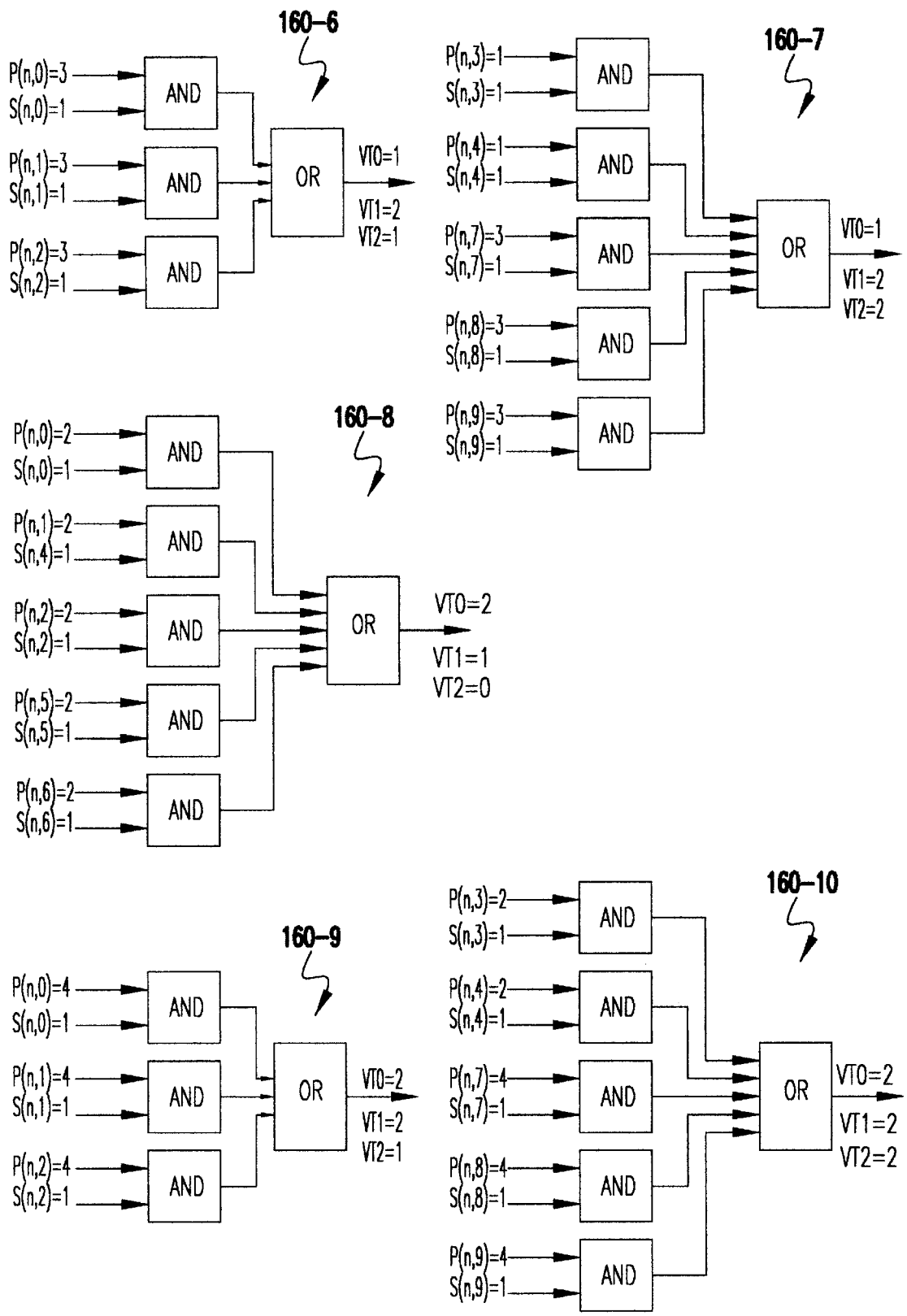
Figure 18:
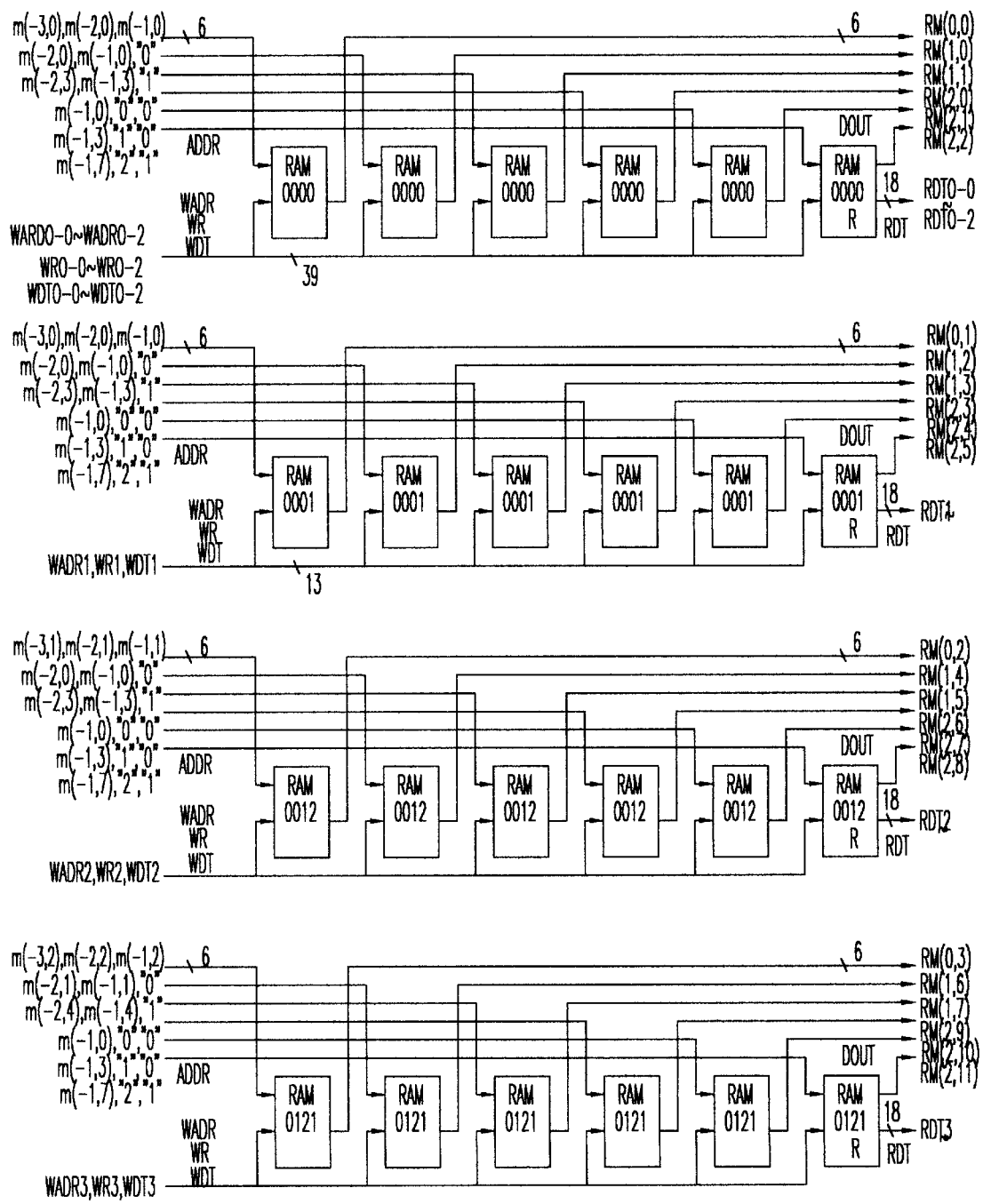
FIGS. 18 to 21 are block diagrams showing an example of composition of Main-RAM.
Figure 19:
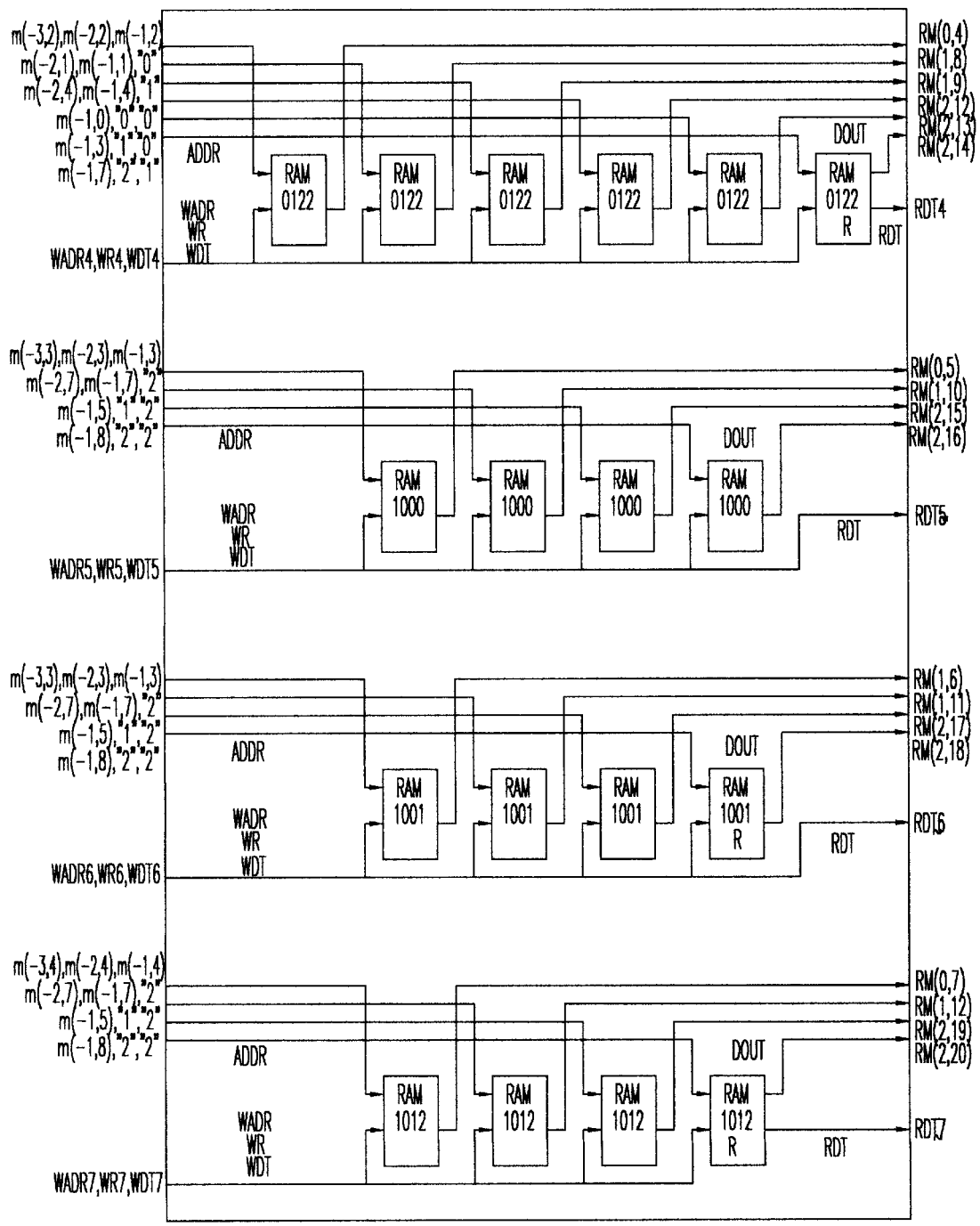
Figure 20:
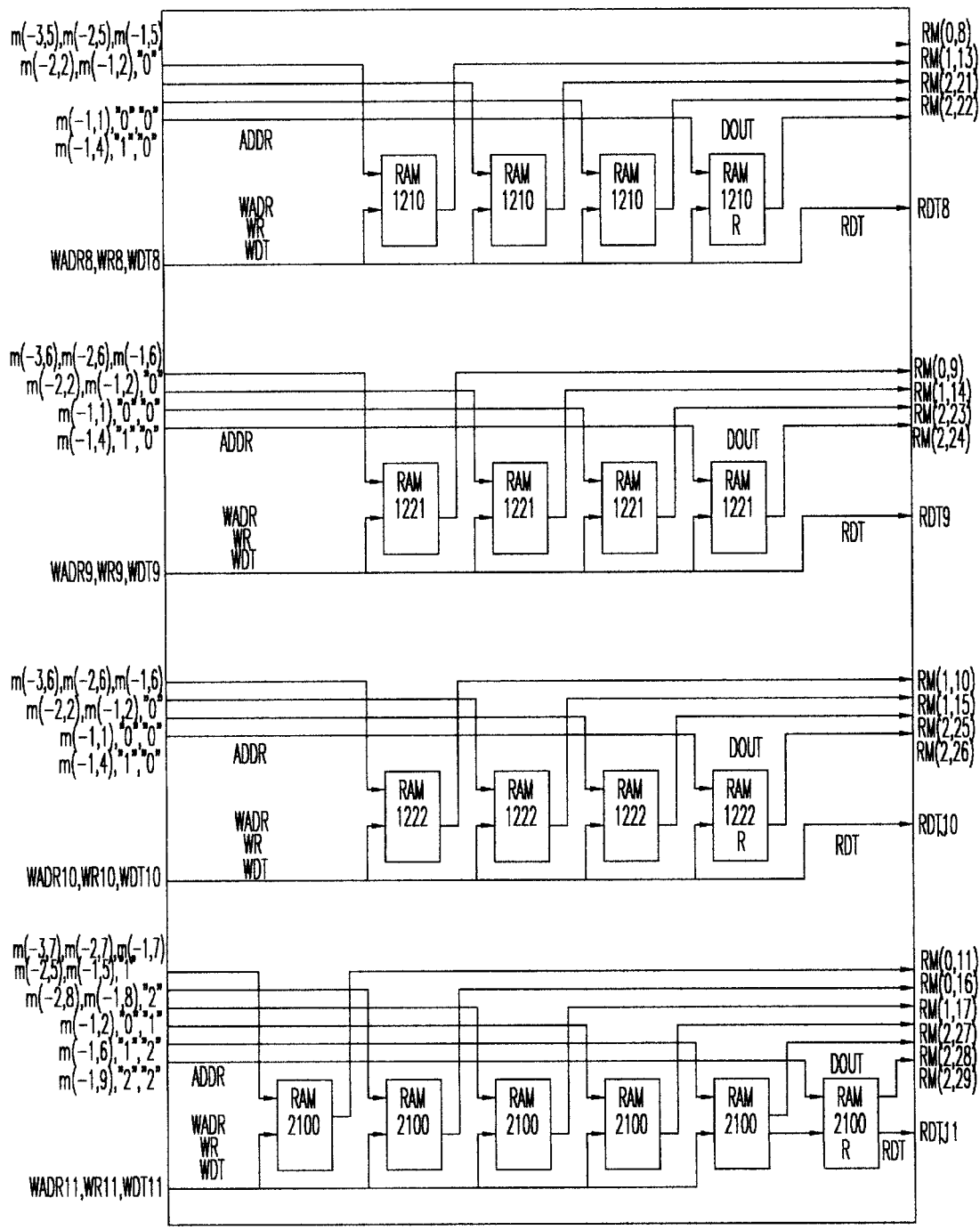
Figure 21:
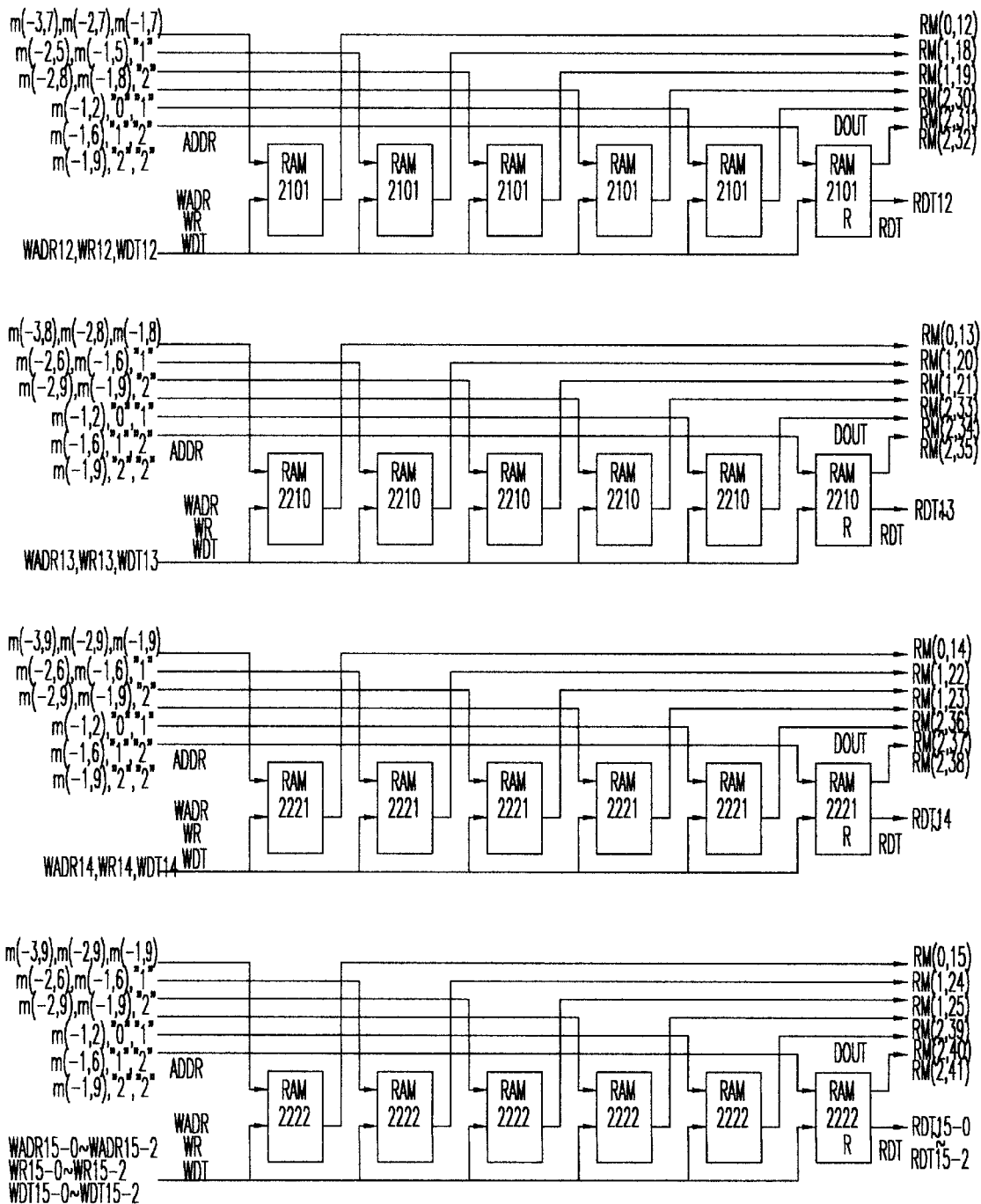

FIGS. 16 and 17 show an example of composition of the output calculation block 2-2. Meanwhile, for the convenience of drawing the figures, the composition of the output calculation block 2-2 is divided into FIGS. 16 and 17. As shown, the output calculation block 2-2 includes ten calculators 160-1 to 160-10. Each calculator comprises several AND circuits and one OR circuit. When survival path informations P(n,0) to P(n,9) and survival state informations S(n,0) to S(n,9) are supplied to the output calculation block 2-, the calculator 160-i (i=1 to 10) conducts the judging of conditions like ((7-i) in expression (7), outputting a 3-clock final output as next:

When only condition (7-1) is satisfied, the ternary output is VT0=0, VT1=0 and VT2=0, When only condition (7-2) is satisfied, the ternary output is VT0=0, VT1=0 and VT2=1, When only condition (7-3) is satisfied, the ternary output is VT0=0, VT1=1 and VT2=2, When only condition (7-4) is satisfied, the ternary output is VT0=1, VT1=0 and VT2=0, When only condition (7-5) is satisfied, the ternary output is VT0=1, VT1=0 and VT2=1, When only condition (7-6) is satisfied, the ternary output is VT0=1, VT1=2 and VT2=1, When only condition (7-7) is satisfied, the ternary output is VT0=1, VT1=2 and VT2=2, When only condition (7-8) is satisfied, the ternary output is VT0=2, VT1=1 VT2=0, When only condition (7-9) is satisfied, the ternary output is VT0=2, VT1=2 and VT2=1, and When only condition (7-10) is satisfied, the ternary output is VT0=2, VT1=2 and VT2=2.

It is impossible that all the above conditions are unsatisfied.

When two or more conditions are satisfied, condition with younger number is prior to the other condition.

Also, a binary final output of "1" is given to the ternary output "0" or "2" and a binary final output of "1" is given to the ternary output "1".

(3-5) Main RAM 63

FIGS. 18, 19, 20 and 21 show an example of composition of the path memory circuit 62. Meanwhile, for the convenience of drawing the figures, the composition of Main-RAM 63 is divided into FIGS. 18 to 21.

RAM0000 is RAM for storing estimate input data (estimate data) for 7-clock estimate data which includes 4-clock Viterbi data "0000". There is included a memory chip for 5 kinds of DF data (000, 100, 210, 121, 221) in each block. 6 blocks are included therein, corresponding to RM(0,0), RM(1,0), RM(1,1), RM(2,0), RM(2,1) and RM(2, 2), respectively, from the left side.

RAM0001 is RAM for storing estimate input data (estimate data) for 7-clock estimate data which includes 4-clock Viterbi data "0001". There is included a memory chip for 5 kinds of DF data (000, 100, 210, 121, 221) in each block. 6 blocks are included therein, corresponding to RM(0,1), RM(1,2), RM(1,3), RM(2,3), RM(2,4) and RM(2, 5), respectively, from the left side.

RAM0012 is RAM for storing estimate input data (estimate data) for 7-clock estimate data which includes 4-clock Viterbi data "0012". There is included a memory chip for 5 kinds of DF data (000, 100, 210, 121, 221) in each block. 6 blocks are included therein, corresponding to RM(0,2), RM(1,4), RM(1,5), RM(2,6), RM(2,7) and RM(2, 8), respectively, from the left side.

RAM0121 is RAM for storing estimate input data (estimate data) for 7-clock estimate data which includes 4-clock Viterbi data "0121". There is included a memory chip for 5 kinds of DF data (000, 100, 210, 121, 221) in each block. 6 blocks are included therein, corresponding to RM(0,3), RM(1,6), RM(1,7), RM(2,9), RM(2,10) and RM(2,11), respectively, from the left side.

RAM0122 is RAM for storing estimate input data (estimate data) for 7-clock estimate data which includes 4-clock Viterbi data "0122". There is included a memory chip for 5 kinds of DF data (000, 100, 210, 121, 221) in each block. 6 blocks are included therein, corresponding to RM(0,4), RM(1,8), RM(1,9), RM(2,12), RM(2,13) and RM(2,14), respectively, from the left side.

RAM1000 is RAM for storing estimate input data (estimate data) for 7-clock estimate data which includes 4-clock Viterbi data "1000". There is included a memory chip for 3 kinds of DF data (012, 122, 222) in each block. 4 blocks are included therein, corresponding to RM(0,5), RM(1,10), RM(2,15), and RM(2,16), respectively, from the left side.

RAM1001 is RAM for storing estimate input data (estimate data) for 7-clock estimate data which includes 4-clock Viterbi data "1001". There is included a memory chip for 3 kinds of DF data (012, 122, 222) in each block. 4 blocks are included therein, corresponding to RM(0,6), RM(1,11), RM(2,17), and RM(2,18), respectively, from the left side.

RAM1210 is RAM for storing estimate input data (estimate data) for 7-clock estimate data which includes 4-clock Viterbi data "1210". There is included a memory chip for 3 kinds of DF data (000, 100, 210) in each block. 4 blocks are included therein, corresponding to RM(0,8), RM(1,13), RM(2,21), and RM(2,22), respectively, from the left side.

RAM1221 is RAM for storing estimate input data (estimate data) for 7-clock estimate data which includes 4-clock Viterbi data "1221". There is included a memory chip for 3 kinds of DF data (000, 100, 210) in each block. 4 blocks are included therein, corresponding to RM(0,9), RM(1,14), RM(2,23), and RM(2,24), respectively, from the left side.

RAM1222 is RAM for storing estimate input data (estimate data) for 7-clock estimate data which includes 4-clock Viterbi data "1222". There is included a memory chip for 3 kinds of DF data (000, 100, 210) in each block. 4 blocks are included therein, corresponding to RM(0,10), RM(1,15), RM(2,25), and RM(2,26), respectively, from the left side.

RAM2100 is RAM for storing estimate input data (estimate data) for 7-clock estimate data which includes 4-clock Viterbi data "2100". There is included a memory chip for 5 kinds of DF data (001, 101, 012, 122, 222) in each block. 6 blocks are included therein, corresponding to RM(0,11), RM(1,16), RM(1,17), RM(2,27), RM(2,28) and RM(2,29), respectively, from the left side.

RAM2101 is RAM for storing estimate input data (estimate data) for 7-clock estimate data which includes 4-clock Viterbi data "2101". There is included a memory chip for 5 kinds of DF data (001, 101, 012, 122, 222) in each block. 6 blocks are included therein, corresponding to RM(0,12), RM(1,18), RM(1,19), RM(2,30), RM(2,31) and RM(2,32), respectively, from the left side.

RAM2210 is RAM for storing estimate input data (estimate data) for 7-clock estimate data which includes 4-clock Viterbi data "2210". There is included a memory chip for 5 kinds of DF data (001, 101, 012, 122, 222) in each block. 6 blocks are included therein, corresponding to RM(0,13), RM(1,20), RM(1,21), RM(2,33), RM(2,34) and RM(2,35), respectively, from the left side.

RAM2221 is RAM for storing estimate input data (estimate data) for 7-clock estimate data which includes 4-clock Viterbi data "2221". There is included a memory chip for 5 kinds of DF data (001, 101, 012, 122, 222) in each block. 6 blocks are included therein, corresponding to RM(0,14), RM(1,22), RM(1,23), RM(2,37) and RM(2,38), respectively, from the left side.

RAM2222 is RAM for storing estimate input data (estimate data) for 7-clock estimate data which includes 4-clock viterbi data "2222". There is included a memory chip for 5 kinds of DF data (001, 101, 012, 122, 222) in each block. 6 blocks are included therein, corresponding to RM(0,15), RM(1,24), RM(1,25), RM(2,39), RM(2,40) and RM(2,41), respectively, from the left side.

The respective RAMs output the estimate input data as RM(0,0) to RM(0,15), RM(1,0) to RM(1,25) and RM(2.0) to RM(2.41) simultaneously to the subtraction absolute value circuit 60 by using the 3-clock DF data as addresses to be input to ADDR. Meanwhile, in FIGS. 18 to 21, m(−3,0) to m(−3,9), m(−2,0) to m(−2,9) and m(−1.0) to m(−1,9) are outputs from the Main-RAM address generating circuit 67, and "0", "1" and "2" are fixed values predetermined by Main-RAM 63.

For example, RAM0000 will be explained.

For RM(0,0), as it reaches time n/state 0, 3-clock DF data are m(−3,0), m(−2,0) and m(−1,0).

For RM(1,0), as it reaches time n+1 /state 0through time n/state 0, the top 2 clocks of DF data are m(−2,0) and m(−1,0) and the last clock of DF data is "0" as state 0 shows "0".

For RM(1,1), as it reaches time n+1/state 0 through time n/state 3, the top 2 clocks of DF data are m(−2,3) and m(−1,3) and the last clock of DF data is "1" as state 3 shows "1".

For RM(2,0), as it reaches time n+2/state 0 through time n/state 0, time n+1/state 0, the top clock of DF data is m(−1,0) and the last 2 clocks of DF data are "0", "0" as state 0 show "0", "0".

For RM(2,1), as it reaches time n+2/state 0 through time n/state 3, time n+1/state 0, the top clock of DF data is m(−1,3) and the last 2 clocks of DF data are "1", "0" as state 3, state 0 show "1", "0".

For RM(2,2), as it reaches time n+2/state 0 through time n/state 7, time n+1/state 3, the top clock of DF data is m(−1,7) and the last 2 clocks of DF data are "2", "1" as state 7, state 3 show "2", "1".

In like manner, DF data used as addresses can be calculated as to RAM0001 to RAM2222.

Also, Main-RAM 63 in this embodiment conducts the data correction by outputting RDT output corresponding to correction address NADR from the rightest block to the correction control circuit 65, and by writing correction data WDT to be input synchronizing with write-enable WR as new data when the correction is conducted. Namely, RAM0000R serves to output, as RDT, estimate input data corresponding to correction address WADR sent from the correction control circuit 65, to the correction control circuit 65. This is because all the 6 blocks store the same estimate input data and therefore RAM0000R has only to output it. Also, correction data WDT are input synchronizing with write-enable WR from the correction control circuit 65 when conducting the correction, and then estimate input data is RAM0000 and RAM0000R corresponding to the correction address WADR are renewed. In like manner, RAM0001 to RAM2222 other than RAM0000 are operated.

Examples of the compositions of the RAM blocks will be explained below.

[RAM0001, RAM0012, RAM0121, RAM0122]

Figure 22:
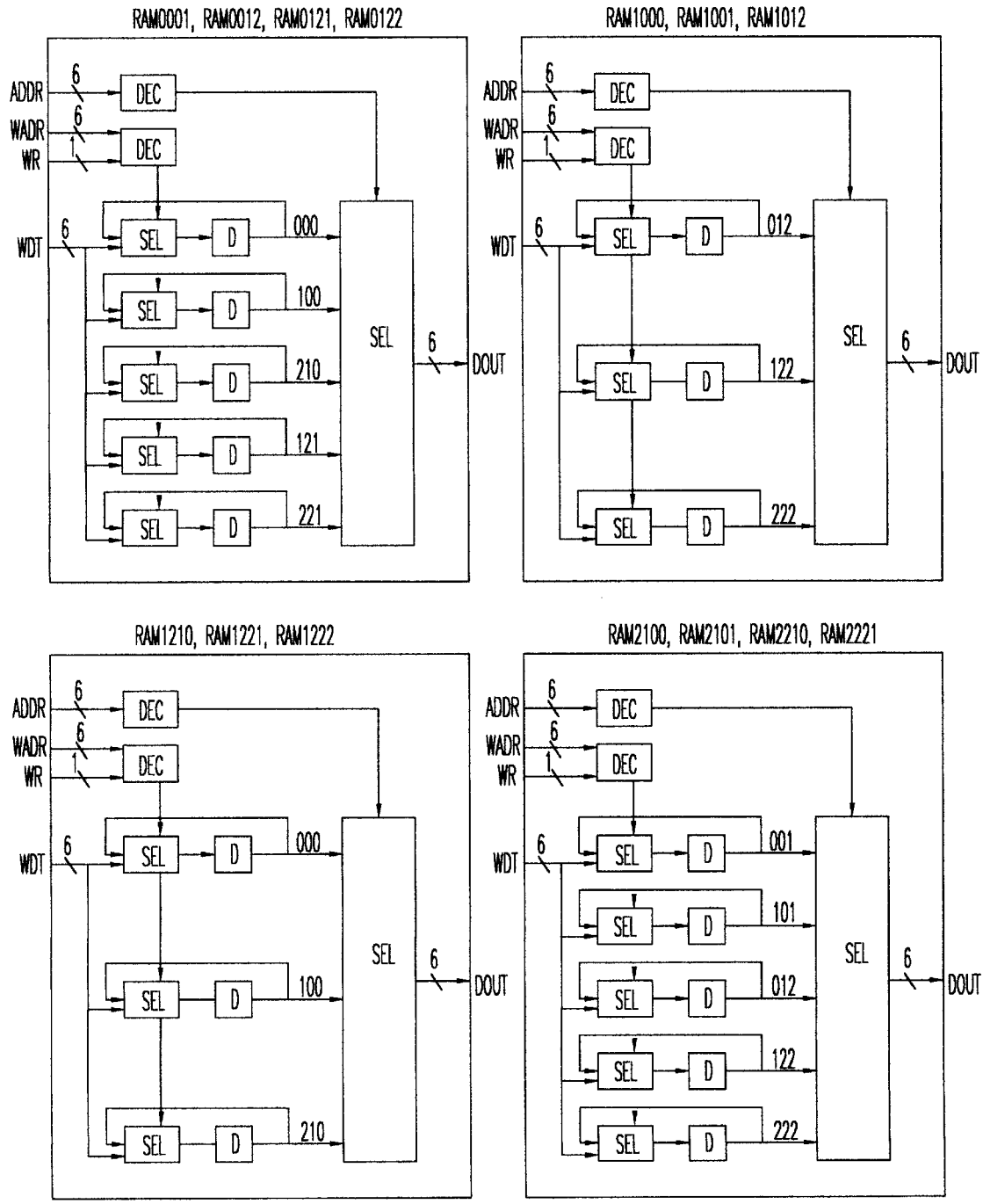
FIGS. 22 to 25 are block diagrams showing examples of composition of the respective RAM blocks in Main-RAM.

These RAM blocks, as shown in FIG. 22, comprise 5 memory elements (e.g., D-flip-flop) D each of which stores one estimate input data, a decoder Dec for decoding the ADDR input, a selector SEL for selecting one output of the memory elements as Dout according to the decoding result, a decoder Dec for decoding WADR and WR and selectors SEL corresponding to the memory elements for rewriting the contents of the memory element D by the output of memory element D or WDT according to the decoding result. In operation, DF data is selected from 000, 100, 210, 121 and 221 by ADDR input, and estimate data corresponding to the selected DF data is output as Dout to the subtraction absolute value circuit 60. Also, when the correction is needed, the memory element D to need the correction is judged by WADR and WR, and then rewritten by WDT data.

[RAM1000, RAM1001, RAM1012]

These RAM blocks, as shown in FIG. 22, comprise 3 memory elements (e.g., D-flip-flop) D each of which stores one estimate input data, a decoder Dec for decoding the ADDR input, a selector SEL for selecting one output of the memory elements as Dout according to the decoding result, a decoder Dec for decoding WADR and WR and selectors SEL corresponding to the memory elements for rewriting the contents of the memory element D by the output of memory element D or WDT according to the decoding result. In operation, DF data is selected from 012, 122 and 222 by ADDR input, and estimate data corresponding to the selected DF data is output as Dout to the subtraction absolute value circuit 60. Also, when the correction is needed, the memory element D to need the correction is judged by WADR and WR, and then rewritten by WDT data.

[RAM1210, RAM1221, RAM1222]

These RAM blocks, as shown in FIG. 22, comprise 3 memory elements (e.g., D-flip-flop) D each of which stores one estimate input data, a decoder Dec for decoding the ADDR input, a selector SEL for selecting one output of the memory elements as Dout according to the decoding result, a decoder Dec for decoding WADR and WR and selectors SEL corresponding to the memory elements for rewriting the contents of the memory element D by the output of memory element D or WDT according to the decoding result. In operation, DF data is selected for 000, 100 and 210 by ADDR input, and estimate data corresponding to the selected DF data is output as Dout to the subtraction absolute value circuit 60. Also, when the correction is needed, the memory element D to need the correction is judged by WADR and WR, and then rewritten by WDT data.

[RAM2100, RAM2101, RAM2210, RAM2221]

These RAM blocks, as shown in FIG. 22, comprise 5 memory elements (e.g., D-flip-flop) D each of which stores one estimate input data, a decoder Dec for decoding the ADDR input, a selector SEL for selecting one output of the memory elements as Dout according to the decoding result, a decoder Dec for decoding WADR and WR and selectors SEL corresponding to the memory elements for rewriting the contents of the memory element D by the output of memory element D or WDT according to the decoding result. In operation, DF data is selected from 001, 101, 012, 122 and 222 by ADDR input, and estimate data corresponding to the selected DF data is output as Dout to the subtraction absolute value circuit 60. Also, when the correction is needed, the memory element D to need the correction is judged by WADR and WR, and then rewritten by WDT data.

[RAM0000]

Figure 23:
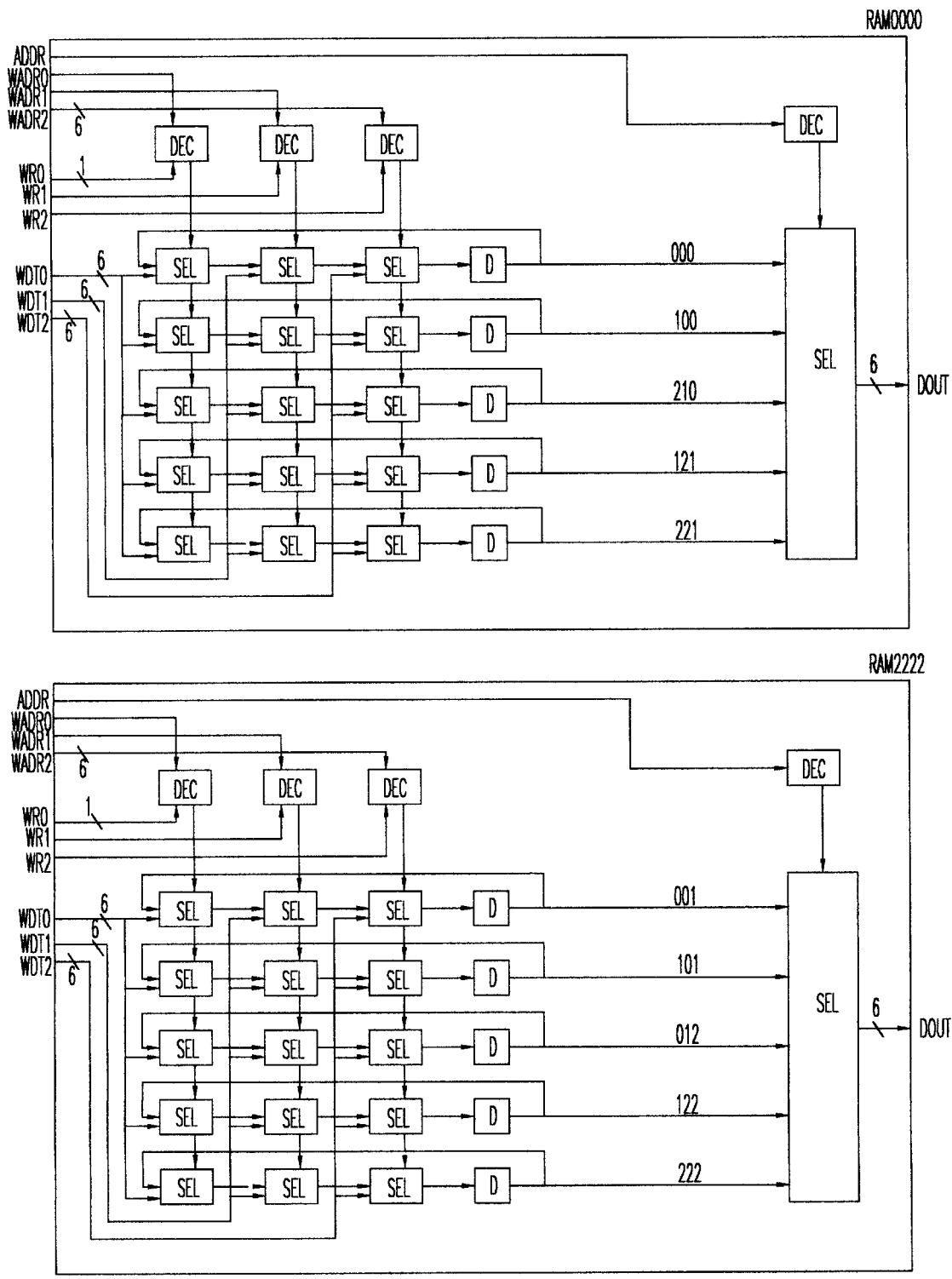

These RAM blocks, as shown in FIG. 23, comprise 5 memory elements e.g., D-flip-flop) D each of which stores one estimate input data, a decoder Dec for decoding the ADDR input, a selector SEL for selecting one output of the memory elements as Dout according to the decoding result, 3 decoders Dec for decoding WADR0 and WR0, WADR1 and WR1, and WADR2 and WR2, and 3 selectors SEL corresponding to each of the memory elements for rewriting the contents of the memory element D by the output of memory element D or WDT0, WDT1 or WDT2 according to the decoding result. In operation, DF data is selected for 000, 100, 210, 121 and 221 by ADDR input, and estimate data corresponding to the selected DF data is output as Dout to the subtraction absolute values circuit 60.

Also, when the correction is needed, the memory element D to need the correction is judged by WADR0 and WR0, WADR1 and WR1, and WADR2 and WR2, and then rewritten by WDT0, WDT1 and WDT2 data. Here, 7-clock data with $1^{st}$ to $3^{rd}$ clock DF data and viterbi data may be, for example, "2100000", "1000000" and "0000000". Like these examples, there may exist all viterbi data are "0000", and $1^{st}$ to $3^{rd}$ clocks. $1^{st}$ and $2^{nd}$ clocks or $2^{nd}$ and $3^{rd}$ clocks in DF data are different from each other. Therefore, RAM0000 has the circuit composition by which 2 or 3 memory elements D can be simultaneously rewritten.

[RAM2222]

These RAM blocks, as shown in FIG. 23, comprise 5 memory elements (e.g., D-flip-flop) D each of which stores one estimate input data, a decoder Dec for decoding the ADDR input, a selector SEL for selecting one output of the memory elements as Dout according to the decoding result, 3 decoders Dec for decoding WADR0 and WR0, WADR1 and WR1, and WADR2 and WR2, and 3 selectors SEL corresponding to each of the memory elements for rewriting the contents of the memory element D by the output of memory element D or WDT0, WDT1 or WDT2 according to the decoding result. In operation, DF data is selected for 001, 101, 012, 122 and 222 by ADDR input, and estimate data corresponding to the selected DF data is output as Dout to the subtraction absolute value circuit 60.

Also, when the correction is needed, the memory element D to need the correction is judged by WADR0 and WR0, WADR1 and WR1, and WADR2 and WR2, and then rewritten by WDT0, WDT1 and WDT2 data. Here, 7-clock data with $1^{st}$ to $3^{rd}$ clock DF data and viterbi data may be, for example, "0122222", "1222222" and "2222222". Like these examples, there may exist all viterbi data are "2222", and $1^{st}$ to $3^{rd}$ clocks, $1^{st}$ and $2^{nd}$ clocks or $2^{nd}$ and $3^{rd}$ clocks in DF data are different from each other. Therefore, RAM2222 has the circuit composition by which 2 or 3 memory elements D can be simultaneously rewritten.

Meanwhile, except "0000" and "2222", 2 or more clocks of 3 clocks cannot be the same viterbi data. Therefore, RAM blocks in FIG. 22 have a composition simpler than that of RAM blocks in FIG. 23.

[RAM0001R, RAM0012R, RAM0121R, RAM0122R]

Figure 24:
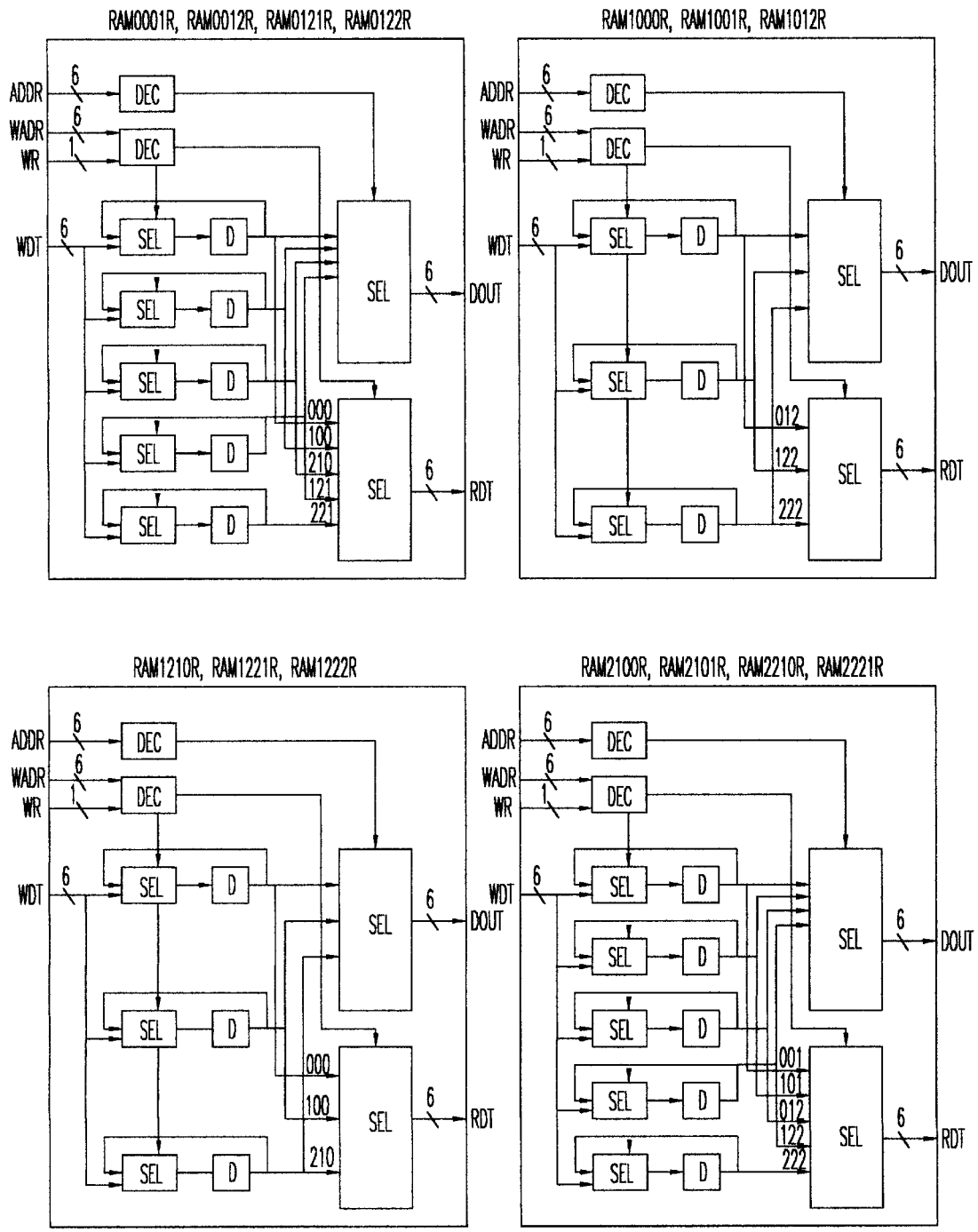

These RAM blocks, as shown in FIG. 24, comprise 5 memory elements (e.g., D-flip-flop) D each of which stores one estimate input data, a decoder Dec for decoding the ADDR input, a selector SEL for selecting one output of the memory elements as Dout according to the decoding result, a decoder Dec for decoding WADR and WR, a selector SEL for selecting one output of the memory elements as RDT according to the decoding result, and selectors SEL corresponding to the memory elements for rewriting the contents of the memory element D by the output of memory element D or WDT according to the decoding result. In operation, DF data is selected from 000, 100, 210, 121 and 221 by ADDR input, and estimate data corresponding to the selected DF data is output as Dout to the subtraction absolute value circuit 60. Also, for the correction calculation, data in a memory element D designated by WADR are output as EDT to the correction control circuit 65. After calculating the correction data in the correction control circuit 65, when the correction is needed, the memory element D to need the correction is judged by WADR and WR, and then rewritten by WDT data.

[RAM1000R, RAM1001R, RAM1012R]

These RAM blocks, as shown in FIG. 24, comprise 3 memory elements (e.g., D-flip-flop) D each of which stores one estimate input data, a decoder Dec for decoding the ADDR input, a selector SEL for selecting one output of the memory elements as Dout according to the decoding result, a decoder Dec for decoding WADR and WR, a selector SEL for selecting one output of the memory elements as RDT according to the decoding result, and selectors SEL corresponding to the memory elements for rewriting the contents of the memory element D by the output of memory element D or WDT according to the decoding result. In operation, DF data is selected from 012, 122 and 222 by ADDR input, and estimate data corresponding to the selected DF data is output as Dout to the subtraction absolute value circuit 60. Also, for the correction calculation, data in a memory element D designated by WADR are output as EDT to the correction control circuit 65. After calculating the correction data in the correction control circuit 65, when the correction is needed, the memory element D to need the correction is judged by WADR and WR, and then rewritten by WDT data.

[RAM1210R, RAM1221R, RAM1222R]

These RAM blocks, as shown in FIG. 24, comprise 3 memory elements (e.g., D-flip-flop) D each of which stores one estimate input data, a decoder Dec for decoding the ADDR input, a selector SRL for selecting one output of the memory elements as Dout according to the decoding result, a decoder Dec for decoding WADR and WR, a selector SEL for selecting one output of the memory elements as RDT according to the decoding result, and selectors SEL corresponding to the memory elements for rewriting the contents of the memory element D by the output of memory element D or WDT according to the decoding result. In operation, DF data is selected from 000, 100 and 210 by ADDR input, and estimate data corresponding to the selected DF data is output as Dout to the subtraction absolute value circuit 60. Also, for the correction calculation, data in a memory element D designated by WADR are output as RDT to the correction control circuit 65. After calculating the correction data in the correction control circuit 65, when the correction is needed, the memory element D to need the correction is judged by WADR and WR, and then rewritten by WDT data.

[RAM2100R, RAM2101R, RAM2210R, RAM2221R]

These RAM blocks, as shown in FIG. 24, comprise 5 memory elements (e.g., D-flip-flop) D each of which stores one estimate input data, a decoder Dec for decoding the ADDR input, a selector SEL for selecting one output of the memory elements as Dout according to the decoding result, a decoder Dec for decoding WADR and WR, a selector SEL for selecting one output of the memory elements as RDT according to the decoding result, and selectors SEL corresponding to the memory elements for rewriting the contents of the memory element D by the output of memory element D or WDT according to the decoding result. In operation, DF data is selected from 001, 101, 012, 122 and 222 by ADDR input, and estimate data corresponding to the selected DF data is output as Dout to the subtraction absolute value circuit 60. Also, for the correction calculation, data in a memory element D designated by WADR are output as RDT to the correction control circuit 65. After calculating the correction data in the correction control circuit 65, when the correction is needed, the memory element D to need the correction is judged by WADR and WR, and then rewritten by WDT data.

[RAM0000R]

Figure 25:
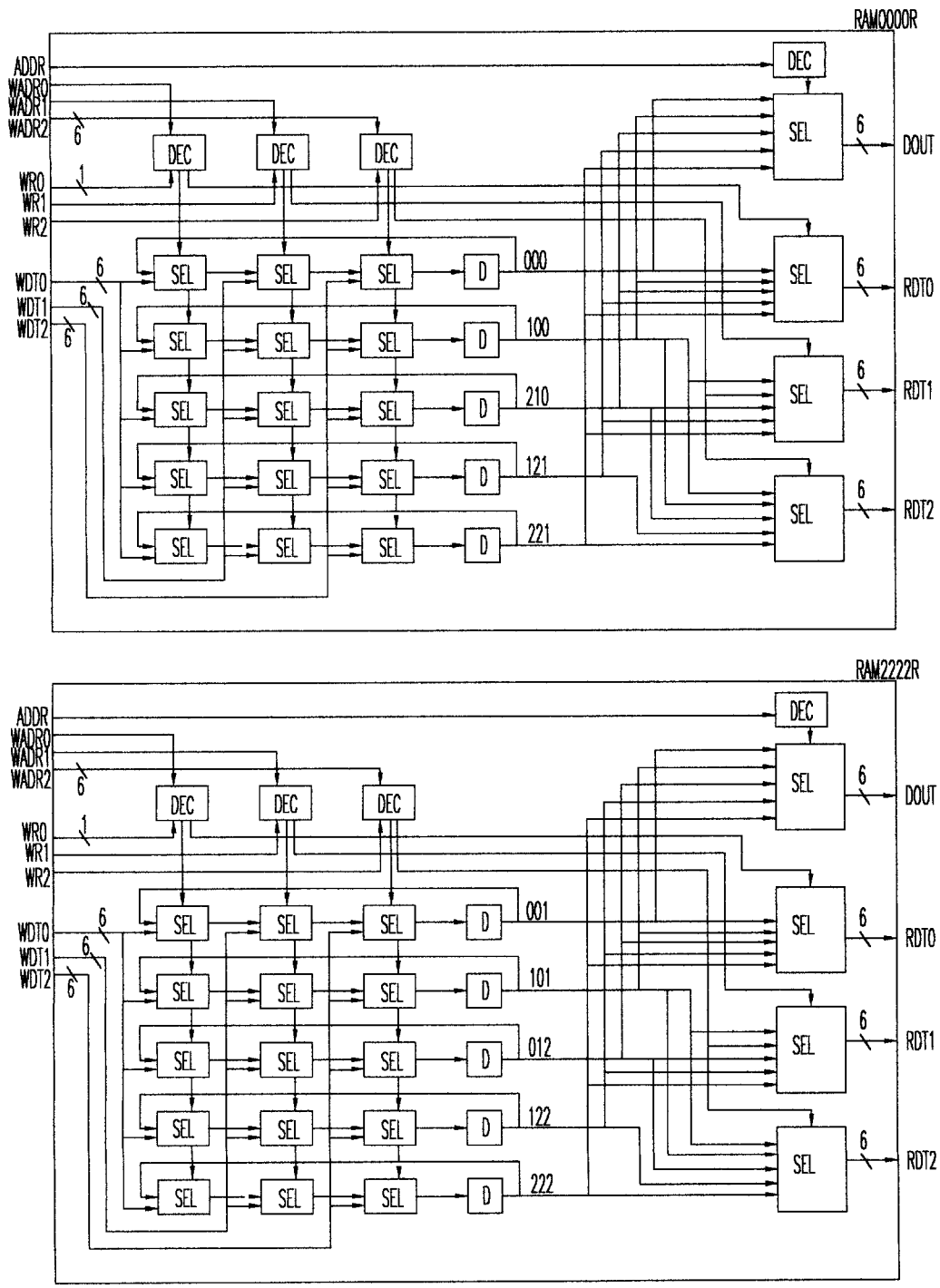

These RAM blocks, as shown in FIG. 25, comprise 5 memory elements (e.g., D-flip-flop) D each of which stores one estimate input data, a decoder Dec for decoding the ADDR input, a selector SEL for selecting one output of the memory elements D as Dout according to the decoding result, 3 decoders Dec for decoding WADR0 and WR0, WADR1 and WR1, and WADR2 and WR2, 3 selectors SEL for selecting each one output of the memory elements D as RDT0, RDT1 and RDT2 according to the decoding result, and 3 selectors SEL corresponding to each of the memory elements for rewriting the contents of the memory element D by the output of memory element D or WDT0, WDT1 or WDT2 according to the decoding result of the 3 decoders Dec for decoding WADR0 and WR0, WADR1 and WR1, and WADR2 and WR2. In operation, DF data is selected from 000, 100, 210, 121 and 221 by ADDR input, and estimate data corresponding to the selected DF data is output as Dout to the subtraction absolute value circuit 60.

Also, for the correction calculation, data in all memory elements D designated by WADR0, WADR1 and WADR2 are output as RDT0, RDT1 and RDT2 to the correction control circuit 65. After calculating the correction data in the correction control circuit 65, when the correction is needed, the memory element D to need the correction is judged by WADR0 and WR0, WADR1 and WR1, and WADR2 and WR2, and then rewritten by one of WDT0, WDT1 and WDT2 data. Like RAM0000, RAM0000R has the circuit composition by which 2 or 3 memory elements D can be simultaneously rewritten.

[RAM2222R]

These RAM blocks, as shown in FIG. 25, comprise 5 memory elements (e.g., D-flip-flop) D each of which stores one estimate input data, a decoder Dec for decoding the ADDR input, a selector SEL for selecting one output of the memory elements D as Dout according to the decoding result, 3 decoders Dec for decoding WADR0 and WR0, WADR1 and WR1, and WADR2 and WR2, 3 selectors SEL for selecting each one output of the memory elements D as RDT0, RDT1 and RDT2 according to the decoding result, and 3 selectors SEL corresponding to each of the memory elements for rewriting the contents of the memory element D by the output of memory element D or WDT0, WDT1 or WDT2 according to the decoding result of the 3 decoders Dec for decoding WADR0 and WR0, WADR1 and WR1, and WADR2 and WR2. In operation, DF data is selected from 001, 101, 012, 122 and 222 by ADDR input, and estimate data corresponding to the selected DF data is output as Dout to the subtraction absolute value circuit 60.

Also, for the correction calculation, data in all memory elements D designated by WADR0, WADR1 and WADR2 are output as RDT0, RDT1 and RDT2 to the correction control circuit 65. After calculating the correction data in the correction control circuit 65, when the correction is needed, the memory element D to need the correction is judged by WADR0 and WR0, WADR1 and WR1, and WADR2 and WR2, and then rewritten by one of WDT0, WDT1 and WDT2 data. Like RAM2222, RAM2222R has the circuit composition by which 2 or 3 memory elements D can be simultaneously rewritten.

(3–6) Diff-RAM 64

Figure 26:
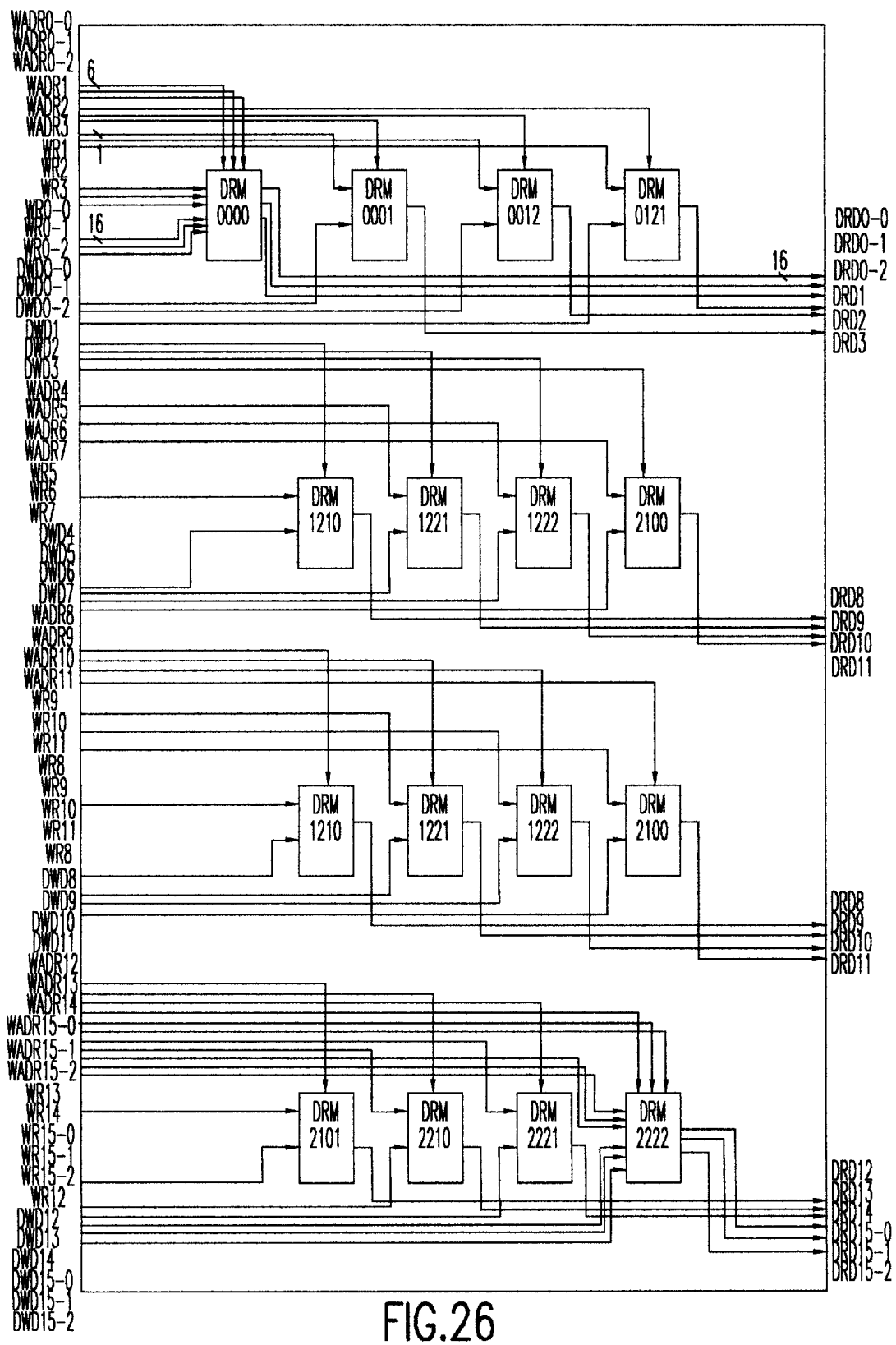
FIG. 26 is a block diagram showing an example of composition of Diff-RAM.

FIG. 26 shows an example of composition of Diff-RAM 64.

DRM0000 is a block for storing the accumulation values of values obtained by subtracting estimate input data stored in RAM0000R from actual input data Din. The accumulation values are stored to each of 5 kinds of estimate input data which are of DF data (000, 100, 210, 121, 221) and one viterbi data 0000.

DRM0001 is a block for storing the accumulation values of values obtained by subtracting estimate input data stored in RAM0001R from actual input data Din. The accumulation values are stored to each of 5 kinds of estimate input data which are of DF data (000, 100, 210, 121, 221) and one viterbi data 0001.

DRM0012 is a block for storing the accumulation values of values obtained by subtracting estimate input data stored in RAM0012R from actual input data Din. The accumulation values are stored to each of 5 kinds of estimate input data which are of DF data (000, 100, 210, 121, 221) and one viterbi data 0012.

DRM0121 is a block for storing the accumulation values of values obtained by subtracting estimate input data stored in RAM0121R from actual input data Din. The accumulation values are stored to each of 5 kinds of estimate input data which are of DF data (000, 100, 210, 121, 221) and one viterbi data 0121.

DRM0122 is a block for storing the accumulation values of values obtained by subtracting estimate input data stored in RAM0122R from actual input data Din. The accumulation values are stored to each of 5 kinds of estimate input data which are of DF data (000, 100, 210, 121, 221) and one viterbi data 0122.

DRM1000 is a block for storing the accumulation values of values obtained by subtracting estimate input data stored in RAM1000R from actual input data Din. The accumulation values are stored to each of 3 kinds of estimate input data which are of DF data (012, 122, 222) and one viterbi data 1000.

DRM1001 is a block for storing the accumulation values of values obtained by subtracting estimate input data stored in RAM1001R from actual input data Din. The accumulation values are stored to each of 3 kinds of estimate input data which are of DF data (012, 122, 222) and one viterbi data 1001.

DRM1012 is a block for storing the accumulation values of values obtained by subtracting estimate input data stored in RAM1012R from actual input data Din. The accumulation values are stored to each of 3 kinds of estimate input data which are of DF data (012, 122, 222) and one viterbi data 1012.

DRM1210 is a block for storing the accumulation values of values obtained by subtracting estimate input data stored in RAM1210R from actual input data Din. The accumulation values are stored to each of 3 kinds of estimate input data which are of DF data (000, 100, 210) and one viterbi data 1210.

DRM1221 is a block for storing the accumulation values of values obtained by subtracting estimate input data stored in RAM1221R from actual input data Din. The accumulation values are stored to each of 3 kinds of estimate input data which are of DF data (000, 100, 210) and one viterbi data 1221.

DRM1222 is a block for storing the accumulation values of values obtained by subtracting estimate input data stored in RAM1222R from actual input data Din. The accumulation values are stored to each of 3 kinds of estimate input data which are of DF data (000, 100, 210) and one viterbi data 1222.

DRM2100 is a block for storing the accumulation values of values obtained by subtracting estimate input data stored in RAM2100R from actual input data Din. The accumulation values are stored to each of 5 kinds of estimate input data which are of DF data (001, 101, 012, 122, 222) and one viterbi data 2100.

DRM2101 is a block for storing the accumulation values of values obtained by subtracting estimate input data stored in RAM2101R from actual input data Din. The accumulation values are stored to each of 5 kinds of estimate input data which are of DF data (001, 101, 012, 122, 222) and one viterbi data 2101.

DRM2210 is a block for storing the accumulation values of values obtained by subtracting estimate input data stored in RAM2210R from actual input data Din. The accumulation values are stored to each of 5 kinds of estimate input data which are of DF data (001, 101, 012, 122, 222) and one viterbi data 2210.

DRM2221 is a block for storing the accumulation values of values obtained by subtracting estimate input data stored in RAM2221R from actual input data Din. The accumulation values are stored to each of 5 kinds of estimate input data which are of DF data (001, 101, 012, 122, 222) and one viterbi data 2221.

DRM2222 is a block for storing the accumulation values of values obtained by subtracting estimate input data stored in RAM2222R from actual input data Din. The accumulation values are stored to each of 5 kinds of estimate input data which are of DF data (001, 101, 012, 122, 222) and one viterbi data 2222.

The accumulation values stored in these DRMs are referred and renewed by the correction control circuit 65. For example, in case of DRM0000, DF data is selected by WADR0-0, WADR0-1 and WADR0-2, and then the accumulation values are output from DRD0-0, DRD0-1 and DRD0-2. After calculating a new accumulation value in the correction control circuit 65, the old accumulation value selected by WR0-0, WR0-1 and Wr0-2 is renewed by DWD0-0, DWD0-1 and DWD0-2 as the new accumulation value. Also, as described later, when the accumulation value of DRM0000 reaches a predetermined value, the corresponding estimate input data stored in RAM0000 to RAM0000R are renewed, and the accumulation value of RAM0000 reaching the predetermined value is reset to '0'.

In like manner, DRM0001 to DRM2222 are operated.

Examples of the compositions of DRM0000 to DRM2222 will be explained below.

[DRM0001, DRM0012, DRM0121, DRM0122]

Figure 27:
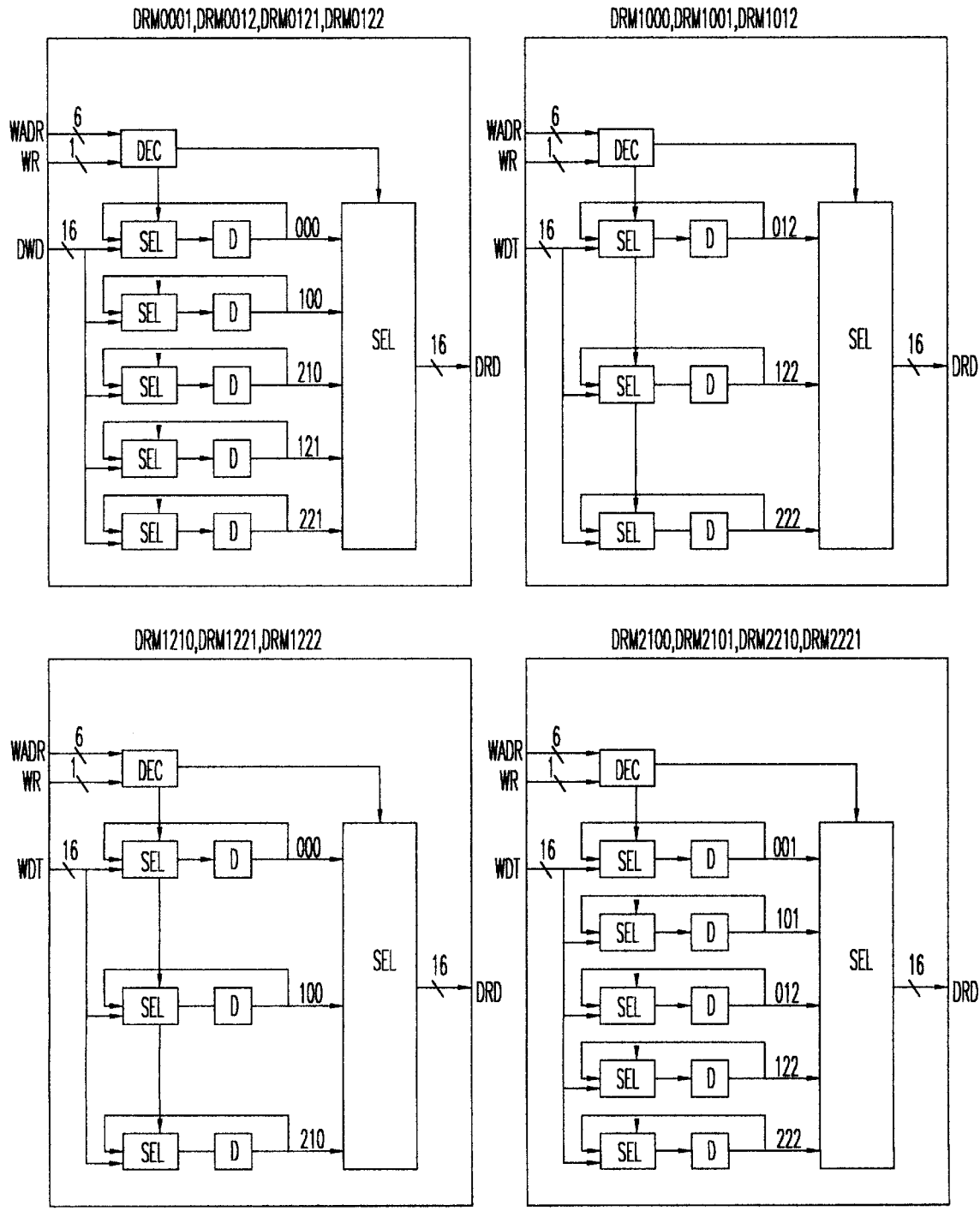
FIGS. 27 and 28 are block diagrams showing examples of composition of the respective blocks in Diff-RAM.

These memory blocks, as shown in FIG. 27, comprise 5 memory elements (e.g., D-flip-flop) D each of which stores one accumulation value, a decoder Dec for decoding WADR and WR, a selector SEL for selecting one output of the memory elements as DRD according to the decoding result, and selectors SEL corresponding to the memory elements for rewriting the contents of the memory element D by the output of memory element D or DWD according to the decoding result. In operation, DF data is selected from 000, 100 and 210 by WADR, and the old accumulation value corresponding to the selected DF data is read out as DRD to the subtraction absolute value circuit 60. Then, after calculating an accumulation value, new data are written in from DWD.

[DRM1000, DRM1001, DRM1012]

These memory blocks, as shown in FIG. 27, comprise 3 memory elements (e.g., D-flip-flop) D each of which stores one accumulation value, a decoder Dec for decoding WADR and WR, a selector SEL for selecting one output of the memory elements as DRD according to the decoding result, and selectors SEL corresponding to the memory elements for rewriting the contents of the memory element D by the output of memory element D or DWD according to the decoding result. In operation, DF data is selected from 012, 122 and 222 by WADR, and the old accumulation value corresponding to the selected DF data is read out as DRD to the subtraction absolute value circuit 60. Then, after calculating an accumulation value, new data are written in from DWD.

[DRM1210, DRM1221, DRM222]

These memory blocks, as shown in FIG. 27, comprise 3 memory elements (e.g., D-flip-flop) D each of which stores one accumulation value, a decoder Dec for decoding WADR and WR, a selector SEL for selecting one output of the memory elements as DRD according to the decoding result, and selectors SEL corresponding to the memory elements for rewriting the contents of the memory element D by the output of memory element D or DWD according to the decoding result. In operation, DF data is selected from 000, 100 and 210 by WADR, and the old accumulation value corresponding to the selected DF data is read out as DRD to the subtraction absolute value circuit 60. Then, after calculating an accumulation value, new data are written in from DWD.

[DRM2100, DRM2101, DRM2210, DRM2221]

These memory blocks, as shown in FIG. 27, comprise 5 memory elements (e.g., D-flip-flop) D each of which stores one accumulation value, a decoder Dec for decoding WADR and WR, a selector SEL for selecting one output of the memory elements as DRD according to the decoding result, and selectors SEL corresponding to the memory elements for rewriting the contents of the memory element D by the output of memory element D or DWD according to the decoding result. In operation, DP data is selected from 001, 101, 012, 122 and 222 by WADE, and the old accumulation value corresponding to the selected DF data is read out as DRD to the subtraction absolute value circuit 60. Then, after calculating an accumulation value, new data are written in from DWD.

[DRM0000]

Figure 28:
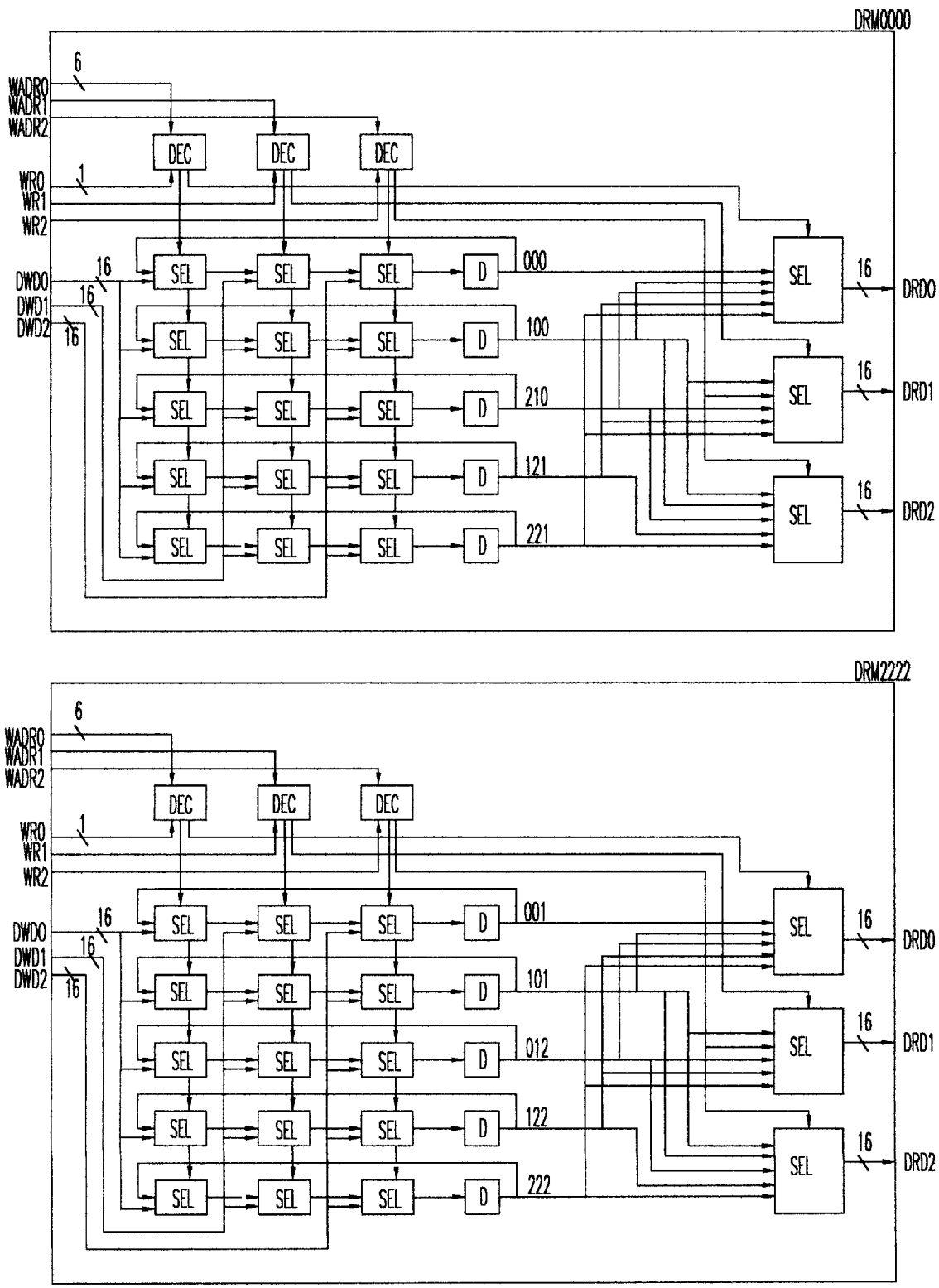

These memory blocks, as shown in FIG. 28, comprise 5 memory elements (e.g., D-flip-flop) D each of which stores one accumulation value, 3 decoders Dec for decoding WADR0 and WR0, WADR1 and WR1 and WADR2 and WR2, 3 selectors SEL for selecting each one output of the memory elements D as DRD0, DRD1 and DRD2 according to the decoding result, and selectors SEL corresponding to the memory elements for rewriting the contents of the memory element D by the output of memory element D or DWD0, DWD1 or DWD2 according to the decoding result. In operation, DF data is selected from 000, 100, 210, 121 and 221 by WADR0, WADR1 and WADR2, and the old accumulation values corresponding to the selected DF data are read out as DRD0, DRD1 and DRD2 to the subtraction absolute value circuit 60. Then, after calculating an accumulation value, new data are written in from DWD0, DWD1 and DWD2.

Like RAM0000, 2 or more of Viterbi data in $1^{st}$ to $3^{rd}$ clocks may be "0000". Therefore, DRM0000 has the circuit composition by which 2 or 3 memory elements D can be simultaneously rewritten.

[DRM2222]

These memory blocks, as shown in FIG. 28, comprise 5 memory elements (e.g., D-flip-flop) D each of which stores one accumulation value, 3 decoders Dec for decoding WADR0 and WR0, WADR1 and WR1 and WADR2 and WR2, 3 selectors SEL for selecting each one output of the memory elements D as DRD0, DRD1 and DRD2 according to the decoding result, and selectors SEL corresponding to the memory elements for rewriting the contents of the memory element D by the output of memory element D or DWD0, DWD1 or DWD2 according to the decoding result. In operation, DR data is selected from 001, 101, 012, 122 and 222 by WADR0, WADR1 and WADR2, and the old accumulation values corresponding to the selected DF data are read out as DRD0, DRD1 and DRD2 to the subtraction absolute value circuit 60. Then, after calculating an accumulation value, new data are written in from DWD0, DWD1 and DWD2.

Like RAM2222, 2 or more of Viterbi data in $1^{st}$ to $3^{rd}$ clocks may be "2222". Therefore, DRM2222 has the circuit composition by which 2 or 3 memory elements D can be simultaneously rewritten.

Meanwhile, except "0000" and "2222", 2 or more clocks of 3 clocks cannot be the same Viterbi data. Therefore, DRM blocks in FIG. 27 have a composition simpler than that of DRM blocks in FIG. 28.

(3-7) Correction Control Circuit 65

Figure 29:
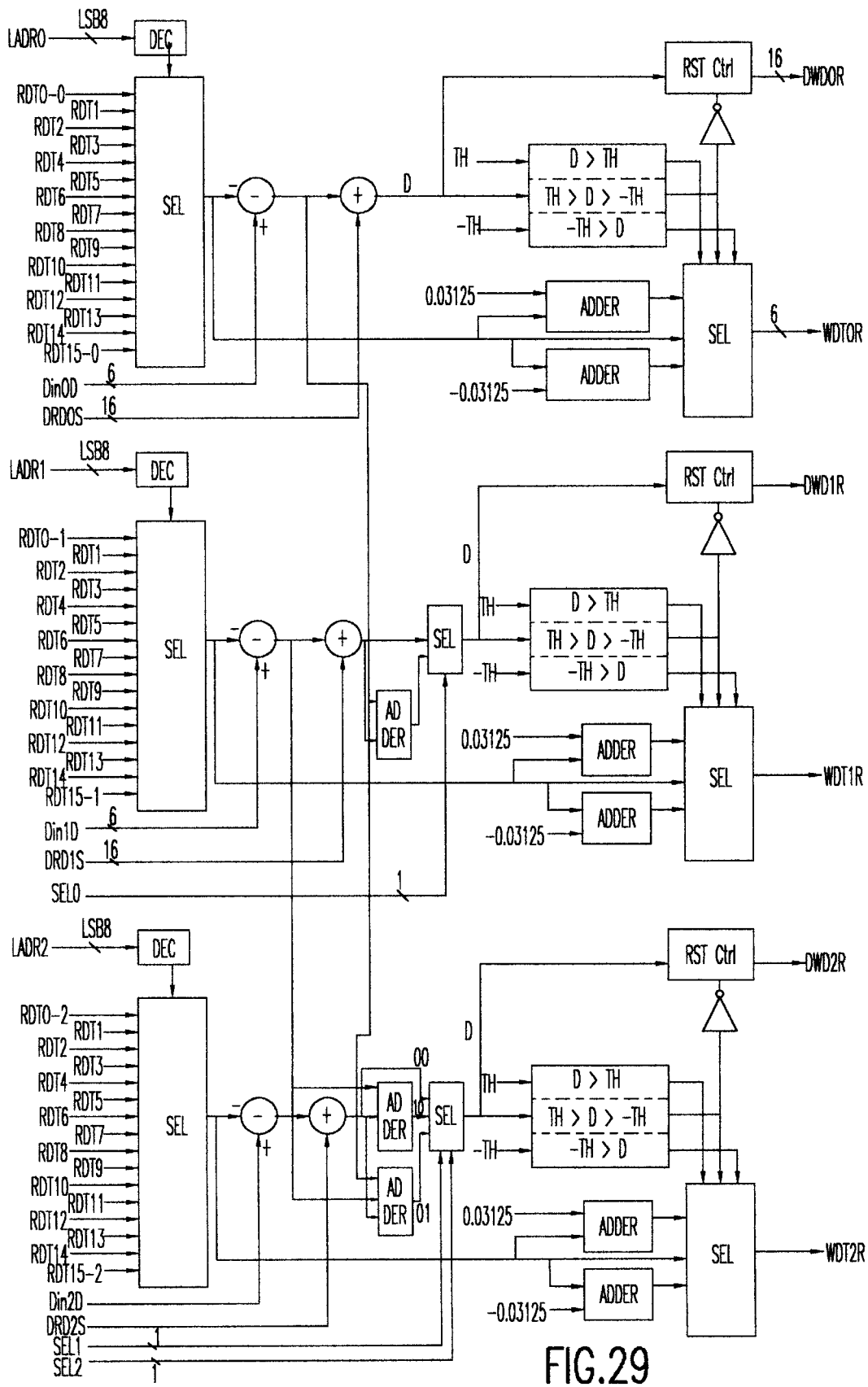
FIGS. 29 to 34 are block diagrams showing an example of composition of a correction control circuit.
Figure 34:
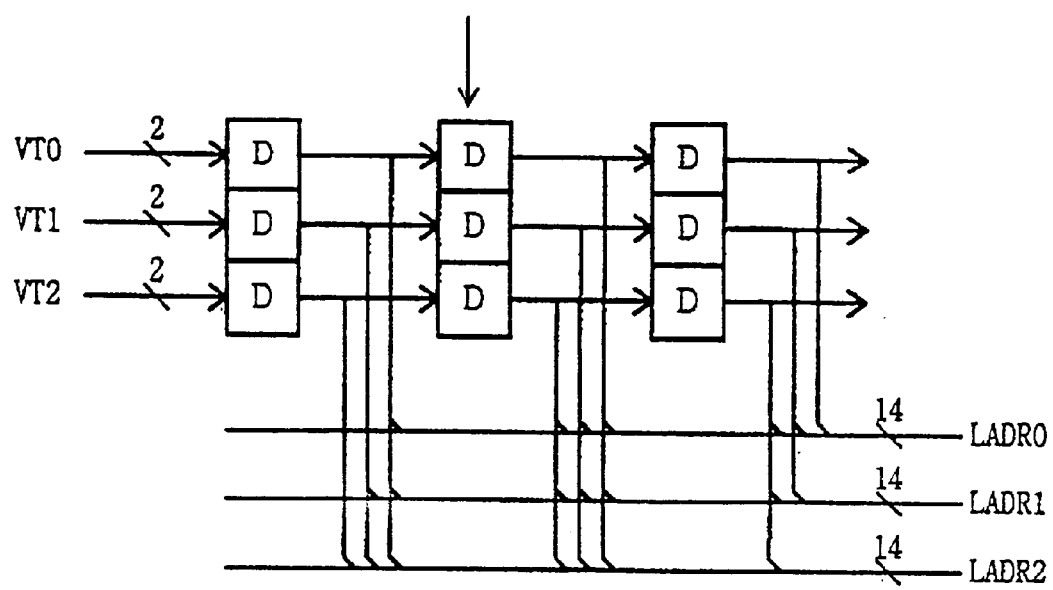

FIGS. 29 and 34 show an example of composition of the correction control circuit 65. Meanwhile, for the convenience of drawing the figures, the composition of the correction control circuit 65 is divided into FIGS. 29 and 34.

First, referring to FIG. 34, outputs VT0, VT1 and VT2 to be parallel output from the path memory circuit 62 are input to 3-stage shift registers, and then LADR0, LADR1 and LADR2 are produced, which are data obtained by combining the continuous past 3 parallel outputs. Here, the past data is MSB and the current data is LSB. LADR0, LADR1 and LADR2 correspond to 7-clock estimate data of output VT0 (hereinafter referred to as '1st clock'), output VT1 (hereinafter referred to as '2nd clock') and output VT2 (hereinafter referred to as '3rd clock') which are stored in the second-stage register.

The correction control circuit 65 renews, in parallel, the estimate input data in Main-RAM 63 corresponding to 7-clock estimate data of the $1^{st}$, $2^{nd}$ and $3^{rd}$ clocks, by the composition in FIG. 29.

[operation as to the $1^{st}$ clock of the 3 clocks (Refer to the top part of the circuit composition in FIG. 29)]

From actual input data Din0D synchronized with a timing, estimate input data to be selected from estimate input data to be read out as RDT0-0 to RDT15-0 from Main-RAM 63 by 4-clock Viterbi data of LADR0 is subtracted. Then, the subtraction value is added to the accumulation value DRD0S as to estimate input data until the present time to be read out from Diff-RAM 64. Thereby, a new accumulation value is calculated.

When this accumulation value exceeds a predetermined positive threshold (TH), a positive predetermined value (e.g., 0.03125) is added to the estimate input data at this time to obtain a renewed estimate input data. Then, the renewed estimate input data is written back to Main-RAM 63 by write data WDT0R, and the accumulation value in Diff-RAM 64 is renewed to be "0" by DWD0R.

On the other hand, when the new accumulation value is less than a predetermined negative threshold (−TH), a negative predetermined value (e.g., −0.03125) is added to the estimate input data at this time to obtain a renewed estimate input data. Then, the renewed estimate input data is written back to Main-RAM 63 by write data WDT0R, and the accumulation value in Diff-RAM 64 is renewed to be "0" by DWD0R.

When the new accumulation value does not exceed (TH) and is not less than (−TH), the estimate input data is not renewed and the new accumulation value is written back to Diff-RAM 64 by DWD0R.

[operation as the $2^{nd}$ clock of the 3 clocks (Refer to the middle part of the circuit composition in FIG. 29)]

From actual input data Din1D synchronized with a timing, estimate input data to be selected from estimate input data to be read out as RDT0-1 to RDT15-1 from Main-RAM 63 by 4-clock Viterbi data of LADR1 is subtracted. Then, the subtraction value is added to the accumulation value DRD1S as to estimate input data until the present time to be read out from Diff-RAM 64. Thereby, a new accumulation value is calculated.

When this accumulation value exceeds a predetermined positive threshold (TH), a positive predetermined value (e.g., 0.03125) is added to the estimate input data at this time to obtain a renewed estimate input data. Then, the renewed estimate input data is written back to Main-RAM 63 by write data WDT1R, and the accumulation value in Diff-RAM 64 is renewed to be "0" by DWD1R.

On the other hand, when the new accumulation value is less than a predetermined negative threshold (−TH), a negative predetermined value (e.g., −0.03125) is added to the estimate input data at this time to obtain a renewed estimate input data. Then, the renewed estimate input data is written back to Main-RAM 63 by write data WDT1R, and the accumulation value in Diff-RAM64 is renewed to be "0" by DWD1R.

When the new accumulation value does not exceed (TH) and is not less than (−TH), the estimate input data is not renewed and the new accumulation value is written back to Diff-RAM 64 by DWD1R.

However, when 7-clock (DF data+Viterbi data) is "0000000" or "2222222" for both $1^{st}$ and $2^{nd}$ clocks, SEL0, which is explained later, becomes "1" and the following operation is conducted in place of the above operation.

From actual input data Din0D, Din1D synchronized with a timing, estimate input data to be selected from estimate input data to be read out as RDT0-0 to RDT15-0, RDT0-1 to RDT15-1 from Main-RAM 63 by 4-clock Viterbi data of LADR0, LADR1, respectively are subtracted. Then, the subtraction values are added to the accumulation value DRD1S as to estimate input data until the present time to be read out from Diff-RAM 64. Thereby, a new accumulation value is calculated.

When this accumulation value exceeds a predetermined positive threshold (TH), a positive predetermined value (e.g., 0.03125) is added to the estimate input data at this time to obtain a renewed estimate input data. Then, the renewed estimate input data is written back to Main-RAM 63 by write data WDT1R, and the accumulation value in Diff-RAM 64 is renewed to be "0" by DWD1R.

On the other hand, when the new accumulation value is less than a predetermined negative threshold (−TH), a negative predetermined value (e.g., −0.03125) is added to the estimate input data at this time to obtain a renewed estimate input data. Then, the renewed estimate input data is written back to Main-RAM 63 by write data WDT1R, and the accumulation value in Diff-RAM 64 is renewed to be "0" by DWD1R.

When the new accumulation value does not exceed (TH) and is not less than (−TH), the estimate input data is not renewed and the new accumulation value is written back to Diff-RAM 64 by DWD1R. In this case, the writing from WDT0R, DWD0R is not conducted.

[operation as to the $3^{rd}$ clock of the 3 clocks (Refer to the bottom part of the circuit composition in FIG. 29)]

From actual input data Din2D synchronized with a timing, estimate input data to be selected from estimate input data to be read out as RDT0-2 to RDT15-2 from Main-RAM 63 by 4-clock Viterbi data of LADR2 is subtracted. Then, the subtraction value is added to the accumulation value DRD2S as to estimate input data until the present time to be read out from Diff-RAM 64. Thereby, a new accumulation value is calculated.

When this accumulation value exceeds a predetermined positive threshold (TH), a positive predetermined value (e.g., 0.03125) is added to the estimate input data at this time to obtain a renewed estimate input data. Then, the renewed estimate input data is written back to Main-RAM 63 by write data WDT2R, and the accumulation value in Diff-RAM 64 is renewed to be "0" by DWD2R.

On the other hand, when the new accumulation value is less than a predetermined negative threshold (−TH), a negative predetermined value (e.g., −0.03125) is added to the estimate input data at this time to obtain a renewed estimate input data. Then, the renewed estimate input data is written back to Main-RAM 63 by write data WDT2R, and the accumulation value in Diff-RAM 64 is renewed to be "0" by DWD2R.

When the new accumulation value does not exceed (TH) and is not less than (−TH), the estimate input data is not renewed and the new accumulation value is written back to Diff-RAM 64 by DWD2R.

However, when 7-clock (DF data+Viterbi data) is "0000000" or "2222222" for both $2^{nd}$ and $3^{rd}$ clocks, SEL1, which is explained later, becomes "1" and the following operation is conducted in place of the above operation.

From actual input data Din1D, Din2D synchronized with a timing, estimate input data to be selected from estimate input data to be read out as RDT0-1 to RDT15-1, RDT0-2 to RDT15-2 from Main-RAM 63 by 4-clock Viterbi data of LADR1, LADR2, respectively are subtracted. Then, the subtraction values are added to the accumulation value DRD2S as to estimate input data until the present time to be read out from Diff-RAM 64. Thereby, a new accumulation value is calculated.

When this accumulation value exceeds a predetermined positive threshold (TH), a positive predetermined value (e.g., 0.03125) is added to the estimate input data at this time to obtain a renewed estimate input data. Then, the renewed estimate input data is written back to Main-RAM 63 by write data WDT2R, and the accumulation value in Diff-RAM 64 is renewed to be "0" by DWD2R.

On the other hand, when the new accumulation value is less than a predetermined negative threshold (−TH), a negative predetermined value (e.g., −0.03125) is added to the estimate input data at this time to obtain a renewed estimate input data. Then, the renewed estimate input data is written back to Main-RAM 63 by write data WDT2R, and the accumulation value in Diff-RAM 64 is renewed to be "0" by DWD2R.

When the new accumulation value does not exceed (TH) and is not less than (−TH), the estimate input data is not renewed and the new accumulation value is written back to Diff-RAM 64 by DWD2R. In this case, the writing from WDT1R, DWD1R is not conducted.

Further, when 7-clock (DF data+Viterbi data) is "0000000" or "2222222" for $1^{st}$, $2^{nd}$ and $3^{rd}$ clocks, SEL2, which is explained later, becomes "1" and the following operation is conducted in place of the above operation.

From actual input data Din0D, Din1D and Din2D synchronized with a timing, estimate input data to be selected from estimate input data to be read out as RDT0-0 to RDT15-0, RDT0-1 to RDT15-1 and RDT0-2 to RDT15-2 from Main-RAM 63 by 4-clock Viterbi data of LADR0, LADR1, LADR2, respectively are subtracted. Then, the subtraction values are added to the accumulation value DRD2S as to estimate input data until the present time to be read out from Diff-RAM 64. Thereby, a new accumulation value is calculated.

When this accumulation value exceeds a predetermined positive threshold (TH), a positive predetermined value (e.g., 0.03125) is added to the estimate input data at this time to obtain a renewed estimate input data. Then, the renewed estimate input data is written back to Main-RAM 63 by write data WDT2R, and the accumulation value in Diff-RAM 64 is renewed to be "0" by DWD2R.

On the other hand, when the new accumulation value is less than a predetermined negative threshold (−TH), a negative predetermined value (e.g., −0.03125) is added to the estimate input data at this time to obtain a renewed estimate input data. Then, the renewed estimate input data is written back to Main-RAM 63 by write data WDT2R, and the accumulation value in Diff-RAM 64 is renewed to be "0" by DWD2R.

When the new accumulation value does not exceed (TH) and is not less than (−TH), the estimate input data is not renewed and the new accumulation value is written back to Diff-RAM 64 by DWD2R. In this case, the writing from WDT0R, DWD0R, WDT1R, DWD1R is not conducted.

Figure 30:
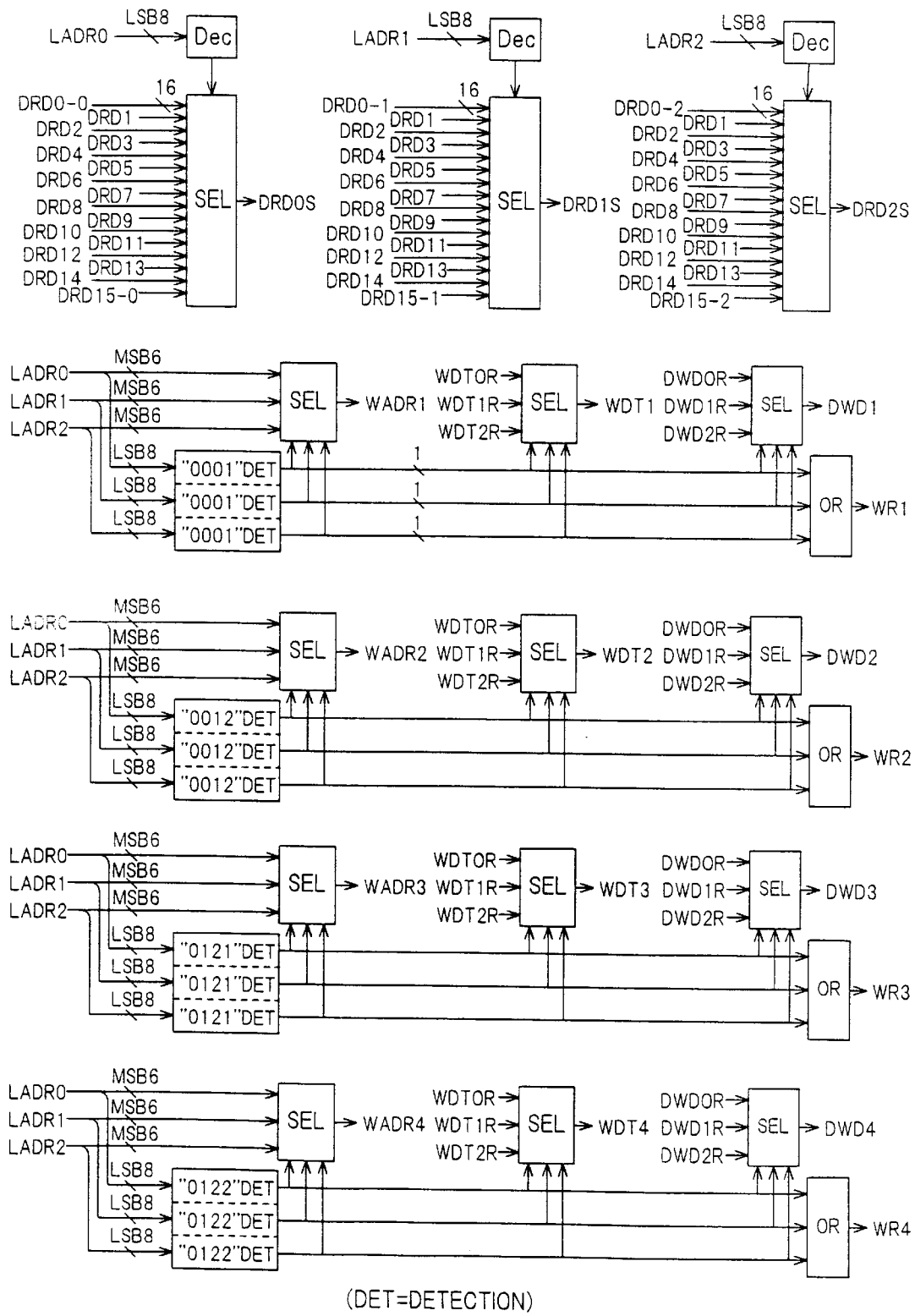

Referring to the circuit composition at the top of FIG. 30, DRD0S, DRD1S and DRD2S in FIG. 29, each of which is the accumulation value of values obtained by subtracting estimate input data from actual input data, are selected from DRD0-0 to DRD15-0, DRD0-1 to DRD15-1 and DRD0-2 to DRD15-2 to be read out from Diff-RAM 64 by 4-clock Viterbi data of LADR0, LADR1, LADR2, respectively.

Figure 31:
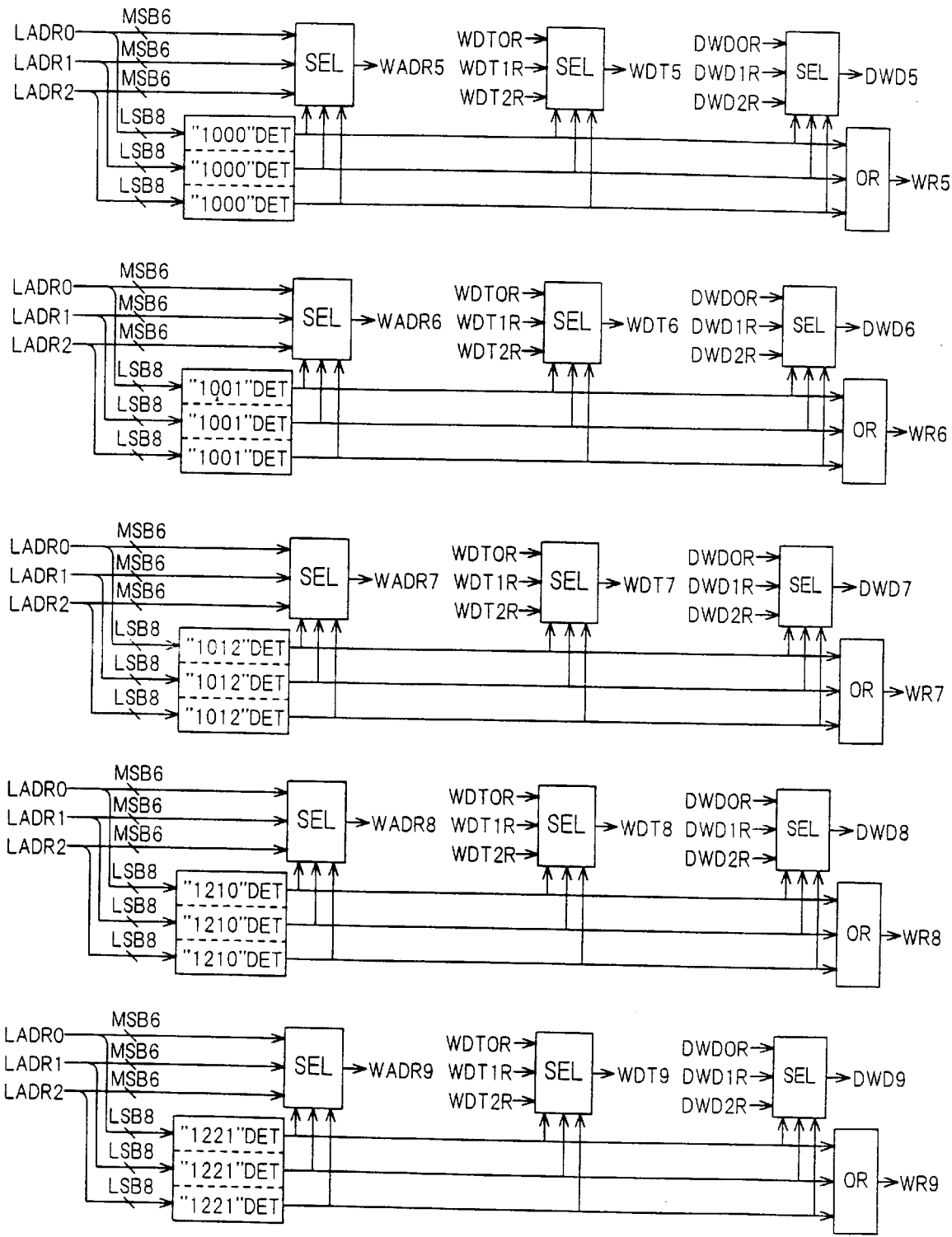
Figure 32:
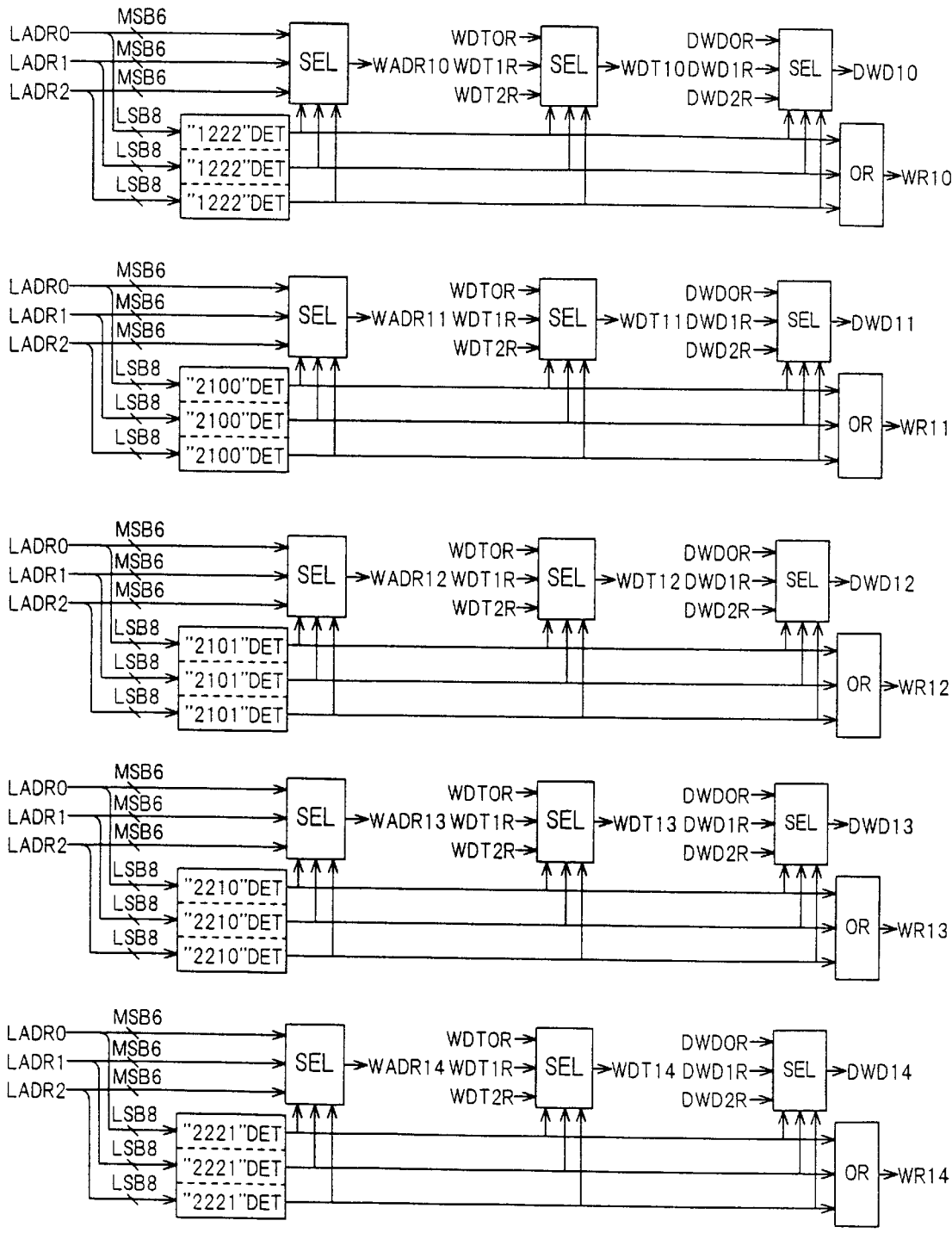
Figure 33:
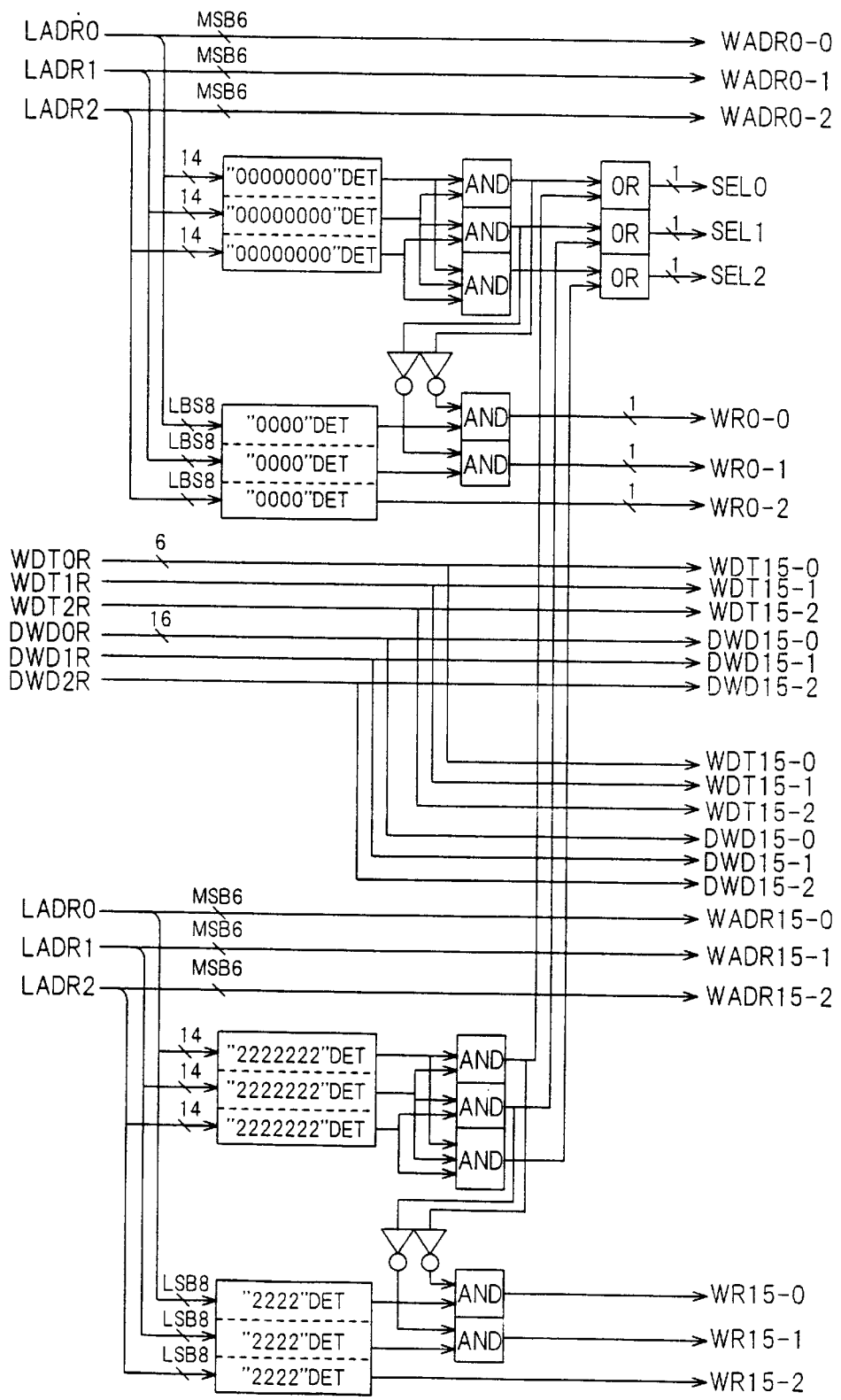

In parts except the top of FIG. 30 and in FIGS. 31 to 33, there are shown circuit compositions as to the production of write address, write data and write enable etc. of Main-RAM 63 and Diff-RAM 64.

WADR1 to WADR14, which are write addresses of Main-RAM 63, are produced as DF data when the 4-clock Viterbi data of LADR0 to LADR2 that are of 7-clock and 14 bit (DF data+Viterbi data) are "0001" to "2221".

WDT1 to WDT14, which are write data of Main-RAM 63, are produced as WDT0R, WDT1R or WDT2R when the 4-clock Viterbi data of LADR0 to LADR2 that are of 7-clock and 14 bit (DF data+Viterbi data) are "0001" to "2221".

DWD1 to DWD14, which are write data of Diff-RAM 64, are produced as DWD0R, DWD1R or DWD2R when the 4-clock Viterbi data of LADR0 to LADR2 that are of 7-clock and 14 bit (DF data+Viterbi data) are "0001" to "2221".

WR1 to WR14, which are write enables of Main-RAM 63, become active when at least one of the 4-clock Viterbi data of LADR0 to LADR2 that are of 7-clock and 14 bit (DF data+Viterbi data) is "0001" to "2221".

WADR0-0 to 0-2, WADR15-0 to 15-2, which are write addresses of Main RAM 63, are produced as DF data, MSB 6 bits of LADR0 to LADR2 that are of 7-clock and 14 bit (DF data+Viterbi data) are "0001" to "2221".

WDT0-0 to 0-2, WDT15-0 to 15-2, which are write data of Main-RAM 63, show WDT0R to WDT2R.

DWD0-0 to 0-2, DWD15-0 to 15-2, which are write data of Diff-RAM 64, show DWD0R to DWD2R.

WR0-0 to 0-2, WR15-0 to 15-2, which are write enables of Main-RAM 63, become active when the 4-clock Viterbi data of LADR0 to LADR2 that are of 7-clock and 14 bit (DF data+Viterbi data) are "0000" or "2222". However, when "0000000" or "2222222" is continuously occurred for the $1^{st}$ and $2^{nd}$ clocks, WR0-0, WR15-0 are set to be inactive, when it is continuously occurred for the $2^{nd}$ and $3^{rd}$ clocks, WR0-1, WR15-1 are set to be inactive, and, when it is continuously occurred for the $1^{st}$, $2^{nd}$ and $3^{rd}$ clocks, WR0-0, WR15-0, WR0-1, WR15-1 are set to be inactive.

Also, SEL0, ESL1 and SEL2 described earlier are light select signals when 2 or more clocks of 3 clocks select the same RAM in Main-RAM0, Diff-RAM0 corresponding to 4-clock Viterbi data "0000" or Main-RAM15, Diff-RAM15 corresponding to 4-clock Viterbi data "2222. Normally, SEL0, ESL1 and SEL2 are all "0". When "0000000" or "2222222" is continuously occurred for the $1^{st}$ and $2^{nd}$ clocks, SEL0 is set to be "1", when it is continuously occurred for the $2^{nd}$ and $3^{rd}$ clocks, SEL1 is set to be "1", and, when it is continuously occurred for the $1^{st}$, $2^{nd}$ and $3^{rd}$ clocks, SEL2 is set to be "1".

Although the first embodiment is detailed above, the invention is not limited to the embodiment and various modifications or additions can be applied to the invention. For example, though the first embodiment is applied to a minimum inversion interval of 2, the following embodiments with different conditions of minimum inversion interval are also included in the invention.

In a second preferred embodiment, the condition of minimum inversion interval is the first embodiment is removed. PR(1,1) pre-equalization and reproduce data with ternary levels (0, 1, 2) are used. In the second embodiment, 4-clock branchmetrics are of:

0000, 0001, 0011, 0012,
0110, 0111, 0121, 0122,
1000, 1001, 1011, 1012,
1100, 1101, 1110, 1111,
1112, 1121, 1122, 1210,
1211, 1221, 1222, 2100,
2101, 2111, 2112, 2210,
2211, 2221, 2222.

The whole composition of a data-reproducing device in the second embodiment is similar to that shown in FIG. 6. According to the change of branchmetrics, the respective parts may be altered.

In a third preferred embodiment, the condition of a minimum inversion interval of 3 is given in contrast to the first embodiment. PR(1,1) pre-equalization and reproduce data with ternary levels (0, 1, 2) are used. Due to the characteristic of the coding with a minimum inversion interval of 3, 4-clock branchmetrics are of:

0000, 0001, 0012, 0122,
1000, 1001, 1221, 1222,
2100, 2210, 2221, 2222.

The whole composition of a data-reproducing device in the third embodiment is similar to that shown in FIG. 6. According to the change of branchmetrics, the respective parts may be altered.

In contrast to the first embodiment, the other embodiments with the condition of a minimum inversion interval of 4 or more can be also applied.

Further, though 4-clock Viterbi data are used in the first embodiment, the following embodiments with different Viterbi data other than 4-clock are also included in the invention.

In a fourth preferred embodiment, the conditions of a minimum inversion interval of 2 and 3-clock Viterbi data are given in contrast to the first embodiment. PR(1,1) pre-equalization and reproduce data with ternary levels (0, 1, 2) are used. In the fourth embodiment, 3-clock branchmetrics are of:

000, 001, 012, 100, 101,
121, 122, 210, 221, 222.

The whole composition of a data-reproducing device in the fourth embodiment is similar to that shown in FIG. 6. According to the change of branchmetrics, the respective parts may be altered.

In a fifth preferred embodiment, in contrast to the first embodiment, the conditions of a minimum inversion interval of 2 and 5-clock Viterbi data are used. PR(1,1) pre-equalization and reproduce data of ternary levels (0, 1, 2) are used. 5-clock branchmetrics are of:

00000, 00001, 00012, 00121, 00122,
01210, 01221, 01222, 10000, 10001,
10012, 10121, 10122, 12100, 12101,
12210, 12221, 12222, 21000, 21001,
21012, 22100, 22101, 22210, 22221,
22222.

The whole composition of a data-reproducing device in the fifth embodiment is similar to that shown in FIG. 6. According to the change of branchmetrics, the respective parts may be altered.

In contrast to the first embodiment, the other embodiments with 6-clock or more branchmetric can be also applied.

Further, in contrast to the first embodiment, the following embodiments with different minimum inversion interval and Viterbi data are also included in the invention.

In a sixth preferred embodiment, the condition of minimum inversion interval in the first embodiment is removed and 3-clock Viterbi data are used. PR(1,1) pre-equalization and reproduce data with ternary levels (0, 1, 2) are used. In the sixth embodiment, 3-clock branchmetrics are of:

000, 001, 011, 012, 100,
101, 110, 111, 112, 121,
122, 210, 211, 221, 222.

The whole composition of a data-reproducing device in the sixth embodiment is similar to that shown in FIG. 6. According to the change of branchmetrics, the respective parts may be altered.

The other embodiments, where the condition of minimum inversion interval is removed and Viterbi data with other than 4-clock are used, may be as follows:

In a seventh preferred embodiment, PR(1,1) pre-equalization, reproduce data with ternary levels (0, 1, 2), and 2-clock branchmetric are used.

In an eighth preferred embodiment, PR(1,1) pre-equalization, reproduce data with ternary levels (0, 1, 2), and 5-clock branchmetric are used.

In a ninth preferred embodiment, the conditions of a minimum inversion interval of 3 and 3-clock Viterbi data are used in contrast to the first embodiment. PR(1,1) pre-equalization and reproduce data with ternary levels (0, 1, 2) are used. In the ninth embodiment, 3-clock branchmetrics are of:

000, 001, 012, 100,
122, 210, 221, 222.

The whole composition of a data-reproducing device in the ninth embodiment is similar to that shown in FIG. 6. According to the change of branchmetrics, the respective parts may be altered.

In a tenth preferred embodiment, the conditions of a minimum inversion interval of 3 and 5-clock Viterbi data are used in contrast to the first embodiment. PR(1,1) pre-equalization and reproduce data with ternary levels (0,1,2) are used. In the tenth embodiment, 5-clock branchmetrics are of:

00000, 00001, 00012, 00122,
01221, 01222, 10000, 10001,
10012, 12210, 12221, 12222,
21000, 21001, 22100, 22210,
22221, 22222.

The whole composition of a data-reproducing device in the tenth embodiment is similar to that shown in FIG. 6. According to the change of branchmetrics, the respective parts may be altered.

In an eleventh preferred embodiment, the conditions of a minimum inversion interval of 3 and 6-clock Viterbi data are used in contrast to the first embodiment. PR(1,1) pre-equalization and reproduce data with ternary levels (0,1,2) are used. In the eleventh embodiment, 6-clock branchmetrics are of:

000000, 000001, 000012, 000122,
001221, 001222, 012210, 012221,
012222, 100000, 100001, 100012,
100122, 122100, 122210, 122221,
122222, 210000, 210001, 210012,
221000, 221001, 222100, 222210,
222221, 222222.

The whole composition of a data-reproducing device in the eleventh embodiment is similar to that shown in FIG. 6. According to the change of branchmetrics, the respective parts may be altered.

In a twelfth preferred embodiment, a minimum inversion interval of 3, PR(1,1) pre-equalization, reproduce data with ternary levels (0,1,2), and 7-clock or more branchmetric are used.

Though DF data used in the above embodiments are of 3 clocks, they may be of 0 clock, which means that DF data are not used, 1 or 2 clocks, or 4 clocks or more.

For example, for 1-clock DF data, in case of FIG. 1, M(−1,0) to (−1,2)=0 or 1, M(−1,3) to M(−1,4)=2, M(−1,5) to M(−1,6)=0, and M(−1,7) to M(−1,9)=1 or 2 are obtained.

Also, for example, for 2 clock DF data, in case of FIG. 1, they are selected from:

| | |
|---|---|
| M(−2,0), M(−1,0) | = 00, 10, 21 |
| M(−2,1), M(−1,1) | = 00, 10, 21 |
| M(−2,2), M(−1,2) | = 00, 10, 21 |
| M(−2,3), M(−1,3) | = 12, 22 |
| M(−2,4), M(−1,4) | = 12, 22 |
| M(−2,5), M(−1,5) | = 00, 10 |
| M(−2,6), M(−1,6) | = 00, 10 |
| M(−2,7), M(−1,7) | = 01, 12, 22 |
| M(−2,8), M(−1,8) | = 01, 12, 22 |
| M(−2,9), M(−1,9) | = 01, 12, 22 |

Namely, tracking the past paths, when the paths reach states 0 to 2, "0" is obtained, when they reach states 3 to 6, "1" is obtained, and, when they reach states 7 to 9, "2" is obtained.

Also, the above alterations are similarly applicable to the other embodiments.

Further, in the above embodiments, the pre-equalization other than PR(1,1) may be also used. For example, even when there occurs an error gap in pre-equalization, e.g., even in case of substantially PR(0.8, 1.2), PR(1.3, 0.9), the invention can be applied as it can correct the equalization error.

Furthermore, even if quite different equalizations are conducted, the invention can be applied when its state change is similar to that in FIG. 1. For example, when PR(1) binary detection, PR(1,1) binary detection are conducted, changing the states, PM(0) to PM(9) from the 3-clock data in FIG. 1 into 4-clock data as shown below, and changing the paths, BM(0) to BM(9) from the 4-clock data in FIG. 13 into 5-clock data as shown below can be conducted:

| | |
|---|---|
| PM(0) 000 → 0000 | BM(0) 0000 → 00000 |
| PM(1) 001 → 0001 | BM(1) 0001 → 00001 |
| PM(2) 012 → 0011 | BM(2) 0012 → 00011 |
| PM(3) 121 → 0110 | BM(3) 0121 → 00110 |
| PM(4) 122 → 0111 | BM(4) 0122 → 01111 |
| PM(5) 100 → 1000 | BM(5) 1000 → 01100 |
| PM(6) 101 → 1001 | BM(6) 1001 → 01110 |
| PM(7) 210 → 1100 | BM(7) 1012 → 01111 |
| PM(8) 221 → 1110 | BM(8) 1210 → 10000 |
| PM(9) 222 → 1111 | BM(9) 1221 → 10001 |
| | BM(10) 1222 → 10011 |
| | BM(11) 2100 → 11000 |
| | BM(12) 2101 → 11001 |
| | BM(13) 2210 → 11100 |
| | BM(14) 2221 → 11110 |
| | BM(15) 2222 → 11111 |

Namely, FIGS. 1 to 5 can be used as it is, and FIGS. 6 to 34 can be also used by altering some data.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A data reproducing-device, comprising:
    a subtraction absolute value circuit for calculating a subtraction absolute value from a pre-equalized reproduce data and an estimate data as a branchmetric, in the lump, to the continuous K clocks of said reproduce data;
    a comparison and selection circuit for calculating a new pathmetric, from a previously calculated pathmetric of K clocks before and K clocks of said branchmetric calculated by said subtraction absolute value circuit, to each state associated with the new pathmetric, and outputting a selection signal to show which path is selected;
    an estimate data storing circuit for storing an estimate data of pre-equalized reproduce data;
    an address generating circuit for reading out in the lump estimate data needed for the calculation at said subtraction absolute value circuit from said estimate data storing circuit according to said selection signal output from said comparison and selection circuit;
    a path memory circuit for storing said selection signal output from said comparison and selection circuit over several stages to tens of states, obtaining the most probable path by unifying paths, then outputting the most probable data; and
    a correction control circuit for renewing said estimate data of said estimate data storing circuit, based on said reproduce data concerned and estimate data of said estimate data storing circuit obtained by using continuous output data of said path memory circuit as an address, in the lump, to K clocks of reproduce data obtained by delaying said pre-equalized reproduce data by a predetermined value.

2. A data-reproducing device, according to claim 1, wherein:
    to all states, as to all paths of 2 to the Kth power linking form K clocks before, new temporary pathmetrics are calculated by adding a branchmetric during K clocks from to a pathmetric at K clocks before, and one of said temporary pathmetrics having the smallest value is selected as a new pathmetric;
    a survival state at K clocks before is judged from survival path information including data as to what number of said paths of 2 to the Kth power is selected;
    a L-bit previous clock data, where L≧0 is satisfied, and path unification are judged by tracking said survival state by twice of K clocks in the past;

a binary final output is given corresponding to said survival state when path unification is achieved; and a binary final output is given by deciding a majority between the number of surviving states to a binary final output of "0" and the number of surviving states to a binary final output of "1", when path unification is not achieved.

3. A data-reproducing device, according to claim 2, wherein:

a serial-to-parallel circuit in said subtraction absolute value circuit where input data are developed into K layers is operated by input data clock, and the other circuits are operated by 1/K of said input data clock.

4. A data-reproducing device, according to claim 2, wherein:

a recording code with a minimum inversion interval of 2 is used, said reproduce data is pre-equalized into ternary value (0, 1, 2) by PR(1,1) pre-equalization, and to all states, paths except impossible patterns, sequence of "1", "02" and "20", are calculated.

5. A data-reproducing device, according to claim 2, wherein:

a recording code with a minimum inversion interval of 3 is used, said reproduce data is pre-equalized into ternary value (0, 1, 2) by PR(1,1) pre-equalization, and to all states, paths except impossible patterns, sequence of "1", "02", "20", "101" and "121", are calculated.

6. A data-reproducing device, according to claim 2, wherein:

said correction control circuit subtracts estimate data of said estimate data storing circuit obtained by using continuous output data of said path memory circuit as addresses, from said pre-equalized reproduce data delayed to synchronize with said estimate data of said estimate data storing circuit obtained by using continuous output data of said path memory circuit, when the accumulation value of the subtraction values exceeds a predetermined positive threshold (TH), said estimate data at the address is increased by a predetermined value (SD), and, when the accumulation value of the subtraction value is less than a predetermined negative threshold (-TH), said estimate data at the address is decreased by the predetermined value (SD).

7. A data-reproducing device, according to claim 2, wherein:

said reproduce data is pre-equalized into ternary value (0, 1, 2) by PR(1,1) pre-equalization, and said branchmetric is of 3-clock data including 000, 001, 011, 012, 100, 101, 110, 111, 112, 121, 122, 210, 211, 221 and 222.

8. A data-reproducing device, according to claim 2, wherein:

a recording code with a minimum inversion interval of 2 is used, said reproduce data is pre-equalized into ternary value (0, 1, 2) by PR(1,1) pre-equalization, and said branchmetric is of 3-clock data including 000, 001, 012, 100, 101, 121, 122, 210, 221 and 222.

9. A data-reproducing device, according to claim 2, wherein:

a recording code with a minimum inversion interval of 2 is used, said reproduce data is pre-equalized into ternary value (0, 1, 2) by PR(1,1) pre-equalization, and said branchmetric is of 3-clock data including 000, 001, 012, 100, 122, 210, 221 and 222.

10. A data-reproducing device, according to claim 2, wherein:

said reproduce data is pre-equalized into ternary value (0, 1, 2) by PR(1,1) pre-equalization, and said branchmetric is of 4-clock data including 0000, 0001, 0011, 0012, 0110, 0111, 0121, 0122, 1000, 1001, 1011, 1012, 1100, 1101, 1110, 1111, 1112, 1121, 1122, 1210, 1211, 1221, 1222, 2100, 2101, 2111, 2112, 2210, 2211, 2221 and 2222.

11. A data-reproducing device, according to claim 2, wherein:

a recording code with a minimum inversion interval of 2 is used, said reproduce data is pre-equalized into ternary value (0, 1, 2) by PR(1,1) pre-equalization, and said branchmetric is of 4-clock data including 0000, 0001, 0012, 0121, 0122, 1000, 1001, 1012, 1210, 1221, 1222, 2100, 2101, 2210, 2221 and 2222.

12. A data-reproducing device, according to claim 2, wherein:

a recording code with a minimum inversion interval of 3 is used, said reproduce data is pre-equalized into ternary value (0, 1, 2) by PR(1,1) pre-equalization, and said branchmetric is of 4-clock data including 0000, 0001, 0012, 0122, 1000, 1001, 1221, 1222, 2100, 2210, 2221 and 2222.

13. A data-reproducing device, according to claim 2, wherein:

a recording code with a minimum inversion interval of 2 is used, said reproduce data is pre-equalized into ternary value (0, 1, 2) by PR(1,1) pre-equalization, and said branchmetric is of 5-clock data including 00000, 00001, 00012, 00121, 00122, 01210, 01221, 01222, 10000, 10001, 10012, 10121, 10122, 12100, 12101, 12210, 12221, 12222, 21000, 21001, 21012, 22100, 22101, 22210, 22221 and 22222.

14. A data-reproducing device, according to claim 2, wherein:

a recording code with a minimum inversion interval of 3 is used, said reproduce data is pre-equalized into ternary value (0, 1, 2) by PR(1,1) pre-equalization, and said branchmetric is of 5-clock data including 00000, 00001, 00012, 00122, 01221, 01222, 10000, 10001, 10012, 12210, 12221, 12222, 21000, 21001, 22100, 22210, 22221 and 22222.

15. A data-reproducing device, according to claim 2, wherein:

a recording code with a minimum inversion interval of 3 is used, said reproduce data is pre-equalized into ternary value (0, 1, 2) by PR(1,1) pre-equalization, and said branchmetric is of 6-clock data including 000000, 000001, 000012, 000122, 001221, 001222, 012210, 012221, 012222, 100000, 100001, 100012, 100122, 122100, 122210, 122221, 122222, 210000, 210001, 210012, 221000, 221001, 222100, 222210, 222221 and 222222.

16. A data-reproducing device, according to claim 2, wherein:

said reproduce data is pre-equalized into ternary value (0, 1, 2) by PR(1,1) pre-equalization, and said branchmetric is of 2-clock data.

17. A data-reproducing device, according to claim 2, wherein:

said reproduce data is pre-equalized into ternary value (0, 1, 2) by PR(1,1) pre-equalization, and said branchmetric is of 5 or more-clock data.

18. A data-reproducing device, according to claim 2, wherein:

a recording code with a minimum inversion interval of 2 is used, said reproduce data is pre-equalized into ternary value (0, 1, 2) by PR(1,1) pre-equalization, and said branchmetric is of 6 or more-clock data.

19. A data-reproducing device, according to claim 2, wherein:

a recording code with a minimum inversion interval of 3 is used, said reproduce data is pre-equalized into ternary value (0, 1, 2) by PR(1,1) pre-equalization, and said branchmetric is of 7 or more-clock data.

20. A data-reproducing device, according to claim 2, wherein:

said reproduce data is pre-equalized by pre-equalization other than PR(1,1).

21. A data-reproducing device, according to claim 1, wherein:

a serial-to-parallel circuit in said subtraction absolute value circuit where input data are developed into K layers is operated by input data clock, and the other circuits are operated by 1/K of said input data clock.

22. A data-reproducing device, according to claim 1, wherein:

a recording code with a minimum inversion interval of 2 is used, said reproduce data is pre-equalized into ternary value (0, 1, 2) by PR(1,1) pre-equalization, and to all states, paths except impossible patterns, sequence of "1", "02" and "20", are calculated.

23. A data-reproducing device, according to claim 1, wherein:

a recording code with a minimum inversion interval of 3 is used, said reproduce data is pre-equalized into ternary value (0, 1, 2) by PR(1,1) pre-equalization, and to all states, paths except impossible patterns, sequence of "1", "02", "20", "101" and "121", are calculated.

24. A data-reproducing device, according to claim 1, wherein:

said correction control circuit subtracts estimate data of said estimate data storing circuit obtained by using continuous output data of said path memory circuit as addresses, from said pre-equalized reproduce data delayed to synchronize with said estimate data of said estimate data storing circuit obtained by using continuous output data of said path memory circuit, when the accumulation value of the subtraction values exceeds a predetermined positive threshold (TH), said estimate data at the address is increased by a predetermined value (SD), and, when the accumulation value of the subtraction value is less than a predetermined negative threshold (−TH), said estimate data at the address is decreased by the predetermined value (SD).

25. A data-reproducing device, according to claim 24, wherein:

said reproduce data is pre-equalized into ternary value (0, 1, 2) by PR(1,1) pre-equalization, and said branchmetric is of 3-clock data including 000, 001, 011, 012, 100, 101, 110, 111, 112, 121, 122, 210, 211, 221 and 222.

26. A data-reproducing device, according to claim 24, wherein:

a recording code with a minimum inversion interval of 2 is used, said reproduce data is pre-equalized into ternary value (0, 1, 2) by PR(1,1) pre-equalization, and said branchmetric is of 3-clock data including 000, 001, 012, 100, 101, 121, 122, 210, 221 and 222.

27. A data-reproducing device, according to claim 24, wherein:

a recording code with a minimum inversion interval of 2 is used, said reproduce data is pre-equalized into ternary value (0, 1, 2) by PR(1,1) pre-equalization, and said branchmetric is of 3-clock data including 000, 001, 012, 100, 122, 210, 221 and 222.

28. A data-reproducing device, according to claim 24, wherein:

said reproduce data is pre-equalized into ternary value (0, 1, 2) by PR(1,1) pre-equalization, and said branchmetric is of 4-clock data including 0000, 0001, 0011, 0012, 0110, 0111, 0121, 0122, 1000, 1001, 1011, 1012, 1100, 1101, 1110, 1111, 1112, 1121, 1122, 1210, 1211, 1221, 1222, 2100, 2101, 2111, 2112, 2210, 2211, 2221 and 2222.

29. A data-reproducing device, according to claim 24, wherein:

a recording code with a minimum inversion interval of 2 is used, said reproduce data is pre-equalized into ternary value (0, 1, 2) by PR(1,1) pre-equalization, and said branchmetric is of 4-clock data including 0000, 0001, 0012, 0121, 0122, 1000, 1001, 1012, 1210, 1221, 1222, 2100, 2101, 2210, 2221 and 2222.

30. A data-reproducing device, according to claim 24, wherein:

a recording code with a minimum inversion interval of 3 is used, said reproduce data is pre-equalized into ternary value (0, 1, 2) by PR(1,1) pre-equalization, and said branchmetric is of 4-clock data including 0000, 0001, 0012, 0122, 1000, 1001, 1221, 1222, 2100, 2210, 2221 and 2222.

31. A data-reproducing device, according to claim 24, wherein:

a recording code with a minimum inversion interval of 2 is used, said reproduce data is pre-equalized into ternary value (0, 1, 2) by PR(1,1) pre-equalization, and said branchmetric is of 4-clock data including 00000, 00001, 00012, 00121, 00122, 01210, 01221, 01222, 10000, 10001, 10012, 10121, 10122, 12100, 12101, 12210, 12221, 12222, 21000, 21001, 21012, 22100, 22101, 22210, 22221 and 22222.

32. A data-reproducing device, according to claim 24, wherein:
a recording code with a minimum inversion interval of 3 is used,
said reproduce data is pre-equalized into ternary value (0, 1, 2) by PR(1,1) pre-equalization, and
said branchmetric is of 5-clock data including 00000, 00001, 00012, 00122, 01221, 01222, 10000, 10001, 10012, 12210, 12221, 12222, 21000, 21001, 22100, 22210, 22221 and 22222.

33. A data-reproducing device, according to claim 24, wherein:
a recording code with a minimum inversion interval of 3 is used,
said reproduce data is pre-equalized into ternary value (0, 1, 2) by PR(1,1) pre-equalization, and
said branchmetric is of 6-clock data including 000000, 000001, 000012, 000122, 001221, 001222, 012210, 012221, 012222, 100000, 100001, 100012, 100122, 122100, 122210, 122221, 122222, 210000, 210001, 210012, 221000, 221001, 222100, 222210, 222221 and 222222.

34. A data-reproducing device, according to claim 24, wherein:
said reproduce data is pre-equalized into ternary value (0, 1, 2) by PR(1,1) pre-equalization, and
said branchmetric is of 2-clock data.

35. A data-reproducing device, according to claim 24, wherein:
said reproduce data is pre-equalized into ternary value (0, 1, 2) by PR(1,1) pre-equalization, and
said branchmetric is of 5 or more-clock data.

36. A data-reproducing device, according to claim 24, wherein:
a recording code with a minimum inversion interval of 2 is used,
said reproduce data is pre-equalized into ternary value (0, 1, 2) by PR(1,1) pre-equalization, and
said branchmetric is of 6 or more-clock data.

37. A data-reproducing device, according to claim 24, wherein:
a recording code with a minimum inversion interval of 3 is used,
said reproduce data is pre-equalized into ternary value (0, 1, 2) by PR(1,1) pre-equalization, and
said branchmetric is of 7 or more-clock data.

38. A data-reproducing device, according to claim 24, wherein:
said reproduce data is pre-equalized by pre-equalization other than PR(1,1).

39. A data-reproducing device, according to claim 1, wherein:
said reproduce data is pre-equalized into ternary value (0, 1, 2) by PR(1,1) pre-equalization, and
said branchmetric is of 3-clock data including 000, 001, 011, 012, 100, 101, 110, 111, 112, 121, 122, 210, 211, 221 and 222.

40. A data-reproducing device, according to claim 1, wherein:
a recording code with a minimum inversion interval of 2 is used,
said reproduce data is pre-equalized into ternary value (0, 1, 2) by PR(1,1) pre-equalization, and
said branchmetric is of 3-clock data including 000, 001, 012, 100, 101, 121, 122, 210, 221 and 222.

41. A data-reproducing device, according to claim 1, wherein:
a recording code with a minimum inversion interval of 3 is used,
said reproduce data is pre-equalized into ternary value (0, 1, 2) by PR(1,1) pre-equalization, and
said branchmetric is of 3-clock data including 000, 001, 012, 100, 122, 210, 221 and 222.

42. A data-reproducing device, according to claim 1, wherein:
said reproduce data is pre-equalized into ternary value (0, 1, 2) by PR(1,1) pre-equalization, and
said branchmetric is of 4-clock data including 0000, 0001, 0011, 0012, 0110, 0111, 0121, 0122, 1000, 1001, 1011, 1012, 1100, 1101, 1110, 1111, 1112, 1121, 1122, 1210, 1211, 1221, 1222, 2100, 2101, 2111, 2112, 2210, 2211, 2221 and 2222.

43. A data-reproducing device, according to claim 1, wherein:
a recording code with a minimum inversion interval of 2 is used,
said reproduce data is pre-equalized into ternary value (0, 1, 2) by PR(1,1) pre-equalization, and
said branchmetric is of 4-clock data including 0000, 0001, 0012, 0121, 0122, 1000, 1001, 1012, 1210, 1221, 1222, 2100, 2101, 2210, 2221 and 2222.

44. A data-reproducing device, according to claim 1, wherein:
a recording code with a minimum inversion interval of 3 is used,
said reproduce data is pre-equalized into ternary value (0, 1, 2) by PR(1,1) pre-equalization, and
said branchmetric is of 4-clock data including 0000, 0001, 0012, 0122, 1000, 1001, 1221, 2100, 2210, 2221 and 2222.

45. A data-reproducing device, according to claim 1, wherein:
a recording code with a minimum inversion interval of 2 is used,
said reproduce data is pre-equalized into ternary value (0, 1, 2) by PR(1,1) pre-equalization, and
said branchmetric is of 5-clock data including 00000, 00001, 00012, 00121, 00122, 01210, 01221, 01222, 10000, 10001, 10012, 10121, 10122, 12100, 12101, 12210, 12221, 12222, 21000, 21001, 21012, 22100, 22101, 22210, 22221 and 22222.

46. A data-reproducing device, according to claim 1, wherein:
a recording code with a minimum inversion interval of 3 is used,
said reproduce data is pre-equalized into ternary value (0, 1, 2) by PR(1,1) pre-equalization, and
said branchmetric is of 5-clock data including 00000, 00001, 00012, 00122, 01221, 01222, 10000, 10001, 10012, 12210, 12221, 12222, 21000, 21001, 22100, 22210, 22221 and 22222.

47. A data-reproducing device, according to claim 1, wherein:
a recording code with a minimum inversion interval of 3 is used,
said reproduce data is pre-equalized into ternary value (0, 1, 2) by PR(1,1) pre-equalization, and said branchmetric is of 6-clock data including 000000, 000001, 000012, 000122, 001221, 001222, 012210, 012221, 012222, 100000, 100001, 100012, 100122, 122100, 122210, 122221, 122222, 210000, 210001, 210012, 221000, 221001, 222100, 222210, 222221 and 222222.

48. A data-reproducing device, according to claim 1, wherein:

said reproduce data is pre-equalized into ternary value (0, 1, 2) by PR(1,1) pre-equalization, and said branchmetric is of 2-clock data.

49. A data-reproducing device, according to claim 1, wherein:

said reproduce data is pre-equalized into ternary value (0, 1, 2) by PR(1,1) pre-equalization, and said branchmetric is of 5 or more-clock data.

50. A data-reproducing device, according to claim 1, wherein:

a recording code with a minimum inversion interval of 2 is used, said reproduce data is pre-equalized into ternary value (0, 1, 2) by PR(1,1) pre-equalization, and said branchmetric is of 6 or more-clock data.

51. A data-reproducing device, according to claim 1, wherein:

a recording code with a minimum inversion interval of 3 is used, said reproduce data is pre-equalized into ternary value (0, 1, 2) by PR(1,1) pre-equalization, and said branchmetric is of 7 or more-clock data.

52. A data-reproducing device, according to claim 1, wherein:

said reproduce data is pre-equalized by pre-equalization other than PR(1,1).

\* \* \* \* \*